(12) United States Patent
Nishi et al.

(10) Patent No.: US 9,397,371 B2
(45) Date of Patent: Jul. 19, 2016

(54) STORAGE SYSTEM AND STORAGE CONTROLLER FOR STORAGE SYSTEM

(71) Applicant: Hitachi, Ltd., Tokyo (JP)

(72) Inventors: Masataka Nishi, Mito (JP); Nobuyasu Kanekawa, Hitachi (JP)

(73) Assignee: HITACHI, LTD., Tokyo (JP)

( * ) Notice: Subject to any disclaimer, the term of this patent is extended or adjusted under 35 U.S.C. 154(b) by 762 days.

(21) Appl. No.: 13/665,118

(22) Filed: Oct. 31, 2012

(65) Prior Publication Data

US 2013/0110430 A1    May 2, 2013

(30) Foreign Application Priority Data

Oct. 31, 2011  (JP) .................................. 2011-238154

(51) Int. Cl.
| | |
|---|---|
| *H01M 10/48* | (2006.01) |
| *G01D 21/00* | (2006.01) |
| *G06F 17/40* | (2006.01) |
| *G06F 19/00* | (2011.01) |
| *H01M 10/42* | (2006.01) |
| *G01R 31/36* | (2006.01) |

(52) U.S. Cl.
CPC ....... *H01M 10/4207* (2013.01); *G01R 31/3606* (2013.01); *H01M 10/48* (2013.01); *G01D 21/00* (2013.01); *G06F 17/40* (2013.01); *G06F 19/00* (2013.01); *H01M 2010/4271* (2013.01)

(58) Field of Classification Search
None
See application file for complete search history.

(56) References Cited

FOREIGN PATENT DOCUMENTS

JP          2009-017663 A      1/2009

*Primary Examiner* — Edward Cosimano
(74) *Attorney, Agent, or Firm* — Volpe and Koenig, P.C.

(57) ABSTRACT

A storage control unit for a storage system includes a first storage controller. The first storage controller includes: first voltage detection terminals that is connected to voltage detection lines respectively connected to first storage units, via switches; a first voltage detection circuit that is connected to each of the first voltage detection terminals and that detects a first voltage of each of the first storage units via each of the first voltage detection lines; a first voltage input terminal that a second voltage of each of second storage units that are different from the first storage units is input to; and a first voltage output terminal that is connected to the first voltage detection terminals via switches. The first voltage detection circuit is further connected to the first voltage input terminal and detects the second voltage via the first voltage input terminal.

17 Claims, 13 Drawing Sheets

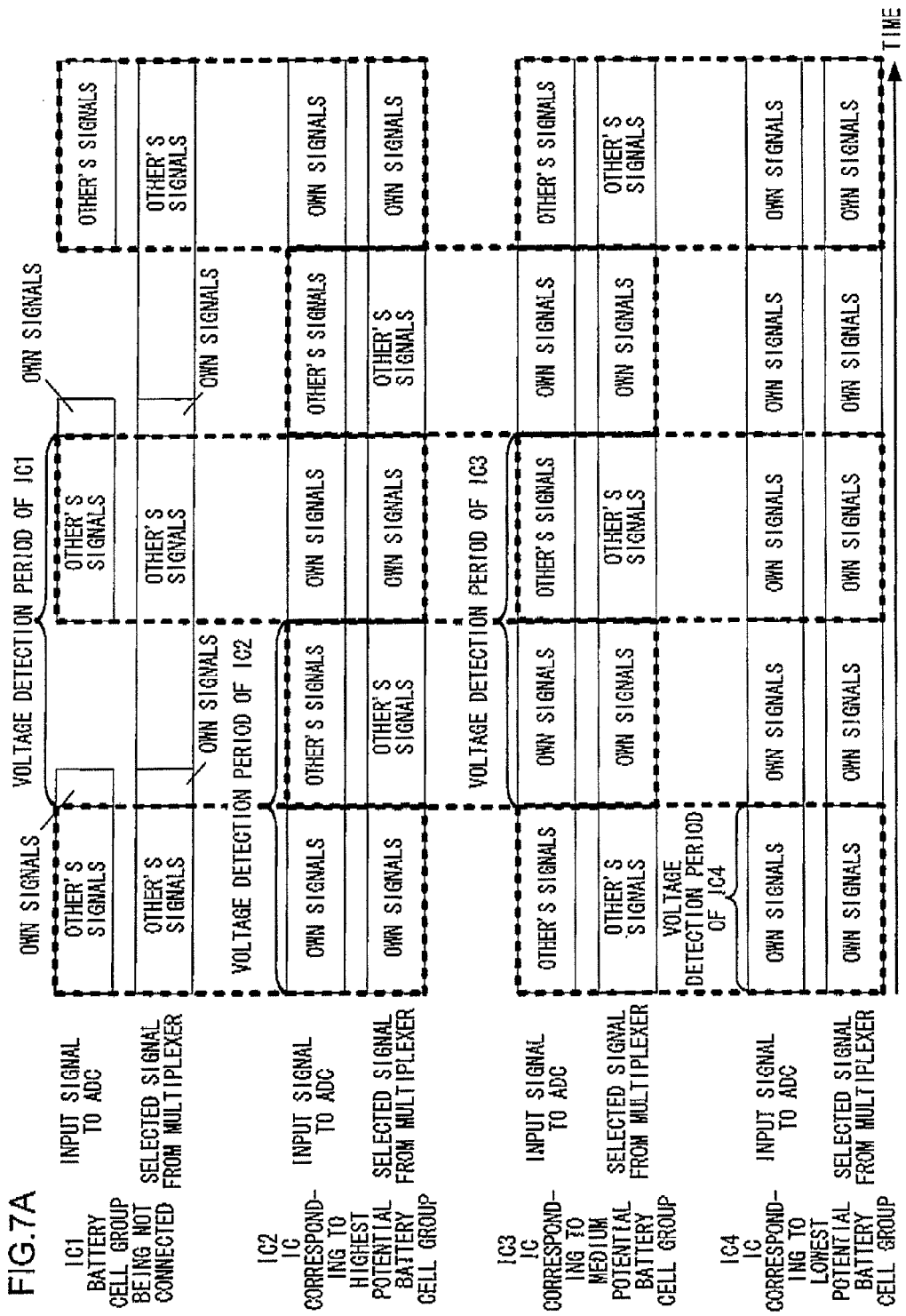

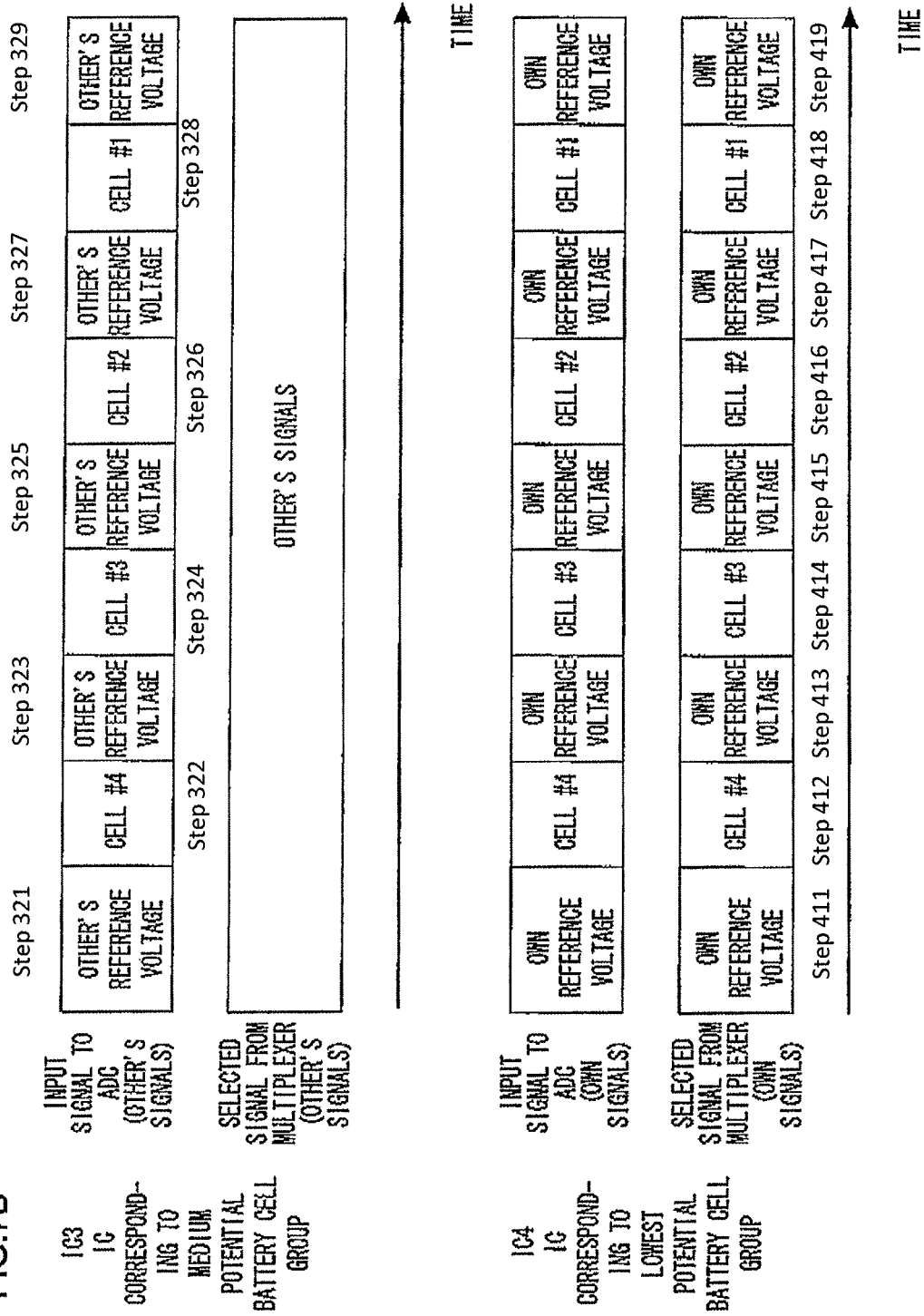

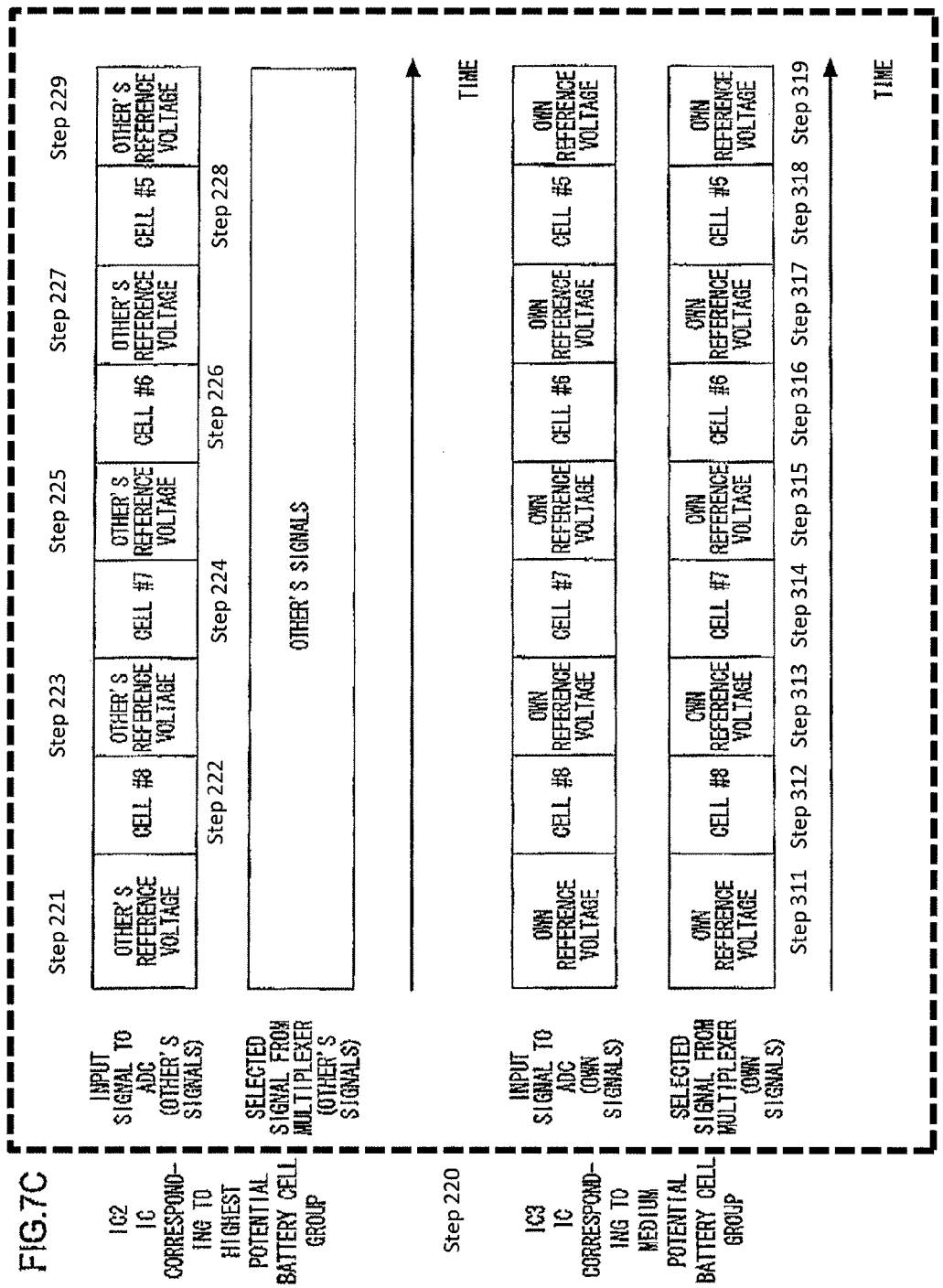

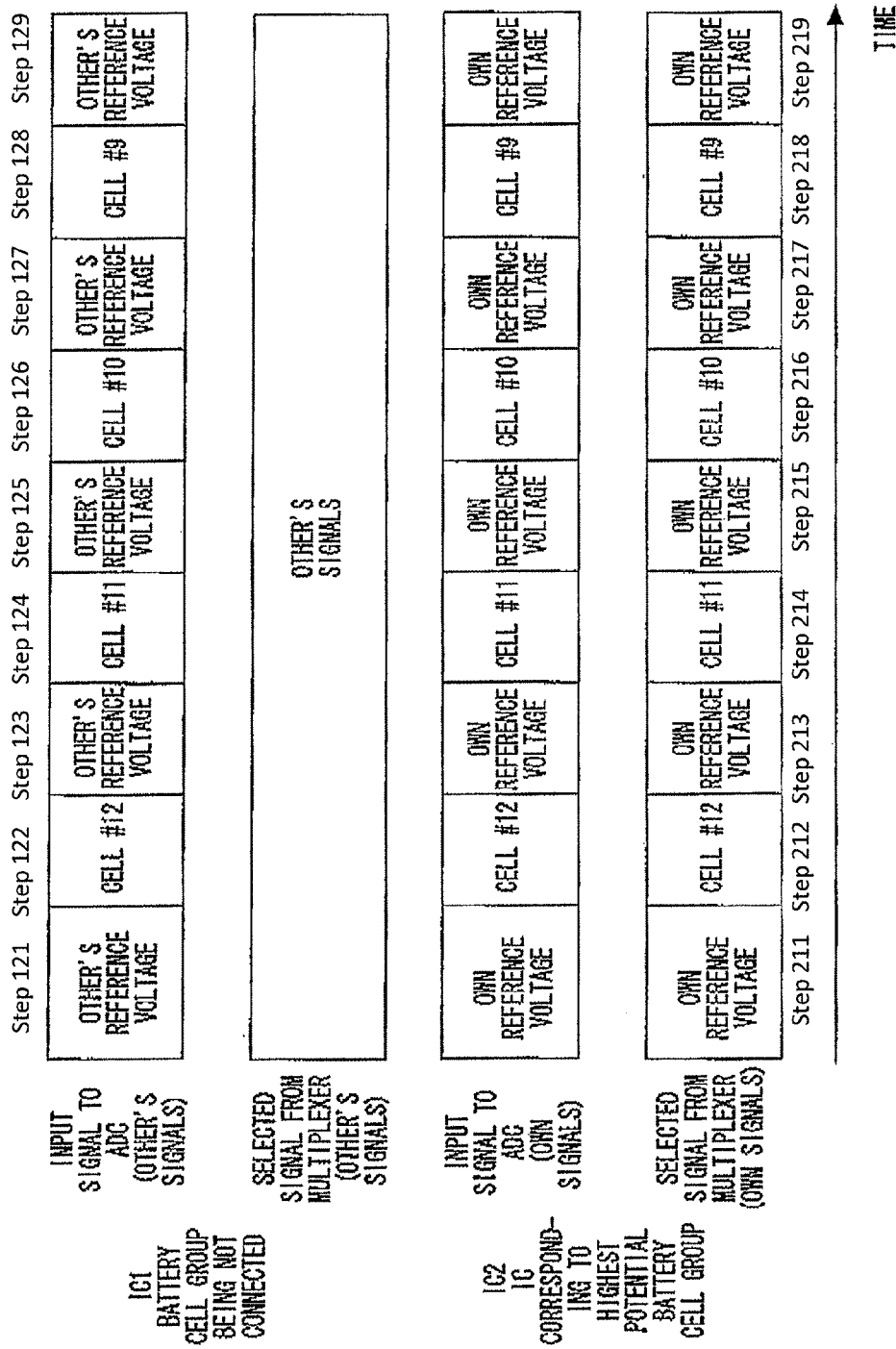

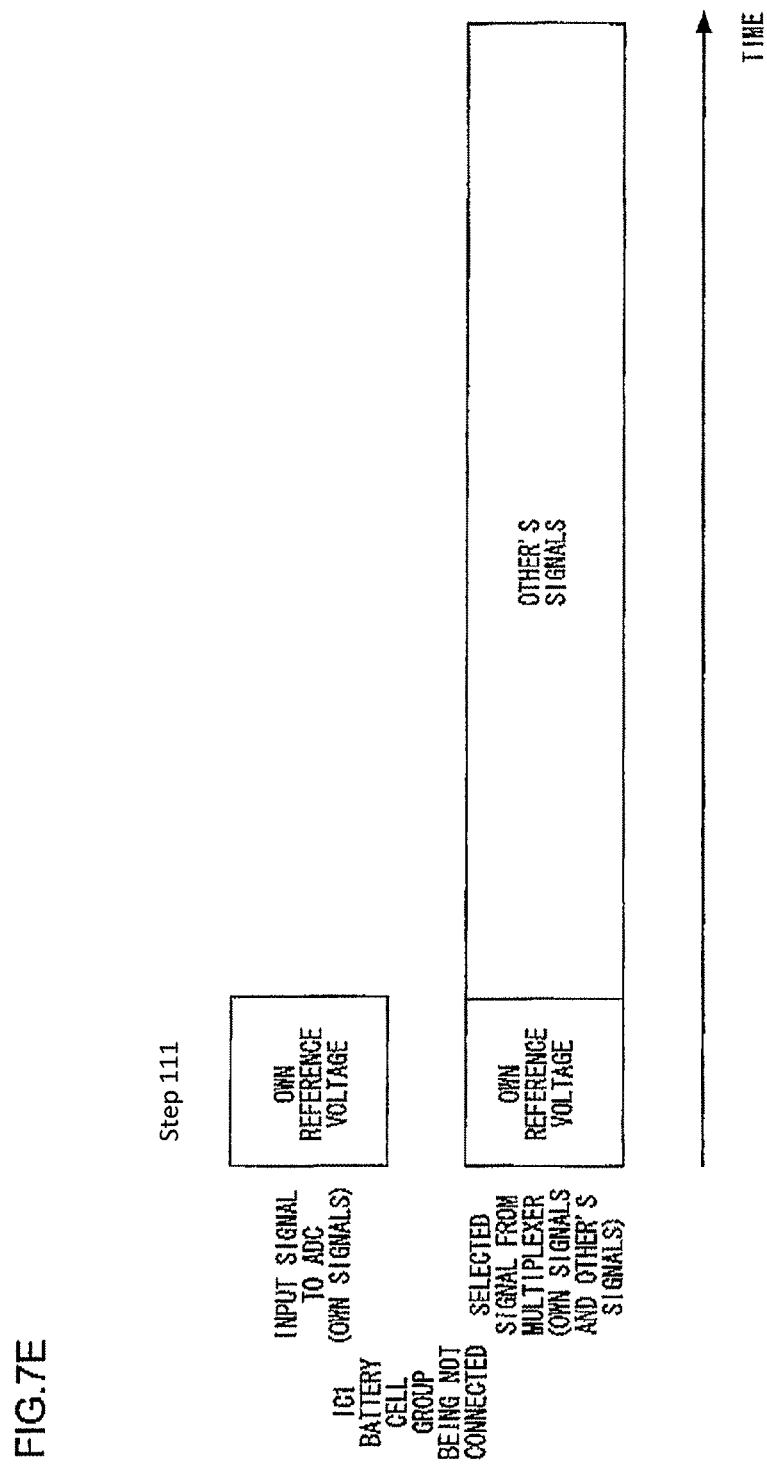

STORAGE SYSTEM AND STORAGE CONTROLLER FOR STORAGE SYSTEM

INCORPORATION BY REFERENCE

The disclosure of the following priority application is herein incorporated by reference: Japanese Patent Application No. 2011-238154 filed Oct. 31, 2011.

BACKGROUND OF THE INVENTION

1. Field of the Invention

The present invention relates to a storage system (an electrical storage system) and a storage controller for the storage system.

2. Description of Related Art

As a background art, there is known the technology disclosed in, for example, Japanese Patent Application Laid-Open Publication No. 2009-17663.

Japanese Patent Application Laid-Open Publication No. 2009-17663 discloses a technology relating to an abnormal condition detection apparatus. The apparatus includes a high-voltage battery device that includes a plurality of blocks electrically connected in series to each other, each of the blocks having a plurality of unit cells electrically connected in series to each other, and a plurality of voltage detection circuits corresponding to the blocks, respectively. The voltage detection circuits detect respective voltages of the unit cells in each of the corresponding blocks and output, in parallel, respective signals relating to the detected voltages to a low-voltage microprocessor via a communication line provided with an insulating interface.

SUMMARY OF THE INVENTION

In recent years, there has been an increasing concern about the warming of earth's atmosphere due to carbon dioxide emissions and depletion of fossil fuel, So it is demanded to reduce carbon dioxide emissions and lessen dependence on fossil fuel. To achieve this, it may be useful to, for example, redesign drive systems that are driven by combustion of fossil fuel so as to be electroactuated or to promote the introduction of power generation systems utilizing renewable energy obtained from the nature such as wind power and solar light. To make the drive systems to operate by electroactuation, it is necessary that the drive system includes a storage system that can accumulate and release electric energy as a power source for driving. When introducing a power generation system utilizing renewable energy, it becomes necessary that the power generation system includes a storage system as well that can accumulate and release electric energy. This is to suppress variation of power accompanying the variation of renewable energy that is influenced by weather conditions, that is, to store surplus power when the supply of power is more than the consumption of it and to supplement power when power is deficient. Thus, in both the systems, storage systems are indispensable.

A storage system includes, for example, a storage module or pack, which is constituted by a plurality of storage units that can accumulate and release electric energy, electrically connected to each other in series, in parallel, or in series-parallel, and a controller that detects respective states of the storage units to monitor and control the state of the storage unit group on the basis of the detected states of the storage units. When the respective states of the storage units are to be detected, there may be used a technology such as disclosed in, for example, Japanese Patent Application Laid-Open Publication No. 2009-17663. That is, a storage unit module or pack is divided into a plurality of battery blocks being electrically connected in series, each having a plurality of storage units and a state detection circuit is provided on each of corresponding blocks to detect respective states of the storage units in the corresponding block. The detection results are output to an arithmetic processing unit such as a microcomputer by communication to obtain the state of the storage pack from the detection results.

The state detection circuit includes a circuit constituted by a semiconductor element, for example, an integrated circuit including a plurality of semiconductor elements. On the other hand, the storage system requires safety; it is necessary that the respective states of the batteries be monitored to avoid overcharge/over-discharge of the batteries while the storage system is being charged or discharged. However, in case that one of the state detection circuits (integrated circuits) is at fault, it is impossible to monitor the respective states of the storage units in the corresponding block.

To respond to the failure of a state detection circuit, it may be conceived to make redundant the state detection circuits by duplexing them, for example. However, this countermeasure may simply result in doubling the wiring for introducing the respective physical quantities of the storage units from the corresponding block to the state detection circuit and the communication lines between the respective state detection circuits and the arithmetic processing unit. This leads to an increase in the total number of the state detection circuits, an increase in the number of wirings, complication of the wiring route, an increase in the cost for assembly and so on. In addition, the problem may become severer as the number the storage units increases more as a function of the magnitudes of output voltage and capacity required for the storage system.

The representative problem that the present invention is to solve is to provide highly reliable storage system at low cost.

According to the first aspect of the present invention, a storage system comprises: a plurality of storage units that are electrically connected to each other, grouped into a plurality of storage unit groups that are electrically connected in series to each other and that includes a plurality of members out of the storage units; and a plurality of state detection circuits that introduces therein a physical quantity from each of the batteries and detects a state quantity of each of the storage units. The state detection circuits includes a plurality of first state detection circuits and a second state detection circuits, the first state circuits correspond to the storage unit groups, respectively, and each of the first state circuits is electrically connected to a positive electrode and a negative electrode of each of the storage units in the corresponding storage unit. Any two of the first state detection circuits, forming an imaginary pair, which corresponds to any two of the storage unit groups that are potentially adjacent to each other, are electrically connected to each other via a transmission circuit. One of the first state detection circuits that corresponds to one of the battery groups that is at a highest potential or at a lowest potential is electrically connected to the second state detection circuit via the transmission circuit. One of the imaginary pair of first state detection circuits that are electrically connected to each other via the transmission circuit introduces therein the respective physical quantities of the battery groups in the corresponding storage unit group and detects the respective state quantities of the storage units in the corresponding storage unit group, and transmits the respective physical quantities introduced therein to the other of the imaginary pair of first state detection circuit or the second state detection circuit, which is electrically connected thereto via the transmission circuit. The other of the imaginary pair of first state detection circuit or the second state detection circuit, which is electrically detected to the one of the first state detection circuit via the transmission circuit introduces therein the physical quantities transmitted via the transmission circuit and detects the respective physical quantities of the storage units in the storage unit group corresponding to the one of the imaginary pair of first state detection circuits.

According to the second aspect of the present invention, a storage system comprises: a plurality of storage unit groups electrically connected in series to each other, each having a plurality of storage units electrically connected in series to each other; a plurality of first integrated circuits, which corresponds to the storage unit groups, respectively, and each of which is electrically connected to each of the storage units and introduces therein respective voltages between the terminals of a positive electrode and a negative electrode of the storage units in the corresponding storage unit group; a second integrated circuit, which corresponds to one of the first state detection circuit that corresponds to one of the storage unit groups that is at a highest or lowest potential and which introduces therein the respective voltages between terminals of the positive and negative electrodes of the storage units in the storage unit group at the highest or lowest potential and detects the respective voltages between the terminals of a positive electrode and a negative electrode of the storage units in the storage unit group corresponding to the first integrated circuit; a first voltage transmission circuit that electrically connects to each other, any two of the first integrated circuits corresponding to two storage unit groups that are potentially adjacent, forming an imaginary pair of first integrated circuits, and transmits, from one of the first integrated circuits to the other of the first integrated circuits, the respective voltages between the terminals of the positive and negative electrodes of each of the storage units in the storage unit group corresponding to the first integrated circuit; a second voltage transmission circuit that electrically connects, to each other, any two of the first integrated circuits that correspond to the storage unit groups that are potentially adjacent to each other and transmits, from one of the first integrated circuits to the other of the first integrated circuits, the respective voltages between the terminals of the positive and negative electrodes of each of the storage units in the storage unit group corresponding to the first integrated circuit that corresponds to the storage unit group at the highest or lowest potential; an arithmetic processing unit; and a communication circuit that is provided between one of the first integrated circuits and the second integrated circuit and the arithmetic processing circuit and transmits a signal therebetween. One of the first integrated circuits introduces therein the respective voltages between the terminals of the positive and negative electrodes of the storage units in the corresponding storage unit group to detect the respective voltages between the terminals of the positive and negative electrodes of the storage units in the corresponding storage unit group, and transmits via the first or second voltage transmission circuit, to the other of the first integrated circuit or the second integrated circuit, the introduced respective voltages between the terminals of the positive and negative electrodes of the storage units. The other of the first integrated circuit and the second integrated circuit each introduce therein the respective voltages between the terminals of the positive and negative electrodes of the storage units transmitted via the first or second voltage transmission circuit to detect the respective voltages between the terminals of the positive and negative electrodes of the storage units in the corresponding storage unit group corresponding to the one of the first integrated circuits. Signals relating to the respective voltages between the terminals of the positive and negative electrodes of the storage units detected by the first integrated circuits and the second integrated circuit are transmitted via the communication circuit from the first integrated circuits and the second integrated circuit to the arithmetic processing unit.

According to the third aspect of the present invention, a storage control unit for a storage system comprises a first storage controller. The first storage controller includes: a plurality of first voltage detection terminals that is connected to a plurality of voltage detection lines respectively connected to a plurality of first storage units, via a plurality of switches; a first voltage detection circuit that is connected to each of the plurality of first voltage detection terminals and that detects a first voltage of each of the plurality of first storage units via each of the plurality of first voltage detection lines; a first voltage input terminal that a second voltage of each of a plurality of second storage units that are different from the plurality of first storage units is input to; and a first voltage output terminal that is connected to the plurality of first voltage detection terminals via a plurality of switches. The first voltage detection circuit is further connected to the first voltage input terminal and detects the second voltage via the first voltage input terminal.

BRIEF DESCRIPTION OF THE DRAWINGS

FIGS. 7A to 7E present timing charts that indicate timing of voltage detection operations of respective cell controller integrated circuits that constitute a cell control unit including four cell controller integrated circuits from among a plurality of cell controller integrated circuits shown in FIGS. 4 through 6 (i.e., a cell controller integrated circuit having the lowest potential, a cell controller integrated circuit having a medium potential, a cell controller integrated circuit having the highest potential, and a cell controller integrated circuit battery cell group (having the same potential as that of the cell controller integrated circuit having the highest potential) to which no battery cell is connected.

DESCRIPTION OF PREFERRED EMBODIMENTS

Figure 1:
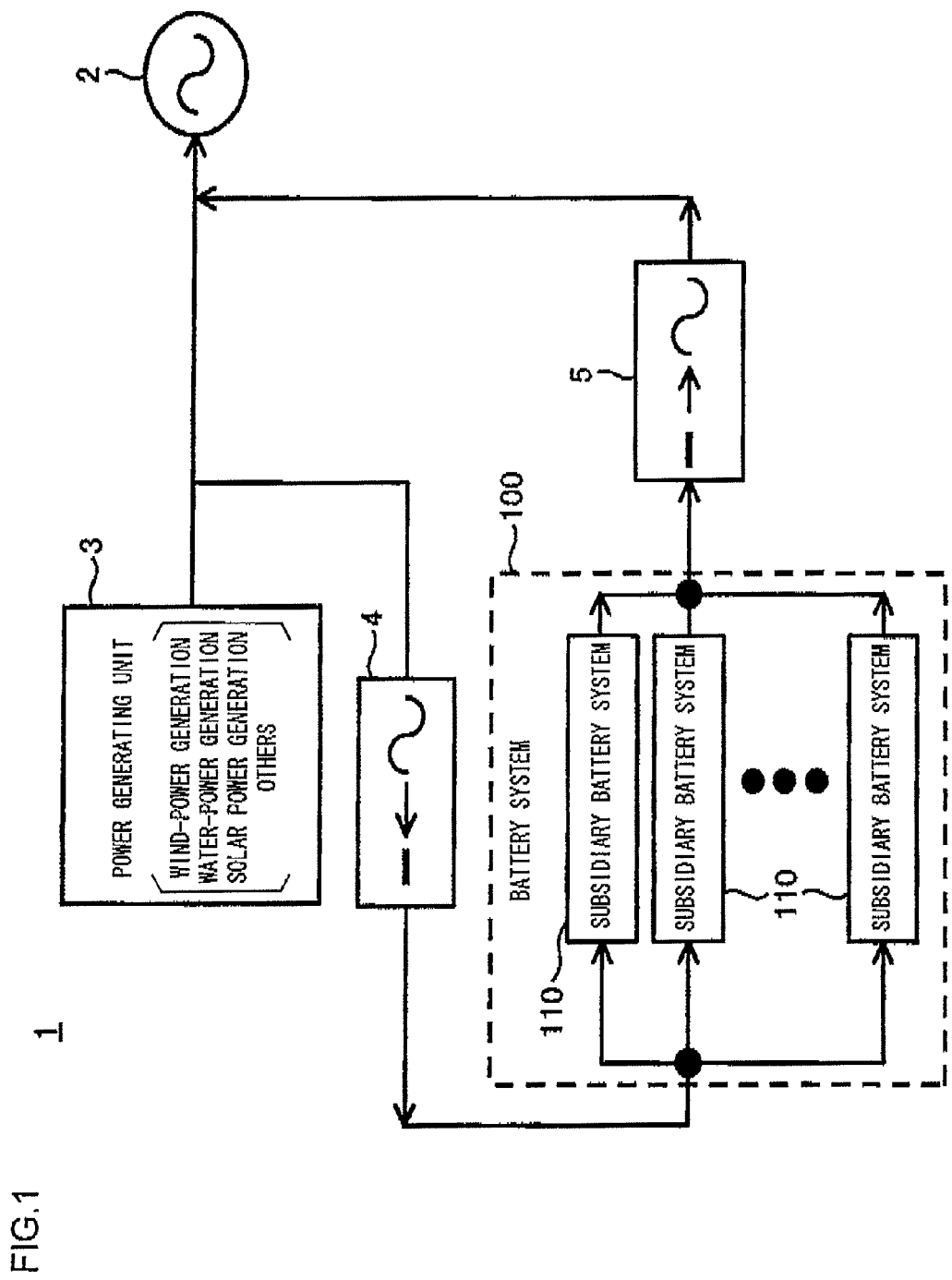
FIG. 1 presents a diagram showing the configuration of a power generation system comprising a power generation unit using renewable energy and a battery system as well.

Hereafter, embodiments of the present invention are explained with reference to the attached drawings.

General explanation on applications to which the present invention is applied. It is particularly preferred that the present invention be applied to a storage system in a mode in which the state of each of a plurality of storage units is detected by each of a plurality of state detection circuits.

According to an embodiment explained below, the present invention is explained taking an example in which the present invention is applied to a stationary or fixed storage system for suppressing variation of output of power generation, installed in a power generation system utilizing renewable energy, for example, solar light or wind power.

The power generation system utilizing renewable energy is advantageous in that less load is imposed on the natural environment. On the other hand, the electric generating capacity of the system is influenced by the natural environment such as weather and as a result the output to the power system may vary. The stationary storage system is provided to suppress the variation of the output from the power generation system. In case the power output from the power generation system to the power system is in short as compared with the predetermined output power, the stationary storage system is discharged to supplement the power generation system with deficient power. On the other hand, in case the power that is output from the power generation system to the power system is in excess as compared with the predetermined power, the stationary storage system is charged with the excess power from the power generation system.

General explanation of other applications of the present invention. The configuration according to the present embodiment explained below can also be applied to an in-vehicle storage system, which is used as a power source for driving the electric motor for driving the electric vehicle.

The electric vehicle includes, for example, a hybrid electric vehicle (HEV). The hybrid electric vehicle is a wheeled vehicle which is provided with both an engine and an electric motor as drive sources for the vehicle but has no charger for the storage system with AC power supplied from an external power source such as a commercial power source, an electricity service station or the like (in other words, the storage system is charged with the power regenerated by the wheeled vehicle upon its deceleration and/or the power obtained from the power generator driven by the prime mover, prime mover).

The electric energy that is charged in the in-vehicle storage system is discharged as DC power in case the hybrid electric vehicle is driven by motorized force (rotative power), i.e., upon power running. The DC power discharged from the in-vehicle storage system is supplied to a motor generator (rotating electrical machine) that functions as a motor to generate electric power for driving the eclectic vehicle after it is converted into AC power by an inverter unit (power conversion unit). The electric energy that is charged in the in-vehicle storage system may be discharged as DC power in case the engine, which is an internal combustion engine, is started, or in case electric components, for example, car audio equipment such as a radio set, a car navigation device, or lightning equipment is driven. In this case, the DC power that is discharged from the battery apparatus, after it is converted by the power conversion unit into AC power or predetermined DC power at controlled voltage, is supplied to each electric load or other storage apparatus.

The electric energy that is charged to the in-vehicle storage system is obtained as follows. That is, AC power obtained from regeneration energy when the electric vehicle is being decelerated or braked and/or AC power output from the power generator driven by the prime mover are/is converted by an inverter unit into DC power. The obtained DC power is supplied to the in-vehicle storage system. The AC power obtained from the regeneration energy is output from the power generator as follows. That is, the motor generator is driven as a power generator with the rotative force supplied by the wheeled vehicle to output AC power.

The configuration according to the present embodiment explained below can also be applied to an in-vehicle storage system for use in electric vehicles other than hybrid electric vehicles. Such electric vehicles include, for example, a plug-in electric vehicle (HMV) that includes an engine, which is an internal combustion engine, and an electric motor as drive sources (prime movers) of the wheeled vehicle and that has mounted therein a charger for charging the storage system with the AC power supplied from an external power source such as a commercial power source, an electricity service station or the like. Such electric vehicles also include, for example, a genuine electric vehicle (EV) that has no engine as a drive source for the wheeled vehicle (in other words, that includes an electric motor that generates motorized force as a unique drive force for the wheeled vehicle) and that has mounted therein a charger for the storage system with the AC power supplied from an external power source such as a commercial power source or an EV charging stand.

The configuration according to the present embodiment explained below can be applied to an in-vehicle storage system that constitutes the power source for other moving bodies, for example, electric motorcycles, two wheelers such as electric bicycles, railway wheeled vehicles such as hybrid trams, trucks such as hybrid trucks, buses such as hybrid bus, industrial wheeled vehicles such as construction machines, industrial wheeled vehicle such as forklift trucks, electroactuated welfare devices, and so on.

The configuration according to the present embodiment explained below can also be applied to various stationary storage systems, which include a stationary storage system as an uninterrupted power source (backup power source) for use in server systems in data centers and communication facilities and the like. Such stationary storage systems also include a stationary storage system that is installed as a power storage system at the consumer's home and stores power at nighttime and releases the stored power at daytime for leveling electric loads, and a stationary storage system that is electrically connected to a transmission and distribution system in mid-course thereof as countermeasures for variation of transmitted/distributed power, surplus power, frequency fluctuation, and reverse power flow countermeasure and the like.

General explanation of storage system, A stationary or fixed storage system, which may differ in configuration depending on output voltage and scale of the facilities including it, is a system that basically includes a plurality of storage units (secondary battery cells or passive elements having capacity performance) and accumulates (charges) and releases (discharges) electric energy based on the electrochemical action and charge accumulation structure of the storage units. The storage units are electrically connected in series, in parallel or in series parallel depending on the specification of output voltage, storage capacitance and the like required for the storage system.

According to the present embodiment explained below, the present invention is explained referring to an example in which a lithium ion secondary battery cell is used as a storage unit. As the storage unit, there may be used other storage units such as a lead battery, a nickel hydride battery and the like. Also, two kinds of storage units, for example, a lithium ion secondary battery cell and a nickel hydride battery cell may be used in combination. As the passive element having a capacity performance, there may be used a capacitor, for example, an electric double layer capacitor, a lithium ion capacitor and the like.

Representative technical problem, Secondary battery cells perform charge/discharge by holding/releasing charges through reversible state transition processes and therefore it is necessary to constantly monitor their charged state. In particular, lithium ion batteries achieve transition processes through chemical reactions and hence charges that are not held by the batteries when they are in an overcharged state are converted into heat. For this reason, in a battery system constituted by a plurality of lithium ion battery cells, a voltage between the terminals of each battery cell is detected. The charged state of each of the lithium ion battery cells is obtained on the basis of the detected voltage between the terminals.

The voltage between the terminals of each of the lithium ion battery cells is detected, for example, as follows. A voltage detection circuit constituted by, for example, a multiplexer, a differential amplifier, and an analog-to-digital converter (an integrated circuit constituted by semiconductor elements corresponding to the components, which elements are integrated with each other) is provided to each battery cell group having a predetermined number of lithium ion battery cells so that a voltage (potential) on the positive electrode side and a voltage (potential) on the negative electrode of the lithium ion battery cell are introduced for each of the battery cells. However, in case one of the voltage detection circuits is at fault, the state of each of the lithium ion battery cells contained in the corresponding battery cell group cannot be monitored, so that there is the possibility that the lithium ion battery cells in the corresponding battery cell group could be overcharged.

As a countermeasure to respond to the failure of voltage detection circuits, it may be conceived to duplex the voltage detection circuit to make it redundant so that the voltage between the terminals of one and the same lithium ion battery cell can be detected by different voltage detection circuits, respectively. Alternatively, it may also be conceived to compare the results of detection of the voltage between the terminals by different voltage detection circuits to diagnose whether there is abnormality in any one of the voltage detection circuits. However, the redundancy of the voltage detection circuit achieved by duplexing it results in an increase in the number of wirings and communication lines. That is, voltage detection wirings that electrically connect the voltage detection circuits to the cell groups for introducing, into the voltage detection circuit, the voltage (potential) of the positive electrode side and the voltage (potential) of the negative electrode side of each of the lithium ion battery cells are simply doubled. Also, communication lines between the battery controller, which obtains the charged state of the battery pack on the basis of the voltages between the terminals detected by the voltage detection circuits, and the voltage detection circuits, are simply doubled. As a result, there arise problems that the total number of the voltage detection circuit increases, the number of wirings for voltage detection increases, the route of the wirings for voltage detection becomes complicated, the cost for assembly increases, and so on.

In addition, the problem will become severer according as the number of the lithium ion battery cell increases as a function of magnitudes of the output voltage and storage capacitance required for the battery system.

For example, in case that one voltage detection unit detect the voltage of 10 lithium ion battery cells in a battery system having a hundred lithium ion battery cells, redundancy of the voltage detection circuits achieved by duplexing them results in a system of which the number of voltage detection circuits is 20 (or 10, if the redundancy is avoided by simplexing), the number of the voltage detection wiring 220 (or 110, if the redundancy is avoided by simplexing), the number of communication lines (in parallel) is 40 (or 20, if the redundancy is avoided by simplexing).

Representative solution for solving representative technical problem. Thus, according to the present embodiment explained below, the storage system includes a plurality of first voltage detection circuits (first integrated circuits) that is provided corresponding to a plurality of battery cell groups electrically connected in series to each other and electrically connected to a plurality of lithium ion battery cells contained in the corresponding battery cell group and a second voltage detection circuit (second integrated circuit). Any two of the first voltage detection circuits (first integrated circuits) provided corresponding to battery cell groups that are potentially adjacent (i.e., having potentials that are at adjacent levels) are electrically connected to each other via a transmission circuit. Also, the first voltage detection circuit (first integrated circuit) and the second voltage detection circuit (second integrated circuit) both provided corresponding to the battery cell groups at the highest or the lowest potentials, respectively, are connected to each other via a transmission circuit. For any two first voltage detection circuits electrically connected to each other via the transmission circuit, one of the first voltage detection circuits introduces therein a positive electrode-side voltage (potential) and a negative electrode-side voltage (potential) of each of the lithium ion battery cells that are included in the battery cell group corresponding to the one of the first voltage detection circuits and detects a voltage between the positive and negative terminals for each of the lithium ion battery cells. The one of the first voltage detection circuit transmits the respective voltages of the positive and negative voltages (potentials) of each of the lithium ion battery cells (first integrated circuit) that have been introduced therein to the other of the voltage detection circuits or the second voltage detection circuit (second integrated circuit). The other of the first voltage detection circuits (first integrated circuits) electrically connected to each other via the transmission circuit and the second voltage detection circuit (second integrated circuit) introduces therein the positive electrode and the negative electrode voltages (potentials) of the lithium ion battery cell transmitted via the transmission circuit and detects the voltage between the positive and negative terminals for each of the lithium ion battery cells included in the battery cell group corresponding to the one of the voltage detection circuits (first integrated circuits).

A storage control unit for the storage system includes a first storage controller corresponding to a first voltage detection circuit (first integrated circuit) other than the first voltage detection circuit (first integrated circuit) provided corresponding to storage units, such as the battery cell groups, at the lowest potential among the plurality of first voltage detection circuits (first integrated circuits) described above. It is preferred that the storage control unit for the storage system includes a second storage controller corresponding to the second voltage detection circuit (second integrated circuit) described above. In addition, it is preferred that the storage control unit for the storage system includes the first voltage detection circuit (first integrated circuit) provided corresponding to the storage units, such as the battery cell groups, at the lowest potential among the plurality of first voltage detection circuits (first integrated circuits) described above.

According to the concrete present embodiment described later, the first integrated circuit corresponds to the first cell-con IC 330a, and the second integrated circuit corresponds to the second cell-con IC 330b and the lithium ion battery cell corresponds to the battery cell 201. The respective voltages (potentials) of the positive and negative electrodes of a plurality of battery cells 201 included in the battery cell group corresponding to one of the first cell-con ICs 330a are introduced into the other of the first cell-con ICs 330a or the second cell-con IC 330b electrically connected to the one of the first integrated circuits 330a via the voltage transmission circuit 337. That is, both of two integrated circuits selected from the one of the first cell-con ICs 330a, and either one of the other of the first cell-con ICs 330a and the second cell-con IC 330b detect the voltages between the terminals of the positive and negative electrodes of the battery cells 201 included in the battery cell group corresponding to the first cell-con IC 330a. In this manner, the voltage detection system is made redundant by duplexing.

Advantageous effects by representative solution. According to the present embodiment explained below, for one of the first state detection circuits such as the first voltage detection circuits (the first integrated circuits) that are electrically connected to the other of the first state detection circuits such as the first voltage detection circuits (the first integrated circuits) via the transmission circuit, the respective physical quantities of storage units, such as the respective voltages (potentials) of the positive and negative electrodes of the lithium ion battery cells, included in the storage unit group such as the battery cell group corresponding to the one of the first state detection circuits (the first voltage detection circuits (the first integrated circuits)) are introduced into the other of the first state detection circuits (the first voltage detection circuits (the first integrated circuits)) or the second state detection circuit such as the second voltage detection circuit (second integrated circuit). Thus, at both the one of the first state detection circuits (the first voltage detection circuits (first integrated circuits)) and either one of the other of the first state detection circuits (the first voltage detection circuits (first integrated circuits)) or the second state detection circuit (the second voltage detection circuit (second voltage detection circuit)), the respective state quantities of storage units (the respective voltages between the terminals of the positive and negative electrodes of the lithium ion battery cells) included in the storage unit group (the battery cell group) corresponding to the one of the first state detection circuits (the first voltage detection circuits (first integrated circuits)) are detected. With this configuration, the storage system of the present invention can have a function similar to the redundancy of the system by simple duplexing with a minimized increase in number of state detection circuits such as voltage detection circuits (integrated circuits).

Therefore, according to the embodiment explained below, a highly reliable battery system can be provided at low cost.

Other objects and advantages of the present invention will be apparent from the following description of embodiments.

Hereafter, referring to the attached drawings, embodiments are explained in more detail.

Explanation of concrete embodiments. Referring to FIGS. 1 through 9, embodiments of the present invention will be explained in more detail.

Configuration of power generation system. First, referring to FIG. 1, the configuration of a power generation system 1 is explained.

The power generation system 1 is electrically connected to a power system 2 that includes transmission and distribution network to which is connected electric loads that consume power (consumer side). A power generating unit 3 generates a portion of the necessary power required by the power system 2 and the generated power is output as AC power to the power system 2.

A power generating unit 3 is an energy conversion facility that generates power, which is secondary energy generated based on primary energy. According to the present embodiment, an energy conversion facility is adopted which utilizes energy of natural world, that is, renewable energy as primary energy to generate power, which is secondary energy. The power generating unit utilizing renewable energy includes, for example, a wind-power generating device, which drives a power generator with power obtained by rotating windmill utilizing wind force, water-power generating device, which drives a power generator with power obtained by rotating a water wheel utilizing water power, a solar light power generating device, which applies solar light to solar cells to generate electricity by photovoltaic effect of the solar cells, and so on.

Here, the form of the power generating unit utilizing renewable energy is not particularly specified. Any of the wind-power power generating device, the water-power power generating device and solar light power generating device may be used. Other power generating device may also be used.

The power generating unit utilizing renewable energy is advantageous in that it imposes less load on the natural environment so that it is friendly to the natural environment. On the other hand, it is disadvantageous in that the electric generating capacity of the power generating unit is influenced by the state of the natural world and it may be difficult for the electric generating capacity to correspond to the power required.

For this reason, according to the present embodiment, the power generation system 1 is configured so that the power generated by the power generating unit 3 can be temporarily stored in the battery system 100 and the power stored in the battery system 100 can be supplied to the power system 2 in response to a request by the electric load.

The battery system 100 charges/discharges DC power. Between the battery system 100 and the power generating unit 3 is provided an AC/DC power conversion unit (converter) 4, which converts AC power generated by and output from the power generating unit 3 and which charges the converted DC power to the battery system 100. Between the battery system 100 and the power system 2 is provided a DC/AC power conversion unit 5 (inverter) is provided, which discharges DC power from the battery system 100 and converts the discharged DC power into AC power for supplying it to the power system 2.

It should be noted that according to the present embodiment, an example is illustrated in which the battery system 100 is provided with two power conversion units, which are separately used for charge and discharge. However, in actuality, the battery system 100 is electrically connected in parallel to between the power generating unit 3 and the power system 2 via a single power conversion unit (inverter). The single power conversion unit plays the roles of the two power conversion units.

Configuration of battery system. The battery system 100 includes a plurality of subsidiary battery systems 110. The subsidiary battery systems 110 are electrically connected in parallel.

It should be noted that the present embodiment is explained taking an example in which the battery system 100 includes a connected body that is constituted by a plurality of subsidiary battery systems 110 electrically connected in parallel. However, the battery system 100 may be constituted by one subsidiary battery system 110.

The subsidiary battery system 110 is the largest basic unit that constitutes the battery system 100.

The number of the subsidiary battery systems 110 may be determined based on the storage capacitance of the battery system 100 that is required for the intended use.

By determining the number of the subsidiary battery system 110 to be used based on the storage capacitance necessary for the battery system 100, the battery system 100 that corresponds to various needs can be realized. At the same time, the productivity of the battery system 100 is increased. Furthermore, the subsidiary battery systems 110 can be designed so as to have a common basic configuration, which leads to improvement of safety.

Since social life largely depends on power supply, it is undesirable that the operation of the entire battery system 100 be stopped. In view of this, as in the present embodiment, if the battery system 100 is constituted by a plurality of subsidiary battery systems 110, with the subsidiary battery system 110 being the largest basic unit that constitutes the battery system 100, it is no longer necessary to stop the operation of the entire battery system 100 to stop all the power storing function thereof for maintenance and inspection or repair of the battery system 100 but instead the operation of a part of the subsidiary battery systems 110 that is a target is stopped, so that only a part of the power storage function can be stopped. This increases functionality.

Configuration of subsidiary battery system. Then, referring to FIG. 2, the configuration of the subsidiary battery system 110 is explained in more detail.

Figure 2:
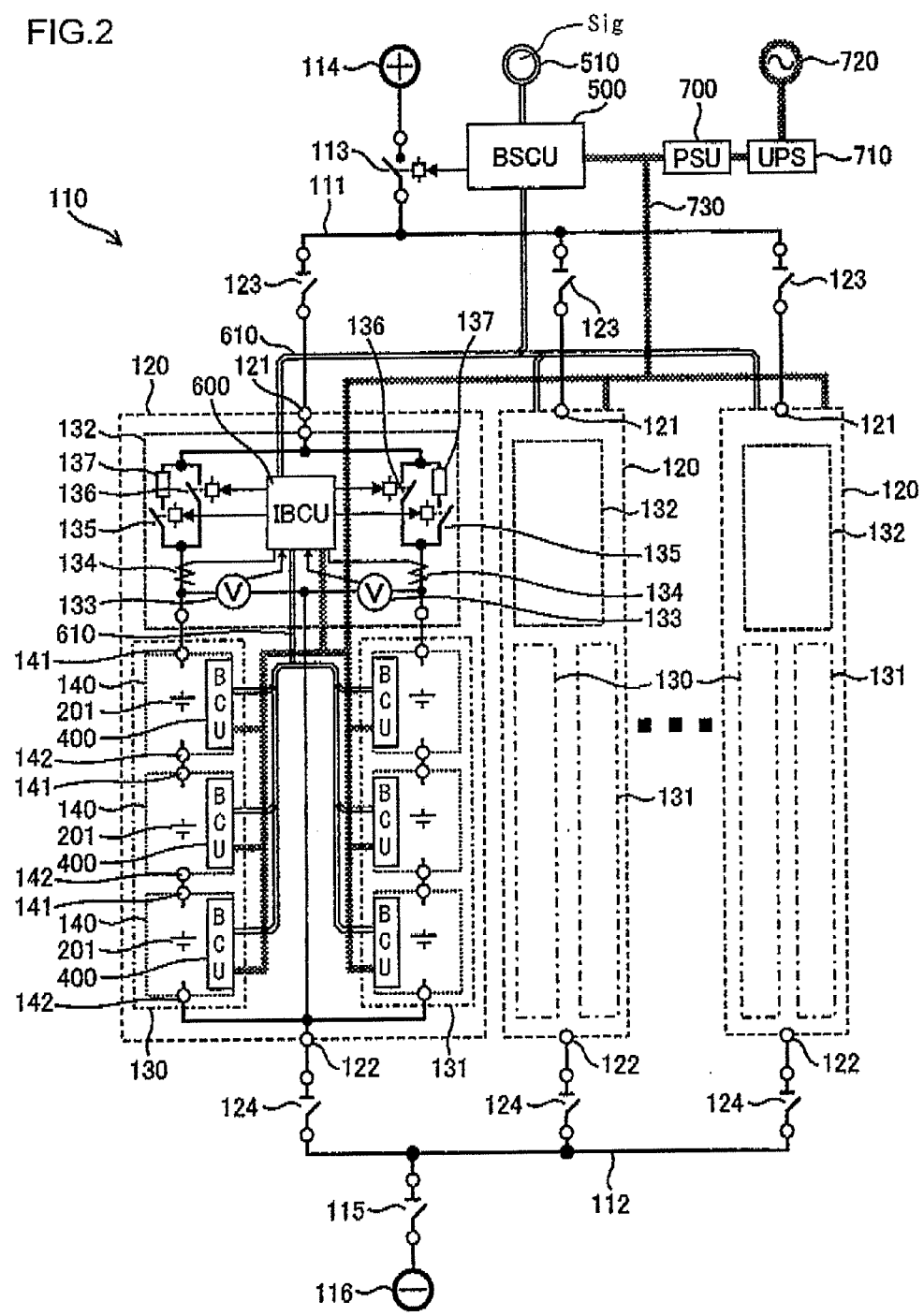
FIG. 2 presents a diagram showing the configuration of a subsidiary battery system that constitutes the battery system shown in FIG. 1.

It should be noted that in FIG. 2, the configuration of one of the subsidiary battery systems 110 shown in FIG. 1 is illustrated. However, other subsidiary battery systems 110 have basically the same configuration as that shown in FIG. 2.

The subsidiary battery system 110 includes a plurality of battery blocks 120. The battery blocks 120 are electrically connected to each other in parallel.

The battery block 120 is the largest basic unit that constitutes the subsidiary battery system 110.

The number of the battery blocks 120 may be determined on the basis of the storage capacitance required by the subsidiary battery system 110.

The battery blocks 120 are basically standardized in design to have a common configuration and perform the same operation. Standardization of the battery block 120 in configuration and operation makes it possible to set the storage capacitance of the subsidiary battery system 110 to a level that is convenient to utilize it, so that the subsidiary battery system 110 becomes more convenient to use and the productivity and safety of the subsidiary battery system 110 can be increased.

To the positive electrode output terminal 114 of the subsidiary battery system 110 is electrically connected a positive electrode-side wire connection 111 via a breaker 113. To the negative electrode output terminal 116 of the subsidiary battery system 110 is electrically connected a negative electrode-side connection wire 112 via a disconnector 115. The breaker 113 is a switch that has a function to cutoff a short-circuit current when it flows in order to prevent the cutoff current from flowing into the subsidiary battery system 110. Turn on or off of its contact is controlled by a system control unit 500. The breaker 113 is operated together with the disconnector 115 when the electrical connection of one of the subsidiary battery systems 110 to another of the subsidiary battery systems 110 is controlled. Therefore, when all the operation of the subsidiary battery system 110 is stopped for its maintenance and inspection or for its repair, the breaker 113 and the disconnector 115 are opened. As a result, a specified one subsidiary battery system 110 can be electrically separated from other subsidiary battery systems 110, so that the operation of the specified one subsidiary battery system 100 can be stopped for maintenance and inspection, or repair without stopping the operation of the entire battery system 100. The disconnector 115 is a switch that is used to electrically isolate one subsidiary battery system 110 from other subsidiary battery systems 110 but does not have a function to cutoff a shortcircuit current unlike the breaker 113.

The respective positive terminals 121 of the battery blocks 120 are electrically connected in parallel to the positive electrode-side wire connection 111 via the disconnector 123. The respective negative terminals 122 of the battery blocks 120 are electrically connected in parallel to the negative electrode-side connection wire 112 via the disconnector 124. The disconnectors 123 and 124 are switches used when the corresponding battery block 120 is electrically isolated from the other battery blocks 120 but does not have any function to cutoff a short-circuit current unlike the breaker 113. In this manner, by providing each of the battery blocks 120 with disconnectors 123 and 124, the specified one of the battery blocks 120 can be electrically isolated from the other battery blocks 120 and subjected to maintenance and inspection, or repair, without stopping the operation of the entire subsidiary battery system 110. With such a configuration, safety and convenience can be well balanced.

Configuration of battery block. Each of the battery blocks 120 is provided with first and second battery units 130 and 131. The first and second battery units 130 and 131 are electrically connected to each other in parallel via the integration unit 132. According to the present embodiment, for making it easy to secure safety in operations for maintenance and inspection, or repair, the first and second battery units 130 and 131 are electrically connected to each other in parallel and the voltage within the battery block 120 is maintained at a comparatively safe voltage of 1,000 volts or less, in particular, 650 volts or less. However, they may be electrically connected to each other in series depending on the magnitude of charge/discharge voltages.

To electrically connect the first and second battery units 130 and 131 to each other in parallel in order to decrease the voltage within the battery block 120 to a comparatively safe voltage level is not only useful to secure safety in operations for maintenance and inspection, or repair, but also has an advantageous effect that installation standards for the installations can be made moderate.

To electrically connect the first and second battery units 130 and 131 to each other in parallel has an effect to increase their storage capacitance. If a high voltage is necessary, a booster may be provided between the battery system 100 and the DC-AC power conversion unit 5 so that the DC power from the battery system 100 can be output to the DC-AC power conversion unit 5 after it is boosted.

It should be noted that according to the present embodiment, an example in which each of the battery blocks 120 has two sets of parallelly arranged battery units is explained. However, the number of sets of parallelly arranged battery units is not limited to two but may be other number, which may be determined based on the intended use, use conditions, and the like of the battery system 100. The number of sets of parallelly arranged battery units may be, for example, 1 or 3 or more. Taking into consideration convenience of maintenance and inspection, repair and the like, use of two sets of parallelly arranged battery units according to the present embodiment presents more desirable effects.

Configuration of battery unit. The first and second battery units 130 and 131 are each provided with a plurality of battery packs 140. According to the present embodiment, an example in which three battery packs are provided as the battery packs 140 is explained. However, the number of the battery packs 140 may be other numbers.

Each of the battery packs 140 has basically the same configuration and includes a plurality of lithium ion battery cells (hereafter, referred to simply as "battery cells") electrically connected in series to each other. In each of the first and second battery units 130 and 131, the battery cells 201 in each of the battery packs 140, which are electrically connected to each other, are electrically connected to each other in series.

Each of the battery packs 140 is provided with a battery control unit 400.

Configuration Of integration unit. The battery blocks 120 are each provided with an integration unit 132 that manages and controls the corresponding first and second battery units 130 and 131.

Each of the integration units 132 is provided with an integrated battery control unit 600, relays 135 and 136, each of which is provided corresponding to each of the corresponding first and second battery units 130 and 131 and controls electrical connection between the corresponding first and second battery units 130 and 131 and the other battery blocks 120, a current limiter 137 that limits current, a current detector 134 that detects current to be input in/output from each of the first and second battery units 130 and 131, a voltage detector 133 that detects the voltage between the terminals of each of the first and second battery units 130 and 131.

Configuration of switchgear mechanism (relay mechanism). The relays 135 and 136 constitute a switchgear mechanism (relay mechanism) that controls electrical connection between a power connector 141 for the positive electrode of the battery pack 140 at the highest potential and a power connector 142 for the negative electrode of the battery pack at the lowest potential, which constitutes the corresponding first and second battery units 130 and 131, and the positive terminal 121 of the battery block 120. The switchgear mechanism is constituted by a series circuit (subsidiary circuit) that includes a relay 135 and a current limiter 137 that are electrically connected in series and a series circuit (main circuit) that includes a relay 136, with the subsidiary circuit and the main circuit being electrically connected in parallel to each other. The on/off of the contacts of the relays 135 and 136 is controlled by an integrated battery control unit 600.

Usually, in a state in which the first and second battery units 130 and 131 are being charged/discharged, the relay 136 is turned on and charge/discharge is performed via the main circuit. The subsidiary circuit is used before the relay 136 is turned on to start the charge/discharge of the first and second battery units via the main circuit. In this case, the relay 135 is first turned on. This results in a flow of current from the first and second battery units 130 and 131 via the subsidiary circuit, with the current being limited by a current limiter 137. Thereafter, the relay 136 is turned on. This results in a flow of current from the first and second battery units 130 and 131 via the main circuit. At this time, since the current is allowed to flow through the subsidiary circuit, the current that flows through the main circuit is limited. As a result, when the relay 136 is turned on, the magnitude of inrush current that flows from the first and second battery units 130 and 131 to the main circuit can be decreased, so that welding or the like of the contact of the relay 136 can be prevented from occurring. After the current that flows from the first and second battery units 130 and 131 to the main circuit becomes stabilized, the relay 135 is turned off.

The first and second battery units 130 and 131 can be subjected to maintenance and inspection independently. During the maintenance and inspection, charge/discharge is stopped. Accordingly, the battery unit of which charge/discharge is stopped and the battery unit of which charge/discharge is being continued may have a different charged state. If two battery units having different charged states are electrically connected in parallel, big current flows from the battery unit in a higher charged state to the battery unit having a lower charged state. Taking this phenomenon into consideration, as described above, first the relay 135 is turned on to flow current through the subsidiary circuit. As a result, the current that flows from the battery unit in a higher charged state to battery unit having a lower charged state is limited by the current limiter 137 in the subsidiary circuit. The current that flows through the subsidiary circuit can be measured by a current detector 134, and hence when the current that flows through the subsidiary circuit reaches a level that is equal to or less than a predetermined threshold value, the relay 136 is turned on to allow the current to flow through the main circuit. Thereafter, the relay 135 is turned off. In this manner, the value of the charge/discharge current of the battery cell 201 can be maintained at a value within a safe range.

The voltage between the terminals of the battery cell 201 may vary depending on SOC (State of Charge), so that measured values from the voltage detector 133 can be used to estimate current at the time when the relay 136 is turned on. Therefore, instead of the turn-on control on the basis of the measured value measured by the current detector 134, turn-on control on the basis of the measured values measured by the voltage detector 133 may be used. In case the measured value measured by the voltage detector 133 is within a predetermined range as compared with the voltage between the terminals of the other battery units, the turning on of the relay 135 may be omitted and the relay 136 may be turned on immediately.

Function of integrated battery control unit. The integrated battery control units 600 manage each the charged state of the battery packs 140 that constitute the corresponding battery block 120. For this purpose, to each of the integrated battery control units 600 are input the respective charged states of the battery blocks 120 that constitute each of the battery packs 140 in the corresponding battery block 120 from the respective battery control units 400 of the battery packs 140 in the corresponding battery block, with the charged states of the battery cells 201 being calculated by and output from the battery control units 400, respectively. Each of the integrated control units 600 calculates a mean value of the charged states of the battery cells 201 in the corresponding battery block 120 and outputs the calculated mean value to the system control unit 500 as the charged state of the corresponding battery block 120.

Each of the integrated battery control units 600 outputs the mean value of the charged states of the battery cells 201 in the corresponding battery block 120, as a target parameter for adjusting the respective charged states of the battery cells in the corresponding battery block 120, to the respective battery control units 400 of the battery packs 140 in the corresponding battery block 120.

To each of the integrated battery control units 600 is input measurement information relating to respective charge/discharge currents of the first and second battery cells 130 and 131 in the corresponding battery block 120 from the current detector 134 and measurement information relating to the respective voltages between the terminals of the first and second battery units 130 and 131 from the voltage detector 133, respectively. Each of the battery control units 600 detects, on the basis of the measurement information of the respective charge/discharge current and voltage between the terminals of each of the first and second battery units 130 and 131 in the corresponding battery block 120, the respective charge/discharge current and voltage between the terminals of each of the first and second battery units 130 and 131 in the corresponding battery block 120 and outputs information relating to the detected charge/discharge current and the detected voltage between the terminals to the system control unit 500.

Function of system control unit. The system control unit 500 outputs on/off command to the breaker 113 so that the breaker 113 can be turned on/off on the basis of the information transmitted from the respective integrated control units 600 of the corresponding battery blocks 120 or on the basis of the information or instruction transmitted from a management unit (not shown) of the battery system 100 via an information input/output terminal 510, when the condition under which the subsidiary battery system 110 is electrically isolated from the battery system 100 is met or when the condition under which the subsidiary battery system 110 is electrically connected to the battery system 100 is met.

The system control unit 500 calculates the charged state, the charge/discharge current, and the voltage between the terminals of the subsidiary battery systems 110, respectively, on the basis of the information about the charged state of the corresponding battery block 120 and the information about the respective charge/discharge current and the respective voltages between the terminals of the first and second battery units 130 and 131 in the corresponding battery block 120 transmitted from the integrated battery control units 600 of the corresponding battery block 120, and outputs the information obtained by the calculation to the management unit (not shown) for the battery system 100.

The system control unit 500 outputs information, transmitted from the respective integrated control units 600 in the battery blocks 120, about results of diagnosis for the detection of abnormality of the respective battery packs 140 that constitute the corresponding battery block 120 to the management unit (not shown) for the battery system 100 via the information input/output terminal 510.

Configuration of communication circuit within the subsidiary battery system. The storage system is configured such that simultaneous and parallel communication is possible between the respective integrated battery control units 600 in the battery blocks and the system control unit 500 and between the respective integrated battery control units 600 in the battery blocks and the respective battery control units 400 in the battery packs 140 via connector 620 that connects the integrated battery control unto to an information bus 610.

In each of the battery blocks 120, and information about results of abnormality detection performed by the respective battery control unit 400 or collected by the respective battery control unit 400 and so on are transmitted to the integrated control unit 600 via the information bus 610. Also, in each of the battery blocks 120, information about the target parameter for the adjustment of the charged state calculated by the integrated battery control unit 600 is simultaneously and parallelly transmitted from the integrated battery control unit 600 to each of the battery control unit 400 via the information bus 610.

The information collected by each of the integrated battery control unit 600 in battery blocks 120, i.e., information relating to the charged states of the corresponding battery blocks 120, information relating to charge/discharge current of the first and second battery units 130 and 131 in the corresponding battery block 120, information relating to voltages between the terminals of the first and second battery units 130 and 131 in the corresponding battery blocks 120 and information relating to results of diagnosis for the detection of abnormality of the respective battery packs 140 that constitute the corresponding battery block 120 output from the respective battery control units 400 in the respective battery packs 140 that constitute the corresponding battery block 120, and the like are simultaneously and parallelly transmitted from the respective integrated battery control units 600 to the system control unit 500 via the information bus 610.

Configuration of power source for control units. The battery control units 400, the integrated battery control unit 60Q and the system control unit 500 include each an arithmetic processing unit such as a microcontroller in order to perform the above-mentioned function. To operate the arithmetic processing units, it is necessary to supply an operation voltage as low as, for example, 5 volts to the arithmetic processing units from the electric power source. The electric power source may be the battery cell 201. However, from the viewpoint of ease of the maintenance and inspection of the battery packs 140 and of an increase in the productivity of the battery system 100 by standardizing the configuration of the battery packs 140 and so on, it is desirable to use an electric power source different from the battery cell 201. Thus, according to the present embodiment, a commercial power source outside the subsidiary battery system 110 is used as an electric power source for the arithmetic processing units to supply AC power (single phase) from the commercial power source.

The AC power (single phase) supplied from the commercial power source is input via a control power source input terminal 720 and is supplied therefrom to an uninterrupted power source unit 710. Usually, DC power for control is generated from the AC power supplied via the control power source input terminal 720. However, in case the supply of the AC power from the commercial power source is stopped, the necessary power cannot be obtained, so that it becomes impossible to operate the battery system 100. Then, according to the present embodiment, a configuration is adopted in which an uninterrupted power source unit 710 is provided in the power source line of the control unit so that AC power supply is not interrupted even when the input of the AC power is interrupted. The uninterrupted power source unit 710 is configured such that AC power supplied from the commercial power source is converted into DC power by a rectifier and the converted DC power is charged in a secondary battery and always it generates and outputs AC power synchronized with the commercial power source by a constant voltage and constant frequency control inverter while the DC power is being charged.

The AC power supplied from the uninterrupted power source unit 710 is input into a power source unit 700. The power source unit 700 produces low-voltage DC power from the AC power and supplies the produced DC power to each of the battery control units 400, the integrated battery control units 600 and the system control unit 500 via connection 740 that connects the power source unit 710 to a power source control line 730 simultaneously and in parallel.

Operation procedure of switch. In case that in a connected state in which the breaker 113, the disconnectors 115, 123 and 124, and the relay 136 are all turned on, and the subsidiary battery system 110 shown in FIG. 6 is electrically connected in parallel to other subsidiary battery systems 110 shown in FIG. 5 via the positive electrode output terminal 114 and the negative electrode output terminal 116, the subsidiary battery system 110 shown in FIG. 6 is electrically isolated from the other subsidiary battery system 110 shown in FIG. 5, first the breaker 113 is cutoff by the command from the system control unit 500 to bring the subsidiary battery system 110 into an unloaded state (in a state where no charge/discharge current flow). Then, the disconnector 115, the disconnectors 123 and 124 are cutoff in order. As a result, the subsidiary battery system 110 shown in FIG. 6 can be electrically isolated from the subsidiary battery system 110 shown in FIG. 5 and a safe state where no voltage is applied to the positive electrode output terminal 114 and the negative electrode output terminal 116 can be established. Further, in case that the first and second battery units 130 and 131 are to be electrically isolated from each other, the relay 136 is cutoff. As a result, the first and second battery units 130 and 131 can be electrically isolated one from the other.

Figure 5:
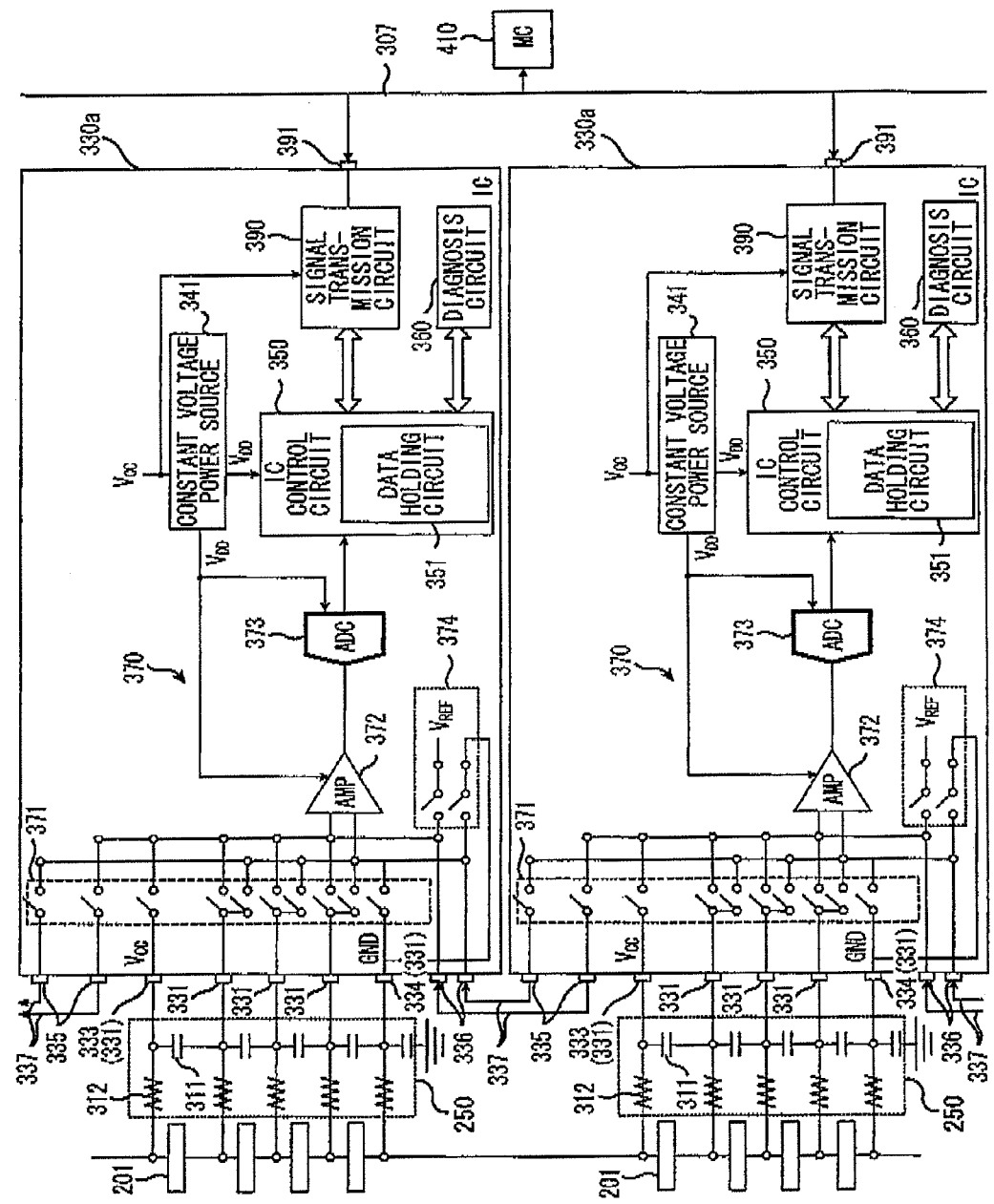
FIG. 5 presents a diagram showing the configuration of a control unit that constitutes the battery module shown in FIG. 3, forming a voltage detection duplex system between two cell controller integrated circuits having respective potentials between the two cell controller integrated circuits having the lowest and the highest potentials.
Figure 6:
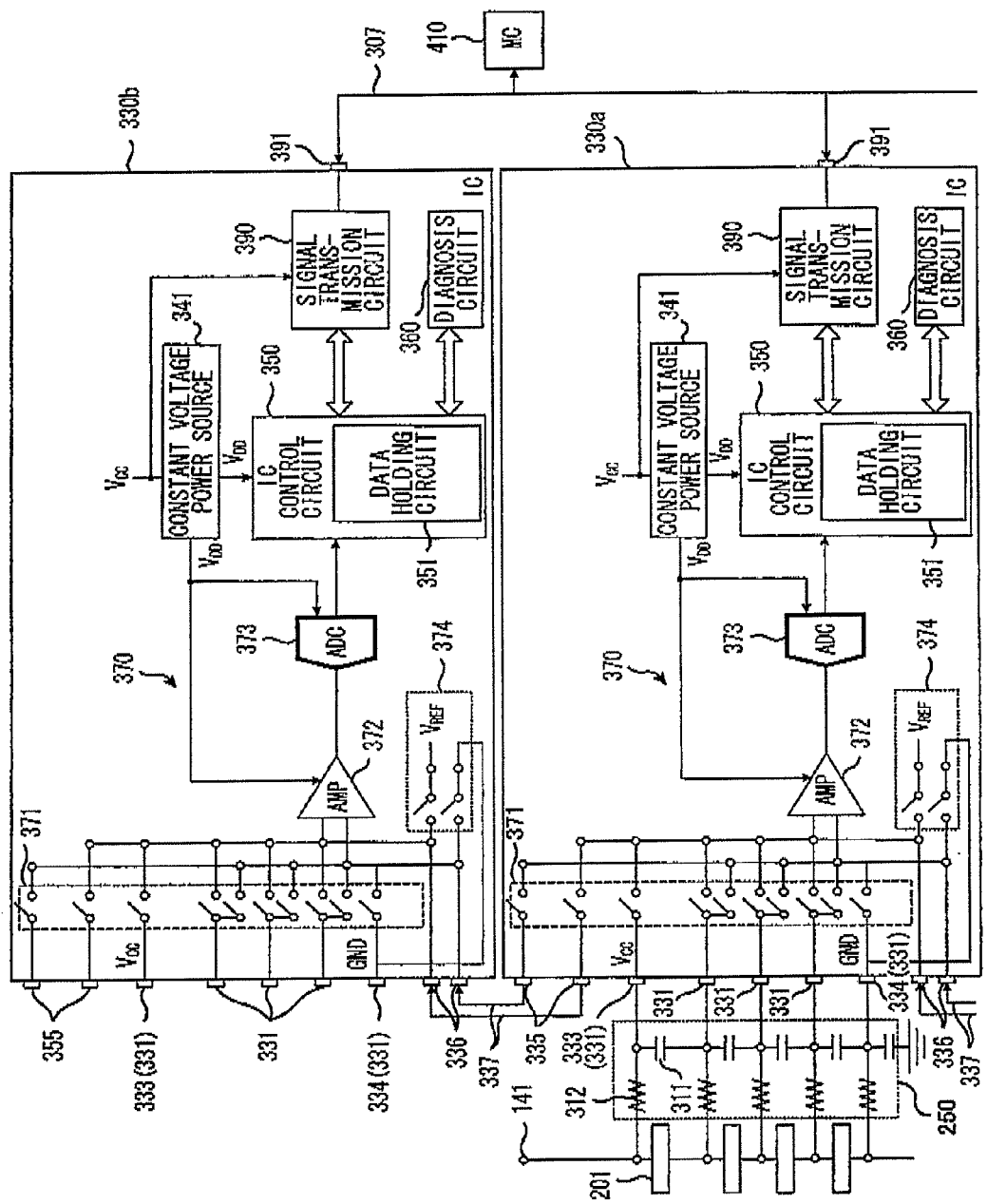
FIG. 6 presents a diagram showing the configuration of a control unit that constitutes the battery module shown in FIG. 3, forming a voltage detection duplexing system between the cell controller integrated circuit having the highest potential and a cell controller integrated circuit corresponding thereto having the same potential as the cell controller integrated circuit having the highest potential.

On the contrary, the subsidiary battery system 110 in FIG. 6 is to be electrically connected to the other subsidiary battery system 110 shown in FIG. 5, first, the disconnectors 123 and 124, and the disconnector 115 are turned on in order. Thereafter, the breaker 113 is turned on according to the command from the system control unit 500. In case the first and second battery units 130 and 131 are electrically isolated therebetween, first the relay 135 is turned on and then after the current has reached a predetermined value, the relay 136 is turned on. Thereafter, the relay 135 is cutoff. In this procedure, the on/off of the relays 135 and 136 is controlled, and then the disconnectors 123 and 124, the disconnector 115, and the breaker 113 are turned on in order.

In case that the charge/discharge is stopped for one of the battery blocks 120 that constitute the subsidiary battery system 110 in order to subject the battery block 120 to maintenance and inspection, or repair, once for all the battery blocks 120 that constitutes the subsidiary battery system 110, the breaker 113, the disconnector 115, the disconnectors 123 and 124 are cutoff in order temporarily, and then the disconnectors 123 and 124 corresponding to the battery block 120 are kept in a cutoff state. In this state, the disconnectors 123 and 124, the disconnector 115, and the breaker 113 corresponding to the other battery block 120 are turned on in order. By so doing, the battery block 120 of interest can be electrically isolated from the other battery block 120 and to enable the battery block 120 of interest to be subjected to maintenance and inspection, or repair while the other battery block 120 is being charged or discharged.

In case that the charge/discharge is stopped for either one of the first and second battery units 130 or 131 in one of the battery blocks 120 that constitute the subsidiary battery system 110 in order to subject the battery unit 130 or 131 to maintenance and inspection, or repair, once for all the battery blocks 120 that constitutes the subsidiary battery system 110, the breaker 113, the disconnector 115, and the relay 136 are cutoff in order temporarily, and then the relays 135 and 136 are kept in a cutoff state. In this state, for the relays 135 and 136 in the battery unit of interest and the battery unit forming a pair together with the battery unit of interest, first the relay 135 is turned on and then the relay 136 is turned on when the current has reached a level that is equal to or less than a predetermined value. Thereafter, the relay 135 is turned off. In this manner the on/off control of the relays is performed, and then the disconnectors 123 and 124, the disconnector 115, and the breaker 113 are turned on in order. By so doing, the battery unit of interest can be electrically isolated from the battery unit forming a pair together with the battery unit of interest, and the battery unit of interest can be subjected to maintenance and inspection, or repair while the other battery block 120 forming a pair together with the battery unit of interest and other battery block 120 are being charged or discharged.

Figure 3:
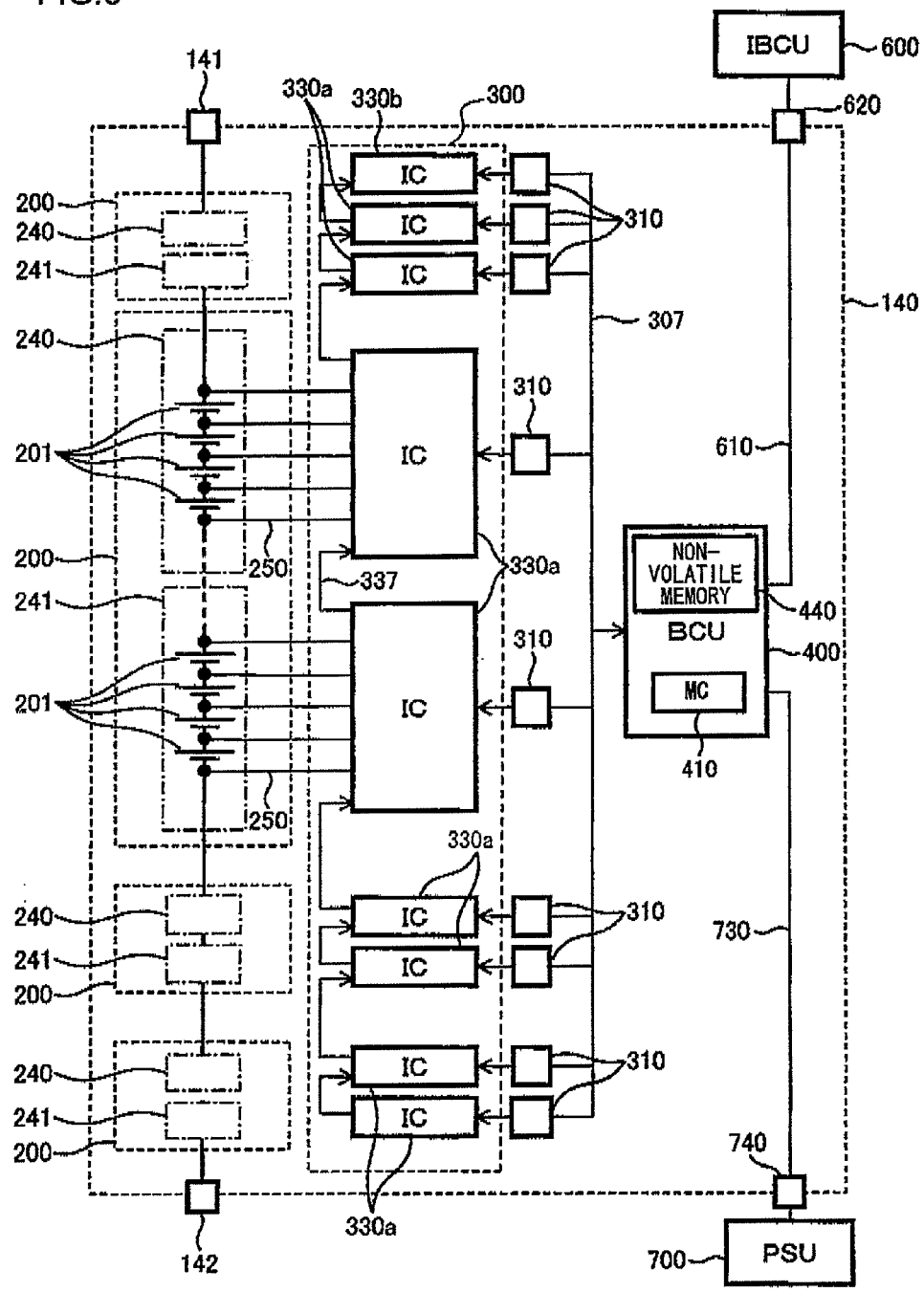
FIG. 3 presents a diagram showing the configuration of a battery module that constitutes the subsidiary battery system shown in FIG. 2.

Configuration of battery pack. FIG. 3 shows the configuration of the battery pack 140.

Each of the battery packs 140, as shown in FIG. 3, includes battery modules 200 and control units that are electrically connected to each other in series.

According to the present embodiment, the number of battery packs 140 for one battery pack is set four (4) and the four battery modules 200 are electrically connected to each other in series. The number of battery modules 200 may be a number other than 4.

The control units are electric circuits that are each constituted by a plurality of electronic circuit components. They are divided into two hierarchies by function. Specifically, the battery control unit 400 corresponds to a control unit which is in a higher level in hierarchy and corresponds to a control unit in a lower level in hierarchy in the battery pack 140. The battery control unit 400 and the cell control unit 300 are electrically connected to a signal transmission circuit that is provided with a photocoupler 310, which is an eclectic insulating component, and communicate with each other by transmitting signals via the signal transmission circuit 307.

Configuration of battery module. Each of the battery modules 200 is provided with battery cell groups electrically connected in series to each other as shown in FIG. 3. According to the present embodiment, each of the battery cell groups includes a first battery cell group 240 and a second battery cell group 241. The first battery cell group 240 and the second battery cell group 241 are electrically connected in series to each other. The number of the battery cells is not limited to two but may be a number of three or more.

Each of the first battery cell group 240 and the second battery cell group 241, as shown in FIG. 3, includes a plurality of battery cells 201 that are electrically connected in series to each other. According to the present embodiment, each of the battery group includes four battery cells 201, which are electrically connected in series to each other. The number of the battery cells 201 is not limited to 4 but may be a number other than 4. The battery cell 201 is the smallest unit of the battery module 200 and is also called an electric cell. The battery cell 201 has a nominal output voltage of 3.0 to 4.2 volts (a mean nominal output voltage of 3.6 volts).

Configuration of cell control unit. The cell control unit 300 is an electric circuit that operates as a lower level control unit of the battery control unit 400 on the basis of the command signal from the battery control unit 400 to manage and control the respective states of the battery cells 201 and is provided with a plurality of cell controller integrated circuits (hereafter, referred to as "cell-con ICs") 330.

The cell-con ICs 330 include a plurality of first cell-con ICs 330a that correspond to the first battery cell groups 240 and the second battery cell group 241, and a second cell-con IC 330b that correspond to one of the first cell-con ICs 330a that corresponds to the battery cell group at the highest potential.

The first cell-con ICs 330a detect each the voltage between the terminals between the positive electrode and the negative of each of the battery cells 201 that constitute the corresponding battery cell group and at the same time detect each abnormality (overcharge/over-discharge) of each of the battery cells 201 that constitutes the corresponding battery cell group on the basis of results of this detection. The first cell-con ICs 330a operate as follows. In case that among the battery cells 201 that constitute the corresponding battery cell group, there is a battery cell 201 that is necessary to be adjusted for its charged state (SOC), each of the first cell-con ICs 330 controls the target battery cell 201 to be adjusted to be electrically connected to a discharge resistance for a predetermined period of time on the basis of a command signal from the battery control unit 400 to allow the target battery cell 201 to discharge for the predetermined period of time.

The second cell-con IC 330b basically is constituted by the same integrated circuit (IC having the same configuration) as the respective integrated circuits that constitute the first cell-con ICs 330a. However, unlike the first cell-con ICs 330a, it is not electrically connected to each of the battery cells 201 that constitute the battery cell group but it is provided corresponding to only the first cell-con IC 330a in the corresponding battery cell group that is at the highest potential.

The first cell-con IC 330a that is provided corresponding to the battery cell group at the lowest potential, in order to detect the voltage between the terminals between the positive electrode and the negative electrode of each of the battery cells 201 that constitute the corresponding battery cell group, is electrically connected to the positive electrode and the negative electrode of each of the battery cells 201 that constitutes the corresponding battery cell group via a plurality of voltage detection lines 250.

Each of the first cell-con ICs 330a at other potentials, in order to detect the voltage between the terminals between the positive electrode and negative electrode of each of the battery cells 201 that constitute the corresponding battery cell group, is electrically connected to the positive electrode and negative electrode of each of the battery cells 201 that constitute the corresponding battery cell group via a plurality of voltage detection wirings. At the same time, in order to detect the voltage between the terminals between the positive electrode and the negative electrode of each of the battery cells 201 that constitute the battery cell group corresponding to the first cell-con IC 330a that is potentially lower by one level, each of the first cell-con ICs 330a at other potentials is electrically connected to the first cell-con IC 330a that is potentially adjacent and lower by one level than those at other potentials via the transmission circuit 337.

The second cell-con IC 330b is at the same potential as that of the first cell-con IC 330a at the highest potential that corresponds to the battery cell group at the highest potential. In order to detect the voltage between the terminals between the positive electrode and negative electrode of the battery cells 201 that constitute the battery cell group corresponding to the first cell-con IC 330a at the highest potential, the second cell-con IC 330b is electrically connected to the first cell-con IC 330a at the highest potential via the transmission circuit 337.

Configuration of battery control unit. The battery control unit 400 is an electric circuit unit that manages and controls the state of the battery pack 140. In more detail, the battery control unit 400 includes a microcontroller 410, which is an arithmetic processing unit and performs forecasting calculation of the charged state (SOC: State Of Charge) and deteriorated state (SOH: State Of Health) of the battery pack 140.

The battery control unit 400, on the basis of comparison of adjustment parameters for the charged states transmitted from the integrated battery control unit 600 with the charged states of the battery cells 201, judges whether or not adjustment of the charged states is necessary for each of the battery cells 201. In case that there is a battery cell 201 for which the adjustment of charged state is necessary, the battery cell control unit calculates a charged state adjustment time, i.e., time for adjusting the charged state (discharge time with a discharge resistance). Using the calculated time as a command value, the battery control unit 400 transmits it signal relating to the command value to the first cell-con IC 330a corresponding to the battery cell 201 for which the adjustment of charged state is necessary.

Further, the battery control unit 400 performs diagnoses on the battery pack 140 to detect various abnormalities thereof, collects the results of such diagnoses performed on the battery pack 140, and transmits information about the results to the integrated battery control unit 600.

The battery control unit 400 includes a memory unit 440. The memory unit 440 stores (memorizes) programs for performing the arithmetic processing of SOC and SOH and the like, as well as the initial properties of the battery cells 201, and property data such as maps showing the relationships among SOC, temperature and internal resistance that are preliminarily prepared by experiments and so on. As the memory unit 440, EEPROM (Electrically Erasable Programmable Read-Only Memory), which is a nonvolatile read only memory capable of performing deletion and alteration, is used. Besides, the battery control unit 400 includes a memory unit, for example, RAM (Random Access Memory), which is capable of reading and writing.

Configuration of a communication circuit in the battery pack. Between the battery control unit 400 and the cell control unit 300, a communication circuit 307 is provided. The communication circuit 307 is configured so that the microcontroller 410 in the battery control unit 400 and each of the first cell-con ICs 330 a and the second cell-con IC 330 b can communicate with each other simultaneously and in parallel.

The microcontroller 410, the first cell-con ICs 330a, and the second cell-con IC 330b operate with power sources that are different from each other and have different criterion voltages from each other. That is, the first cell-con ICs 330a use the corresponding battery cell group as a power source. The second cell-con IC 330b is at the same potential as that of the corresponding first cell-con IC 330a. On the other hand, the microcontroller 410 uses the power source unit 700 as a power source. For this reason, in the midway of the communication circuit 307 between the microcontroller 410 and each of the first cell-con ICs 330a and between the microcontroller 410 and the second cell-con IC 330b, a photocoupler 310, which is an insulation element, is provided corresponding to each of the first cell-con ICs 330a and the second cell-con IC 330b so that the microcontroller 410 and each of the first cell-con ICs 330a and the second cell-con IC 330b are electrically insulated therebetween. As a result, it becomes possible to perform communication with electric signals at different criterion potentials one from another between the battery control unit 400 and the cell control unit 300.

The photocoupler 310 is an optical element that converts an electric signal into an optical signal at the light-emitting side thereof and transmits the optical signal to the light-receiving side where it converts the optical signal to an electric signal.

In the present embodiment, explanation is made on an example in which the photocoupler 310 is provided as insulation element. However, other insulation elements such as a coupling capacitor, a transformer and the like may also be used. The coupling capacitor is a capacitive coupling element that blocks the flow of DC current and allows the flow of AC current (electric signal). The transformer is a magnetic element that converts an electric signal into a magnetic signal at the primary side and transmits the magnetic signal to the secondary side where it converts the magnetic signal into an electric signal.

It should be noted that in the present embodiment, explanation is made on an example in which the communication circuit 307 is configured so that simultaneous and parallel communication is possible between the microcontroller 410 and each of the first cell-con ICs 330a and the second cell-con IC 330b. However, a communication circuit (serial communication circuit) that is configured to enable transmission of electric signals in series between the first cell-con ICs 330a and the second cell-con IC 330b by connecting the first cell-con ICs 330a and the second cell-con IC 330b in a daisy-chain mode so that the electric signals can be transmitted via the photocoupler 310 between the microcontroller 410 and each of the first cell-con ICs 330a and the second cell-con IC 330b.

Configuration of cell-con IC. Then, referring to FIGS. 4 through 6, the circuit configuration of the first and second cell-con ICs 330 a and 330 b is explained.

The first and second cell-con ICs 330a and 330b are mounted on the cell controller circuit board together with other electronic circuit components that constitute the cell control unit 300. The first and second cell-con ICs 330a and 330b are integrated circuits that have the same configuration but are different in the mariner they are used.

The first cell-con IC 330a at the lowest potential detects the voltage between the terminals between the positive and negative electrodes of each of the battery cells 201 that constitutes the corresponding battery cell group, stores the detected voltage between the terminals, diagnoses abnormality (overcharge/over-discharge) of each of the battery cells 201 that constitute the corresponding battery cell group, and stores the diagnosis results. In case that a command signal relating to data request is transmitted from the battery control unit 400, the first cell-con IC 330a at the lowest potential transmits a signal in which data relating to the stored voltages between the terminals and abnormality diagnosis results is written to the battery control unit 400

The other first cell-con ICs 330a except for the one at the lowest potential each detect the voltage between the terminals between the positive and negative electrodes of each of the battery cells 201 that constitute the corresponding battery cell group, and store the detected voltage between the terminals. At the same time, they each detect the voltage between the terminals between the positive and negative electrodes of each of the battery cells 201 that constitute the battery cell group that is potentially adjacent and lower by one level and stores the detected voltage between the terminals. Furthermore, they each diagnose whether or not there is abnormality (overcharge/over-discharge) in each of the battery cells 201 that constitute the corresponding battery cell group and abnormality (overcharge/over-discharge) in each of the battery cells 201 that constitute the corresponding battery cell group and abnormality (overcharge/over-discharge) in each of the battery cells 201 that constitute the battery cell group that correspond to the first cell-con IC 330a that is potentially adjacent and lower by one level and store the results of diagnoses. In case that a command signal relating to data request is transmitted from the battery control unit 400 to them, they each transmit a signal in which data relating to the stored voltages between the terminals and the results of abnormality diagnoses are written to the battery control unit 400.

The second cell-con IC 330b detects the voltage between the terminals between the positive and negative electrodes of each of the battery cells 201 that constitute the battery cell group corresponding to the first cell-con IC 330a at the highest potential and stores the voltage between the terminals. Further, it diagnoses whether or not there is abnormality (overcharge/over-discharge) in each of the battery cells 201 that constitute the battery cell group corresponding to the first cell-con IC 330a that is at the highest potential and stores the results of the diagnoses. In case that a command signal relating to data request is transmitted from the battery control unit 400 to it, it transmits a signal in which data relating to the stored voltages between the terminals and the results of abnormality diagnoses are written to the battery control unit 400.

For this purpose, each of the first and second cell-con ICs 330a and 330b includes a voltage detection circuit 370 that detects the voltage between terminals between the positive and negative electrodes of each of the battery cells 201 and a diagnosis circuit that diagnoses abnormality (overcharge/over-discharge) of each of the battery cells 201.

Each of the first cell-con ICs 330a, on the basis of a command signal relating to balancing (adjustment of charged state) transmitted from the battery control unit 400, adjusts any one, for which balancing is necessary, out of the battery cells 201 constituting the corresponding battery cell group by electrically connecting it to a discharge resistance to discharge the battery cell 201 for which balancing is necessary, so that the battery cells 201 can have respective charged states that are adjusted so as to be closer to a standard charged state.

For this purpose, each of the first cell-con ICs 330a includes a balancing control circuit (not shown) that causes to discharge any one of the battery cells 201 constituting the corresponding battery cell group, for which one adjustment of the charged state is necessary. The balancing control circuit is provided corresponding to a discharge resistor (not shown) that is provided corresponding to each of the battery cells 201 that constitutes the corresponding battery cell group. In case that it is necessary to adjust the charged state of any one of the battery cells 201, the switching operation (on/off) of a semiconductor switch (not shown) is controlled to electrically connect or disconnect the discharge resistor to or from the battery cell 201 concerned.

It should be noted that the second cell-con IC 330b is not connected to each of the battery cells 201 that constitutes the battery cell group, it is unnecessary for it to include a balancing control circuit. However, as described above, the second cell-con IC 330b has the same configuration as the first cell-con ICs 330a and hence the second cell-con IC 330b also includes a balancing control circuit.

Each of the first and second cell-con ICs 330a and 330b inputs a command signal from the battery control unit 400 via a signal terminal 391 and outputs a signal having written therein data about voltage between the terminals and diagnosis results and the like via the signal terminal 391.

For this purpose, the first and second cell-con ICs 330a and 330b each include a signal transmission circuit 390.

Each of the first and second cell-con ICs 330a and 330b includes an IC control circuit 350 that controls operation timing of a voltage detection circuit 370 data about voltages between the terminals detected by the voltage detection circuit 370 and flags set on the basis of the results of diagnoses by the diagnosis circuit 360, decoding of command signals that is input in the signal transmission circuit 390, output of signals having written therein data such as voltages between the terminals and diagnosis results and the like.

Besides, the first and second cell-con ICs 330a and 330b include each a startup circuit that starts up the first and second cell-con ICs 330a and 330b, a power source circuit that supplies operation power source to a voltage detection circuit 370, a diagnosis circuit 360, a signal transmission circuit 390, and an IC control circuit 350, and so on.

Configuration of voltage detection circuit. Each of the first cell-con ICs 330 a includes, corresponding to the voltage detection circuit 370, a plurality of voltage detection terminals 331, a voltage detection terminal 333 also serving as a power source terminal Vcc, and a voltage detection terminal 334 also serving as a terminal GND. These are arranged in the order of the voltage detection terminal 333, the voltage detection terminals 331, and the voltage detection terminal 334, i.e., in the order of voltage (potential) to be input and are exposed to outside from the edge of the outer package.

Each of the first cell-con ICs 330a includes two voltage inputting terminals 336 and two voltage outputting terminals. Each of the two voltage inputting terminals 336 inputs the positive electrode-side voltage (potential) and the negative electrode-side voltage (potential), respectively, of each of the battery cells 201 in the battery cell group corresponding to an other one of the first cell-con ICs 330a output from the other one of the first cell-con ICs 330a. Also, each of the two voltage outputting terminals 335 outputs the positive electrode-side voltage (potential) and the negative electrode-side voltage (potential), respectively, of each of the battery cells 201 in the battery cell group corresponding to an other one of the first cell-con ICs 330a to the other one of the first cell-con ICs 330a. These terminals are exposed to the outside from the edge of the outer package.

It should be noted that the first cell-con IC 330a at the lowest potential does not receive from the other first cell-con ICs 330a the positive electrode-side voltage (potential) and the negative electrode-side voltage (potential) of each of the battery cells 201 in the battery cell group corresponding to each of the other first cell-con ICs 330a. However, since all the first cell-con ICs 330a are made to have the same construction in order to standardize the cell-con ICs, the first cell-con IC 330a at the lowest potential includes two voltage inputting terminals 336.

The second cell-con IC 330b neither is electrically connected to any battery cell group nor outputs the positive electrode-side voltage (potential) value and the negative electrode-side voltage (potential) value of each of the battery cells 201 in any battery cell group to other cell-con ICs. So, it does not have to include any of the voltage detection terminal 333, the voltage detection terminals 331, and the voltage detection terminal 334. However, since the first cell-con ICs 330a and the second cell-con IC 330b are made to have the same construction in order to standardize the cell-con ICs, the second cell-con IC 330, like the first cell-con ICs 330a, also includes the voltage detection terminal 333, the voltage detection terminals 331, the voltage detection terminal 334, the two voltage inputting terminals 336 and the two voltage outputting terminals 335.

The voltage detection terminal 333 of each of the first cell-con ICs 330a is electrically connected to the positive electrode-side of one of the battery cells 201, which battery cell is at the highest potential, via a voltage detection line 250. The voltage detection terminal 334 of each of the first cell-con ICs 330a is electrically connected to the negative electrode-side of one of the battery cells 201 which is at the lowest potential via the voltage detection line 250. Each of the voltage detection terminals 331 of each of the first cell-con ICs 330a is electrically connected, in order from above (in order of voltage (potential) to be input) to the negative electrode-side of the battery cell 201 at the highest potential in the corresponding battery cell group, the positive electrode-side and the negative electrode-side of the battery cell 201 in the second high potential in the corresponding battery cell group, the positive electrode-side and the negative electrode-side of the battery cell 201 in the third high potential in the corresponding battery cell group, and the positive electrode-side of the battery cell 201 at the lowest potential in the corresponding battery cell group, each via the voltage detection line 250.

The voltage detection circuit 370 of each of the first cell-con ICs 330a includes a multiplexer 371, a differential amplifier 372, an analog-to-digital converter 373, and a reference voltage output circuit 374. The multiplexer 371 selects and outputs the positive electrode-side voltage (potential) and the negative electrode-side voltage (potential) of each of the battery cells 201 in the corresponding battery cell group introduced via the voltage detection terminals 331, 333, and 334. The differential amplifier 372 produces a difference between the positive electrode-side voltage (potential) and the negative electrode-side voltage (potential) of each of the battery cells 201 output from the multiplexer 371, and amplifies and outputs the produced voltage difference, with its criterion potential being level-shifted to the criterion potential (ground potential) of the corresponding first cell-con IC 330a. The analog-to-digital converter 373 converts the voltages between the terminals output from the differential amplifier 372 from analog signals into digital signals and outputs the converted digital signals to the IC control circuit 350. The reference voltage output circuit 374 outputs a reference voltage having a predetermined value using the criterion potential (ground potential) of the corresponding first cell-con IC 330a as its criterion potential.

The second cell-con IC 330b neither is electrically connected to any battery cell group nor outputs the positive electrode-side voltage (potential) and the negative electrode-side voltage (potential) of each of the battery cells 201 in any battery cell group to other cell-con ICs. So, it does not have to include any multiplexer 371. However, since the first cell-con ICs 330a and the second cell-con IC 330b are made to have the same construction in order to standardize the cell-con ICs, the second cell-con IC 330 is configured to include the voltage detection 370 similarly to the first cell-con ICs 330a.

The multiplexer 371 includes a plurality of switching parts. The switching parts include voltage transmission switching parts that correspond to the two voltage outputting terminals 335, respectively, and voltage detection switching parts that corresponds to the voltage detection terminals 331, 333, and 334, respectively. Each of the two voltage transmission switching parts includes a semiconductor switching element. Among the voltage detection switching parts, those voltage detection switching parts that correspond to the voltage detection terminal 333, which also serves as a power source terminal, and the voltage detection terminal 334, which also serves as a ground terminal, each include a semiconductor switching element. Each of the voltage detection switching parts that respectively correspond to the voltage detection terminals 331 includes two semiconductor switching elements.

With regard to the contacts of each of the two semiconductor switching parts in the voltage detection switching part that corresponds to the voltage detection terminal 331, the contacts that correspond to the side of the voltage detection terminal 331 are electrically connected to each other and further electrically connected to the corresponding voltage detection terminal 331. The contacts that correspond to the opposite side (the side of the differential amplifier 372) are not electrically connected to each other but are electrically independent of each other and connected to separate routes, respectively.

The reference voltage ($V_{REF}$) output from the reference voltage outputting circuit 374 is detected before and after the detection of voltages between the terminals of the battery cells 201 and is used as a discrimination flag for discriminating voltage detection for own battery cells 201 from voltage detection for other battery cells 201. Also, the reference voltage is used as a delimitation voltage that delimits the first detected voltage between the terminals of the battery cell 201 and the next detected voltage between the terminals of the battery cell 201. In addition, the reference voltage ($V_{REF}$) is used as trigger when the IC control circuit 350 causes the semiconductor switching elements of the multiplexer 371 to be switched. The reference voltage ($V_{REF}$) is set at a known voltage value that is lower than the voltage of the battery cell 201.

The reference voltage outputting circuit 374 includes a criterion potential outputting part that introduces therein and outputs therefrom the criterion potential (ground potential) of the corresponding first cell-con IC 330a or the corresponding second cell-con IC 330b. The reference voltage outputting circuit 374 also includes a reference voltage output part that generates a reference voltage having a predetermined value and outputs the generated reference voltage. Each of the criterion voltage outputting part and the reference voltage outputting part includes a semiconductor switching element and is configured so that when it is necessary to output each of the criterion potential (voltage) and the reference voltage, the semiconductor switch element is turned on to output each of the criterion potential (voltage) and the reference voltage.

There are two separate routes, i.e., a first and a second routes, each of which electrically connects the multiplexer 371, the differential amplifier 372, the voltage input terminal 336, and the reference voltage outputting circuit 374.

The first route electrically connects to one of the semiconductor switching elements of the voltage transmission switching part in the multiplexer 371, one of the two semiconductor switching elements of the voltage detection switching part in the multiplexer 371 that corresponds to the voltage detection terminals 331, the semiconductor switching element of the voltage detection switching part in the multiplexer 371 that corresponds to the voltage detection terminal 333, the semiconductor switching element of the reference potential outputting part of the reference voltage outputting circuit 374, and one of the input terminals of the differential amplifier 372.

The second route electrically connects to the other of the semiconductor switching elements of the voltage transmission switching part in the multiplexer 371, the other of the two semiconductor switching elements of the voltage detection switching part in the multiplexer 371 that corresponds to the voltage detection terminals 331, the semiconductor switching element of the voltage detection switching part in the multiplexer 371 that corresponds to the voltage detection terminal 334, the semiconductor switching element of the criterion potential outputting part in the reference voltage outputting circuit 374, and the other of the input terminals of the differential amplifier.

Via the first and second routes, there can be input into the differential amplifier 372, the two voltages (potentials) selected by the multiplexer 371 as well as the reference voltage and the criterion potential (voltage) output from the reference voltage output circuit 374, and the two voltages (potentials) that have been input via two voltage input terminals 336. A difference between the two potentials selected by a multiplexer 371 corresponds to the voltage between the terminals of each of the battery cells 201 that correspond to the first cell-con IC 330a having the multiplexer 371. A difference between the two potentials input via two voltage inputting terminals 336 corresponds to the voltage between the terminals of each of the battery cells 201 that correspond to the first cell-con IC 330a having the two voltage inputting terminals 336. Also, via the first and the second routes, the first cell-con IC 330a can output the two voltages (potentials) selected by the voltage detection switching part in the multiplexer 371 to the voltage outputting terminal 335 via the voltage transmission switching part in the multiplexer 371. As a result, the first cell-con IC 330a each can output the two voltages (potentials) selected by the voltage detection switching part in the multiplexer 371 from the voltage output terminal 335 to the other first cell-con ICs 330a or the second cell-con IC 330b.

Configuration of IC control circuit. The IC control unit 350 is a logic circuit having a calculation function. It includes a data holding circuit 351 that holds (stores) data relating to the detected voltage between the terminals of the battery cell 201 and the like, a timing control circuit that causes detection of voltages between terminals of the battery cells 201 and diagnosis by the diagnosis circuit 360 to be performed periodically, and a diagnosis flag holding circuit that holds (stores) diagnosis flags that indicate results of each diagnosis, and so on.

Each of the data holding circuit 351 and the diagnosis flag holding circuit includes a register.

To the data holding circuit 351 of the first cell-con IC 330a at the lowest potential are input, as digital signals, data relating to the voltage between the terminals of each of the battery cells 201 in the corresponding battery cell group output from the analog-to-digital converter 373 and data relating to the reference voltages output from the corresponding reference voltage output circuit 374. The data holding circuit 351 is provided with areas that correspond to the voltage between the terminals of each of the battery cells 201 in the battery cell group that corresponds to the first cell-con IC 330a at the lowest potential and the reference voltage output from the reference voltage output circuit 374 that corresponds to the first cell-con IC 330a at the lowest potential, respectively. With this construction, the voltages between the terminals and the reference voltages input to the data holding circuit 351 can be written onto corresponding areas of the data holding circuit 351.

To the data holding circuit 351 of each of the first cell-con ICs 330a other than the first cell-con IC 330a at the lowest potential are input various data output from the corresponding analog-to-digital converter 373 as digital signals. Such data include data relating to the voltage between the terminals of each of the battery cells 201 in the corresponding battery cell group, data relating to the voltage between the terminals of each of the battery cells 201 in the battery cell group corresponding to the first cell-con IC 330a that is at a potential lower by one level, data relating to the reference voltage output from the corresponding reference voltage output circuit 374, and data relating to the reference voltage output from the reference voltage output circuit 374 that corresponds to the first cell-con ICs 330a that is at a potential lower by one level. The data holding circuit 351 is provided with areas corresponding to the data relating to the voltage between the terminals of each of the battery cells 201 in the corresponding battery cell group, the data relating to the voltage between the terminals of each of the battery cells 201 in the battery cell group corresponding to the first cell-con ICs 330a that is at a potential lower by one level, the data relating to the reference voltage output from the corresponding reference voltage output circuit 374, and the data relating to the reference voltage output from the reference voltage output circuit 374 corresponding to the first cell-con ICs 330a that is at a potential lower by one level. With this construction, the voltages between the terminals and the reference voltages input to the data holding circuit 351 can be written onto corresponding areas of the data holding circuit 351.

To the data holding circuit 351 of the second cell-con ICs 330b are input various data output from the analog-to-digital converter 373 corresponding to the first cell-con IC 330a at the highest potential, as digital signals. Such data includes data relating to the voltage between the terminals of each of the battery cells 201 in the battery cell group corresponding to the first cell-con IC 330a at the highest potential and data relating to the reference voltage output from the reference voltage output circuit 374 corresponding to the first cell-con IC 330a at the highest potential. The data holding circuit 351 is provided with areas corresponding to data relating to the voltage between the terminals of each of the battery cells 201 in the battery cell group corresponding to the first cell-con IC 330a at the highest potential output from the analog-to-digital converter 373 corresponding to the first cell-con IC 330a at the highest potential, and data relating to the reference voltage output from the reference voltage output circuit 374 corresponding to the first cell-con IC 330a at the highest potential. With this construction, the voltages between the terminals and the reference voltages input to the data holding circuit 351 can be written onto corresponding areas of the data holding circuit 351.

The timing control circuit switches on/off of the semiconductor switching element of the multiplexer 371 on the basis of the reference voltage as a trigger to control the selection operation of the multiplexer 371. Also, the timing control circuit controls the diagnosis operation of the diagnosis circuit 360 so as to diagnose overcharge/over-discharge of the voltage detection circuit 370 of the battery cell 201 in synchronization with the voltage detection operation of the voltage detection circuit.

To the diagnosis flag holding circuit is input a diagnosis flag signal that indicates results of each diagnosis output from the diagnosis circuit 360. The diagnosis flag holding circuit is provided with areas that correspond to respective diagnoses. With this construction, diagnosis flags can be written onto corresponding areas of the diagnosis flag holding circuit.

In case that a command signal relating to data request output from the microcontroller 410 is input into the IC control circuit 350, the IC control circuit 350, at the time when it receives a command signal relating to data request, reads out most recent data held in the data holding circuit 351 and the diagnosis flag holding circuit, produces a signal having written therein these data, and outputs the produced signal to the signal transmission circuit 390.

The IC control circuit 350, in case that a diagnosis flag indicating abnormality requiring prohibition of charge/discharge, for example overcharge/over-discharge of any battery cell 201 is assigned by the diagnosis circuit, outputs a 1-pulse signal having a data length of, for example, 1-bit to the signal transmission circuit 390 without awaiting receipt of a command signal relating to the data request to be output from the microcontroller 410.

Operation of diagnosis circuit. The diagnosis circuit 360 operates in synchronization with a detection period for detection of the voltage between the terminals of the battery cells 201 by the voltage detection circuit 370 and performs diagnoses as to whether there is abnormality of overcharge/over-discharge on the basis of comparison between the voltages between terminals of the battery cells 201 transmitted from the IC control circuit 350 and the predetermined threshold value of overcharge/over-discharge. The results of diagnoses are output as diagnosis flags indicating abnormality from the diagnosis circuit 360 to the IC control circuit 350 and held (stored) in the diagnosis flag holding circuit.

It should be noted that the diagnosis circuit 360 may be implemented in the IC control circuit 350.

Configuration of power circuit. Each of the first and the second cell-con ICs 330 a and 330 b includes, corresponding to the power source circuit, a voltage detection terminal 333 that also serves as a power source terminal and a voltage detection terminal 334 that also serves as a ground terminal, both the terminals being exposed to the outside from the edge of an outer package.

The voltage detection terminal 333 of each of the first cell-con ICs 330a is electrically connected to the positive electrode-side of the battery cell 201 at the highest potential in the corresponding battery cell group via the voltage detection line 250. The voltage detection terminal 334 of each of the first cell-con ICs 330a is electrically connected to the negative electrode-side of the battery cell 201 at the lowest potential in the corresponding battery cell group via the voltage detection line 250.

The voltage detection terminal 333 of the second cell-con IC 330b, though not shown, is electrically connected via the power source line to the positive electrode-side of the battery cell 201 at the highest potential in the battery cell group corresponding to the first cell-con IC 330a at the highest potential. On the other hand, the voltage detection terminal 334 of the second cell-con IC 330b, though not shown, is electrically connected via the power source line to the negative electrode-side of the battery cell 201 at the lowest potential in the battery cell group corresponding to the first cell-con IC 330a at the lowest potential.

The power source circuit in the inside of each of the first and second cell-con ICs 330a and 330b is configured so that at least two kinds of power source voltages $V_{CC}$ and $V_{DD}$ can be used.

The power source circuit that outputs the power source voltage $V_{CC}$ for the first cell-con ICs 330a is a circuit that supplies power of a total voltage (3.6V×4) of the battery cells 201 in the corresponding battery cell group. One end (power source side) of the power source circuit is electrically connected to the voltage detection terminal 333 and the other end (the other side (load side)) of the power source circuit is electrically connected to the multiplexer 371, the constant voltage power source 341, and the signal transmission circuit 390. The power source circuit that outputs a power source voltage $V_{CC}$ for the first cell-con ICs 330a has a criterion potential that corresponds to the potential of the voltage detection terminal 334, that is, the potential of the negative electrode side of the battery cell 201 at the lowest potential in the corresponding battery cell group. The multiplexer 371, the constant voltage power source 341, and the signal transmission circuit 390 also have respective criterion potentials that correspond to that of the voltage detection terminal 334.

The power source circuit that outputs a power source voltage $V_{CC}$ for the second cell-con IC 330b is a circuit that supplies power of a total voltage (3.6V×4) of the battery cells 201 in the battery cell group corresponding to the first cell-con IC 330a at the highest potential. One end (power source side) of the power source circuit is electrically connected to the voltage detection terminal 333 and the other end (the other side (load side)) of the power source circuit is electrically connected to the multiplexer 371, the constant voltage power source 341, and the signal transmission circuit 390. The power source circuit that outputs a power source voltage $V_{CC}$ for the second cell-con IC 330b has a criterion potential that corresponds to the potential of the voltage detection terminal 334, that is, the potential of the negative electrode side of the battery cell 201 at the lowest potential in the corresponding battery cell group. The multiplexer 371, the constant voltage power source 341, and the signal transmission circuit 390 also have respective criterion potentials that correspond to the voltage detection terminal 334.

The constant voltage power source 341 is a regulator circuit that constitutes a power source circuit for the power source voltage $V_{DD}$. It inputs therein a power source voltage $V_{CC}$, produces a power source voltage $V_{DD}$ (for example, 3V), which is lower than the voltage $V_{CC}$, and outputs $V_{DD}$. The constant voltage power source 341 supplies a power source voltage $V_{DD}$ to each of the differential amplifier 372, the analog-to-digital converter 373, the IC control circuit 350, and the diagnosis circuit 360 that are electrically connected thereto. The power source circuit that outputs a power source voltage $V_{DD}$ has a criterion potential that corresponds to the potential of the voltage detection terminal 334. That is, the power source circuit that outputs a power source voltage $V_{CC}$ for the first cell-con IC 330a has a criterion voltage that corresponds to the potential of the negative electrode-side of the battery cell 201 at the lowest potential in the corresponding battery cell group. The power source circuit that outputs a power source voltage $V_{CC}$ for the second cell-con IC 330b has a criterion potential that corresponds to the potential of the negative-electrode side of the battery cell 201 at the lowest potential in the battery cell group corresponding to the first cell-con IC 330a at the highest potential. The differential amplifier 372, the analog-to-digital converter 373, the IC control circuit 350, and the diagnosis circuit 360 have respective criterion potentials that correspond to the potential of the voltage detection terminal 334.

Configuration of startup circuit. Each of the first and second cell-con ICs 330a and 330b includes a startup circuit (not shown), so that the first and second cell-con ICs can be started up on the basis of startup signals that are output from the microcontroller 410.

The startup circuit (not shown) electrically connects the constant voltage power source 341 to the power source circuit that supplies a power source voltage $V_{CC}$ on the basis of a startup signal that is output from the microcontroller 410. As a result, the power source circuit that supplies a power source voltage $V_{CC}$ and the constant voltage power source 341 are electrically connected to each other, so that the power source voltage $V_{CC}$ is supplied to the constant voltage power source 341. When the power source voltage $V_{CC}$ is supplied to the constant voltage power source 341, the constant voltage power source 341 lowers the power source voltage Vcc to produce a power source voltage $V_{DD}$ and supplies it to the differential amplifier 372, the analog-to-digital converter 373, the IC control circuit 350, and the diagnosis circuit 360. As a result, each of the differential amplifier 372, the analog-to-digital converter 373, the IC control circuit 350, and the diagnosis circuit 360 comes to operate and the first and the second cell-con ICs 330a and 330b, which have been in a sleep state, are changed to be in a started up state.

Configuration of protection circuit. In midway of each of the voltage detection line 250, a resistor 312 is electrically connected thereto in series. The resistor 312 is provided in order to protect the terminals and restrict a discharge current which will flow upon balancing. Between any two voltage detection lines 250 that are potentially adjacent to each other is provided a capacitor 311. The capacitor 311 is provided as a countermeasure for noises. Thus, providing the resistor 312 and the capacitor 311 in the electric route between the first cell-con IC 330 a and the corresponding battery cell group, an RC filter (low-pass filter) can be formed in the electric route between the first cell-con IC 330 a and the corresponding battery cell group.

Configuration of duplex voltage detection system. Now, referring to FIGS. 4 through 6, the configuration of the duplex voltage detection system is explained.

Figure 4:
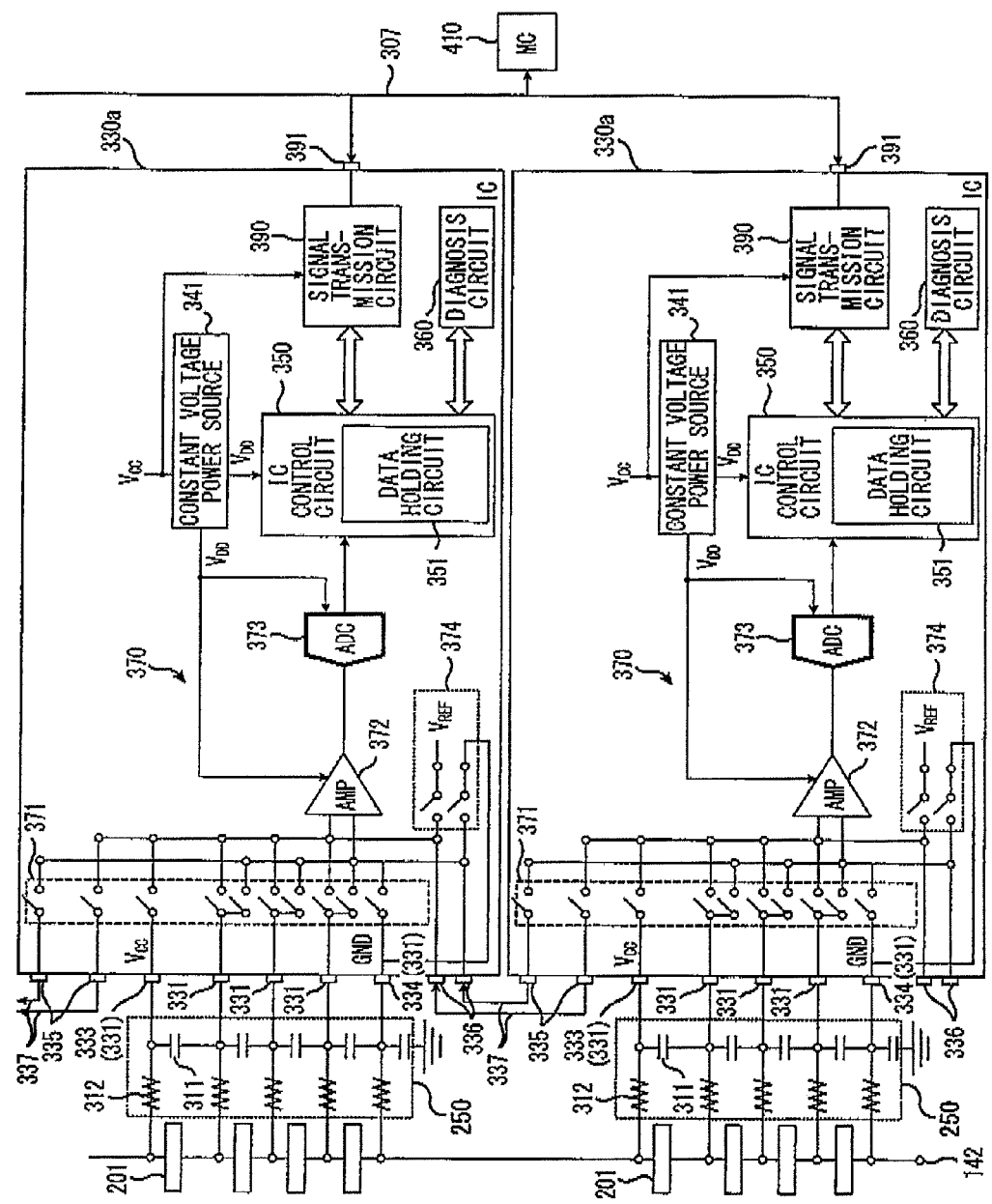
FIG. 4 presents a diagram showing the configuration of a control unit that constitutes the battery module shown in FIG. 3, forming a voltage detection duplex system between the cell controller integrated circuit having the lowest potential and the cell controller integrated circuit having a potential higher than that of the cell controller integrated circuit having the lowest potential.

It should be noted that in FIGS. 4 through 6, illustration of the photocoupler 310 shown in FIG. 3 is omitted.

As shown in FIGS. 4 and 5, the voltage input terminal 336 of one (the first cell-con IC 330a at the higher potential according to the present embodiment) of the first cell-con ICs 330a that are potentially adjacent to each other and the voltage output terminal 335 of the other (the first cell-con IC 330a at the lower potential according to the present embodiment) of the first cell-con ICs 330a that are potentially adjacent to each other are electrically connected to each other in series via the voltage transmission circuit 337. As a result, the voltage between the terminals of each of the battery cells 201 in the corresponding battery cell group can be transmitted to the one of the first cell-con ICs 330a from the other of the first cell-con ICs 330a, so that the one of the first cell-con ICs 330a can detect, by the voltage detection circuit 370, the input voltage between the terminals of each of the battery cells 201 in the battery cell group corresponding to the other of the first cell-con ICs 330a.

As shown in FIG. 6, the voltage output terminal 335 of the first cell-con IC 330a at the highest potential and the voltage input terminal 336 of the second cell-con IC 330b, which is at the same potential as the first cell-con IC 330a at the highest potential, are electrically connected in series to each other via the voltage transmission circuit 337. As a result, the voltage between the terminals of each of the battery cells 201 in the corresponding battery cell group can be output from the first cell-con IC 330a at the highest potential to the second cell-con IC 330b. The second cell-con IC 330b can detect the input voltage between the terminals of each of the battery cells 201 in the battery cell group corresponding to the first cell-con IC 330a at the highest potential by the voltage detection circuit 370.

In case that between the potentially adjacent first cell-con ICs 330a, the first cell-con IC 330a at the lower potential side detects the voltage between the terminals of each of the battery cells 201 in the battery cell group corresponding to the first cell-con IC 330a at the higher potential side, the second cell-con IC 330b is provided corresponding to the first cell-con IC 330a at the lowest potential and detects the voltage between the terminals of each of the battery cells 201 in the battery cell group corresponding to the first cell-con IC 330a at the lowest potential.

Thus, according to the present embodiment, the voltage between the terminals of each of the battery cells 201 in each of the battery cell groups is detected by the corresponding first cell-con IC 330a and also by the potentially adjacent first cell-con IC 330a and the second cell-con IC 330b, which is additionally provided, so that duplexing of the voltage detection system is achieved without simple doubling the cell-con ICs.

In case that one of the first cell-con ICs 330a detects the voltage between the terminals of each of the battery cells 201 in the battery cell group corresponding to the one of the first cell-con IC 330a, two of the voltage detection terminals 331, 333, and 334, i.e., two voltage detection terminals that correspond to the positive electrode and the negative electrode of any one of the battery cells 201 are selected by the multiplexer 371 and voltages input from the two selected terminals are output to the differential amplifier 372. For example, in case that the voltage between terminals of the battery cell 201 at the highest potential is to be detected, both the semiconductor switching element of the voltage detection switching part that corresponds to the voltage detection terminal 333, and the other of the semiconductor switching elements (i.e., semiconductor switching element corresponding to the second route) of the voltage detection switching part that corresponds to the voltage detection terminal 331, which in turn corresponds to the negative electrode side of the battery cell 201 at the highest potential are turned on. The other semiconductor switching elements are turned off.

In case that any of the first cell-con ICs 330a is to detect the reference voltage of the reference voltage outputting circuit 374, all of the semiconductor switching elements in the multiplexer 371 are turned off and all of the semiconductor switching elements in the corresponding reference voltage outputting circuit 374 are turned on, so that a criterion potential (voltage) and a reference voltage can be output from the corresponding reference voltage outputting circuit 374 to the differential amplifier 372.

The differential amplifier 372 produces a difference between voltages output from the multiplexer 371 or the reference voltage outputting circuit 374, and amplifies the voltage difference and outputs the amplified voltage difference to the analog-to-digital converter 373 as a voltage between the terminals or a reference voltage. The differential amplifier 372 operates at a criterion potential that corresponds to the criterion potential (ground potential) of the corresponding first cell-con IC 330a. Therefore, the differential amplifier 372 outputs a voltage difference whose criterion voltage corresponds to the criterion potential (ground potential) of the corresponding first cell-con IC 330a. That is, the differential amplifier 372 can be said to be a level-shifter circuit that outputs a voltage difference after level-shifting the criterion potential of a voltage difference to be output to the criterion potential (ground potential) of the corresponding first cell-con IC 330a.

It should be noted that since the voltage between the terminals of the battery cell 201 at the lowest potential and the reference voltage are voltage differences whose criterion potentials correspond to the criterion potential (ground potential) of the corresponding first cell-con IC 330a from the beginning, they are output from the differential amplifier 372 as they are as voltage differences whose criterion potentials correspond to the criterion potential (ground potential) of the corresponding first cell-con IC 330a.

The output from the differential amplifier 372 (which is an analog signal indicating voltage between the terminals or reference voltage) is converted into a digital value by the analog-to-digital converter 373 that operates at a criterion potential that corresponds to the criterion potential (ground potential) of the first cell-con IC 330a. The voltage between the terminals or reference voltage converted into a digital value is output from the analog-to-digital converter 373 to the IC control circuit 350. The IC control circuit 350 writes the voltage between the terminals and the reference voltage output from the analog-to-digital converter 373 into the corresponding areas in the data holding circuit 351 and holds (stores) them.

It should be noted that according to the present embodiment, the voltage between the terminals of each of the battery cells 201 is detected in order from the battery cell at the highest potential toward the battery cell 201 at the lowest potential.

In case that any one of the first cell-con ICs 330a other than the first cell-con IC 330a at the lowest potential (i.e., first cell-con IC 330a that is detecting, or detecting-side first cell-con IC 330a) detects the voltage between the terminals of each of the battery cells 201 in the battery cell group corresponding to the first cell-con IC 330a at a potential that is lower by one level (i.e., first cell-con IC 330a that is being detected, or detected-side first cell-con IC 330a), all the semiconductor switching elements of the multiplexer 371 and all the semiconductor switching elements of the reference voltage output circuit 374 in the detecting-side first cell-con IC 330a are turned off and the semiconductor switching element of the voltage transmission switching part of the multiplexer 371 in the detected-side first cell-con IC 330a are turned on. In this state, two terminals that correspond to the positive electrode and the negative electrode, respectively, of any of the battery cells 201 in the battery cell group corresponding to the detected-side first cell-con IC 330a are selected by the voltage detection switching part of the multiplexer 371 in the detected-side first cell-con IC 330a. And the voltages input from the two selected terminals are output to the differential amplifier 372 in the detecting-side first cell-con IC 330a via the voltage transmission switching part of the multiplexer 371 in the detected-side first cell-con IC 330a, the voltage output terminal 335 in the detected-side first cell-con IC 330a, the voltage input terminal 336 in the detecting-side first cell-con IC 330a, and the first and second routes in the voltage transmission circuit 337. For example, in case that the voltage between the terminals of the battery cell 201 at the highest potential in the battery cell group corresponding to the detected-side first cell-con IC 330a is to be detected, the semiconductor switching element of the voltage detection switching part corresponding to the voltage detection terminal 333 in the detected-side first cell-con IC 330a and the other of the semiconductor switching elements of the voltage detection switching part corresponding to the voltage detection terminal 331 of the detected-side first cell-con IC 330a that corresponds to the negative electrode side of the battery cell 201 at the highest potential (the semiconductor switching element corresponding to the second route) are turned on, with the semiconductor switching elements in the other voltage detection switching parts being turned off.

In case that the detecting-side first cell-con IC 330a detects the reference voltage of the reference voltage outputting circuit 374 corresponding to the detecting-side first cell-con IC 330a, all the semiconductor switching elements of the voltage detection switching part of the multiplexer 371 in the detected-side first cell-con IC 330a are turned off and all the semiconductor switching elements of the reference voltage outputting circuit 374 in the detected-side first cell-con IC 330a are turned on. As a result, the reference voltage is output from the reference voltage outputting circuit 374 in the detected-side first cell-con IC 330a to the differential amplifier 372 in the detecting-side first cell-con IC 330a via the voltage transmission switching part of the multiplexer 371 in the detected-side first cell-con IC 330a, the voltage output terminal 335 of the detected-side first cell-con IC 330a, the voltage transmission circuit 337, the voltage input terminal 336 of the detecting-side first cell-con IC 330a, and the first and second routes of the detecting-side first cell-con IC 330a. Each of the differential amplifier 372, the analog-to-digital converter 373, and the IC control circuit 350 operates in the same manner as explained above.

In case that the second cell-con IC 330b detects the voltage between the terminals of each of the battery cells 201 in the battery cell group corresponding to the first cell-con IC 330a at the highest potential, all the semiconductor switching elements of the multiplexer 371 and all the semiconductor switching elements of the reference voltage output circuit 374 in the second cell-con IC 330b are turned off and the semiconductor switching element of the voltage transmission switching part of the multiplexer 371 in the first cell-con IC 330a at the highest potential are turned on. In this state, two terminals that correspond to the positive electrode and the negative electrode, respectively, of any of one of the battery cells 201 in the battery cell group corresponding to the first cell-con IC 330a at the highest potential are selected by the voltage detection switching part of the multiplexer 371 in the detected-side first cell-con IC 330a. And the voltages input from the two selected terminals are output to the differential amplifier 372 in the second cell-con IC 330a via the voltage transmission switching part of the multiplexer 371 in the first cell-con IC 330a at the highest potential, the voltage output terminal 335 in the first cell-con IC 330a at the highest potential, the voltage transmission circuit 337, the voltage input terminal 336 in the second cell-con IC 330b, and the first and second routes in the second cell-con IC 330b. For example, in case that the voltage between the terminals of the battery cell 201 at the highest potential in the battery cell group corresponding to the first cell-con IC 330a at the highest potential is to be detected, the semiconductor switching element of the voltage detection switching part corresponding to the voltage detection terminal 333 in the first cell-con IC 330a at the highest potential and the other of the semiconductor switching elements of the voltage detection switching part corresponding to the voltage detection terminal 331 of the first cell-con IC 330a at the highest potential that corresponds to the negative electrode-side of the battery cell 201 at the highest potential (the semiconductor switching element corresponding to the second route) are turned on, with the semiconductor switching elements in the other voltage detection switching parts being turned off.

In case that the second cell-con IC 330b detects the reference voltage of the reference voltage outputting circuit 374 corresponding to the first cell-con IC 330a at the highest potential, all the semiconductor switching elements of the voltage detection switching part of the multiplexer 371 in the first cell-con IC 330a at the highest potential are turned off and all the semiconductor switching elements of the reference voltage outputting circuit 374 in the first cell-con IC 330a at the highest potential are turned on. As a result, the reference voltage is output from the reference voltage outputting circuit 374 in the first cell-con IC 330a at the highest potential to the differential amplifier 372 in the second cell-con IC 330b via the voltage transmission switching part of the multiplexer 371 in the first cell-con IC 330a at the highest potential, the voltage output terminal 335 of the first cell-con IC 330a at the highest potential, the voltage transmission circuit 337, the voltage input terminal 336 of the second cell-con IC 330b, and the first and second routes of the second cell-con IC 330b. Each of the differential amplifier 372, the analog-to-digital converter 373, and the IC control circuit 350 operates in the same manner as explained above.

Voltage detection operation. Now, referring to FIGS. 7A through 7E, explanation is made on the operation timing of the first and second cell-con ICs 330 a and 330 b in the duplex voltage detection system as mentioned above.

FIG. 7A shows voltage detection operation timing of the first and second cell-con ICs 330a and 330b shown in FIGS. 4 through 6, in which the cell control unit 300 includes cell controller integrated circuits IC1 through IC4, with IC1 indicating the second cell-con IC 330b, IC2 indicating the first cell-con IC 330a at the highest potential, IC3 indicating a first cell-con IC 330a at a medium potential, and IC4 indicating the first cell-con IC 330a at the lowest potential.

The present embodiment is explained referring to an example in which IC1 through IC4 are set as described below. As shown in FIG. 7A, a selected signal from the multiplexer 371 is set so that, in each of the IC1 through IC3, its own signals on the basis of the voltage detection of its own battery cells 201 and other's signals on the basis of the voltage detection of the other's battery cells 201 may be alternately input to the analog-to-digital converter (ADC) 373 and, in the IC4, its own signals on the basis of the voltage detection of its own battery cells 201 may be repeatedly input to the analog-to-digital converter (ADC) 373. That is, all of the IC1 through IC4 start up substantially simultaneously and in an initial stage, IC1 through IC4 operate as follows. IC1 detects the voltage between the terminals of each of the battery cells 201 in the battery cell group corresponding to IC2. IC2 detects the voltage between the terminals of each of the battery cells 201 in the battery cell group corresponding to IC2. IC3 detects the voltage between the terminals of each of the battery cells 201 in the battery cell group corresponding to IC4. IC4 detects the voltage between the terminals of each of the battery cells 201 in the battery cell group corresponding to IC4. In this setting, voltage detection can be repeated with the respective voltage detection periods for IC1 through IC3 being made a constant period from the initial stage, so that it becomes easier to synchronize the periods of voltage detection by IC1 through IC4.

IC4 does not detect the voltage between the terminals of any of the battery cells 201 in the battery cell group corresponding to other ICs (IC1 through IC3), so that the period of voltage detection by IC4 is a certain period which is shorter than the respective periods of voltage detection by IC1 through IC3.

Settings for IC1 through IC4 relating to their target battery cell groups, i.e., settings as to which of the battery groups is to be subjected to detection of the voltage between terminals of each of the battery cells 201 included therein are not limited to the above-mentioned one. For example, IC1 through IC4 may be set as follows. First, each of IC2 through IC4 detects the voltage between terminals of each of the battery cells 201 in the corresponding battery cell group and IC1 detects the voltage between terminals of each of the battery cells 201 in the battery cell group corresponding to IC2 or suspends such detection. In such a setting, the period of voltage detection is relatively long in initial stages but will become shorter toward a certain constant period and finally converges to a constant period according as the voltage detection is repeated.

The period of voltage detection for IC4 will not differ from that in the case of the above setting and converges to a constant period that is shorter than the period of voltage detection for IC1 through IC3.

Voltage detection operation of IC4. Since IC4 does never detect the voltage between the terminals of each of the battery cells 201 in the battery cell group corresponding to any other ICs than IC4, it repeats the operation of detecting the voltage between the terminals of each of the battery cells 201 in the battery cell group corresponding to IC4 as shown in FIG. 7A at a constant period. FIG. 7B shows time-based variation of input signals to the analog-to-digital converter 373 and selection signals of the multiplexer 371 in IC3 and IC4 during the voltage detection period for IC4 shown on the outset of the time course shown in FIG. 7A.

(Operation of multiplexer) The multiplexer 371 of IC4 operates according to the following steps.

It should be noted that in the three-digit step numbers, the third number (hundreds digit) indicates the number of IC. The second digit (tens digit) indicates a detection mode, with "1" representing an own cells' voltage detection mode, in which the voltage between terminals of each of the battery cells in the battery cell group corresponding to the IC that performs the detection is detected, and "2" representing an other's cells' voltage detection mode, in which the voltage between terminals of each of the battery cells in the battery cell group corresponding to an IC other than the IC that performs detection is detected. The first digit (units digit) indicates an order of detections.

(Step 411) As shown in the lower part of FIG. 7B, in order for the criterion potential (voltage) and reference voltage (own reference voltage) output from the reference voltage output circuit 374 of IC4 to be input into the differential amplifier 372 of IC4, the multiplexer 371 of IC4 turns off all the semiconductor switching elements.

At this moment, the semiconductor switching element of the reference voltage outputting circuit 374 of IC4 is turned on. In other steps for detecting reference voltages, the semiconductor switching element of the reference voltage outputting circuit 374 of IC4 is turned on in the same manner as in this step.

(Step 412) As shown in the lower part of FIG. 7B, in order for the positive electrode-side voltage (potential) and negative electrode-side voltage (potential) of the battery cell 201 at the highest potential (cell #4) in the battery cell group corresponding to IC4 to be input into the differential amplifier 372 of IC4, the multiplexer 371 of IC4 turns on the semiconductor switching element corresponding to the battery cell 201 (cell #4) at the highest potential in the battery cell group corresponding to IC4 and turns off the other semiconductor switching elements.

In this case, the semiconductor switching element of the reference voltage outputting circuit 374 of IC4 is turned off. In other steps for detecting the voltage between terminals of each of the battery cells 201 in the battery cell group corresponding to IC4, the semiconductor switching element of the reference voltage outputting circuit 374 of IC4 is turned off in the same manner as in this step.

(Step 413) As shown in the lower part of FIG. 7B, in order for the criterion potential (voltage) and reference voltage (own reference voltage) output from the reference voltage output circuit 374 of IC4 to be input into the differential amplifier 372 of IC4, the multiplexer 371 of IC4 turns off all of the semiconductor switching elements.

(Step 414) As shown in the lower part of FIG. 7B, in order for the positive electrode-side voltage (potential) and negative electrode-side voltage (potential) of the battery cell 201 at the second high potential (cell #3) in the battery cell group corresponding to IC4 to be input into the differential amplifier 372 of IC4, the multiplexer 371 of IC4 turns on the semiconductor switching element corresponding to the battery cell 201 at the second high potential (cell #3) in the battery cell group corresponding to IC4 and turns off the other semiconductor switching elements.

(Step 415) As shown in the lower part of FIG. 7B, in order for the criterion potential (voltage) and reference voltage (own reference voltage) output from the reference voltage output circuit 374 of IC4 to be input into the differential amplifier 372 of IC4, the multiplexer 371 of IC4 turns off all of the semiconductor switching elements.

(Step 416) As shown in the lower part of FIG. 7B, in order for the positive electrode-side voltage (potential) and negative electrode-side voltage (potential) of the battery cell 201 at the third high potential (cell #2) in the battery cell group corresponding to IC4 to be input into the differential amplifier 372 of IC4, the multiplexer 371 of IC4 turns on the semiconductor switching element corresponding to the battery cell 201 at the third high potential (cell #2) in the battery cell group corresponding to IC4 and turns off the other semiconductor switching elements.

(Step 417) As shown in the lower part of FIG. 7B, in order for the criterion potential (voltage) and reference voltage (own reference voltage) output from the reference voltage output circuit 374 of IC4 to be input into the differential amplifier 372 of IC4, the multiplexer 371 of IC4 turns off all of the semiconductor switching elements.

(Step 418) As shown in the lower part of FIG. 7B, in order for the positive electrode-side voltage (potential) and negative electrode-side voltage (potential) of the battery cell 201 at the lowest potential (cell #1) in the battery cell group corresponding to IC4 to be input into the differential amplifier 372 of IC4, the multiplexer 371 of IC4 turns on the semiconductor switching element corresponding to the battery cell 201 at the lowest potential (cell #1) in the battery cell group corresponding to IC4 and turns off the other semiconductor switching elements.

(Step 419) As shown in the lower part of FIG. 7B, in order for the criterion potential (voltage) and reference voltage (own reference voltage) output from the reference voltage output circuit 374 of IC4 to be input into the differential amplifier 372 of IC4, the multiplexer 371 of IC4 turns off all of the semiconductor switching elements, (Operation of analog-to-digital converter) With the selection operation of the multiplexer 371 of IC4, the analog-to-digital converter 373 operates according to the following steps.

(Step 411) As shown in the lower part of FIG. 7B, the analog-to-digital converter 373 of IC4 detects the reference voltage (own reference voltage) output from the reference voltage outputting circuit 374 of IC4.

(Step 412) As shown in the lower part of FIG. 7B, the analog-to-digital converter 373 of IC4 detects the voltage between the terminals of the battery cell 201 at the highest potential (cell #4) in the battery cell group corresponding to IC4 output from the multiplexer 371 of IC4.

(Step 413) As shown in the lower part of FIG. 7B, the analog-to-digital converter 373 of IC4 detects the reference voltage (own reference voltage) output from the reference voltage outputting circuit 374 of IC4.

(Step 414) As shown in the lower part of FIG. 7B, the analog-to-digital converter 373 of IC4 detects the voltage between the terminals of the battery cell 201 at the second high potential (cell #3) in the battery cell group corresponding to IC4 output from the multiplexer 371 of IC4.

(Step 415) As shown in the lower part of FIG. 7B, the analog-to-digital converter 373 of IC4 detects the reference voltage (own reference voltage) output from the reference voltage outputting circuit 374 of IC4.

(Step 416) As shown in the lower part of FIG. 7B, the analog-to-digital converter 373 of IC4 detects the voltage between the terminals of the battery cell 201 at the third high potential (cell #2) in the battery cell group corresponding to IC4 output from the multiplexer 371 of IC4.

(Step 417) As shown in the lower part of FIG. 7B, the analog-to-digital converter 373 of IC4 detects the reference voltage (own reference voltage) output from the reference voltage outputting circuit 374 of IC (Step 418) As shown in the lower part of FIG. 7B, the analog-to-digital converter 373 of IC4 detects the voltage between the terminals of the battery cell 201 at the lowest potential (cell #1) in the battery cell group corresponding to IC4 output from the multiplexer 371 of IC4.

(Step 419) As shown in the lower part of FIG. 7B, the analog-to-digital converter 373 of IC4 detects the reference voltage (own reference voltage) output from the reference voltage outputting circuit 374 of IC In this manner, IC4 repeats these operations periodically, with the operations in Steps 411 through 419 as one period (cycle).

The detected voltage between the terminals of each of the battery cells 201 (#4 through #1) in the battery cell group corresponding to IC4 and the detected reference voltage of the reference voltage outputting circuit 374 corresponding to IC4 are output to the IC control circuit 350 in IC4 and written into the data holding circuit 351 in IC4. The data holding circuit 351 in IC4 has set therein data areas corresponding to the voltage between the terminals of each of the battery cells 201 (#4 through #1) in the battery cell group corresponding to IC4 and the detected reference voltage of the reference voltage outputting circuit 374 corresponding to IC4. The voltage between the terminals and reference voltage output from the analog-to-digital converter 373 in IC4 are written into the corresponding areas in synchronization with the voltage detection operation period of IC4. This writing is performed such that old data is overwritten by new data.

Voltage detection operation of IC3. IC3, as shown in FIG. 7A, alternately repeats the operation of detecting the voltage between the terminals of each of the battery cells 201 corresponding to IC4 and an operation of detecting the voltage between the terminals of each of the battery cells 201 corresponding to IC3. FIG. 7C shows changes of input signals of the analog-to-digital converter 373 and selection signals of the multiplexer 371 for IC3 and IC2 in the front half of the voltage detection period of IC3 and the rear half of the voltage detection period of IC2 in the time course shown in FIG. 7A.

Here, in case that IC3 detects the voltage between the terminals of each of the battery cells 201 corresponding to IC4, IC4 detects the voltage between the terminals of each of the battery cells 201 corresponding to IC4. That is, the voltage between the terminals of each of the battery cells 201 corresponding to IC4 is detected by both IC4 and IC3, simultaneously.

(Other's cells voltage detection) First, IC3 detects the voltage between the terminals of each of the battery cells 201 corresponding to IC4 in synchronization with the operation of IC4, which detects the voltage between the terminals of each of the battery cells 201 corresponding to IC4.

(Operation of multiplexer) The multiplexer 371 of IC3 operates according to the following steps.

(Step 321) As shown in the upper part of FIG. 7B, in order for the positive electrode-side voltage (potential) and negative electrode-side voltage (potential) of the battery cells 201 (cell #4 through 1) in the battery cell group corresponding to IC4, selected by the multiplexer 371 of IC4 and the criterion potential (voltage) and reference voltage (other's reference voltage) output from the reference voltage outputting circuit 374 of IC4 to be alternately input into the differential amplifier 272 all the semiconductor switching elements of the multiplexer 371 of IC4 are turned off.

In this case, the multiplexer 371 of IC4 turns on the semiconductor switching element of the voltage transmission switching part. As a result, the multiplexer 371 of IC4 can output the selected voltage to the differential amplifier 372 of IC4 and the differential amplifier 372 of IC3, respectively.

(Operation of analog-to-digital converter) With the selection operation of the multiplexer 371 of IC4, the analog-to-digital converter 373 operates according to the following steps.

(Step 321) As shown in the upper part of FIG. 7B, the analog-to-digital converter 373 of IC3 detects the reference voltage (other's reference voltage) output from the reference voltage outputting circuit 374 of IC4.

(Step 322) As shown in the upper part of FIG. 7B, the analog-to-digital converter 373 of IC3 detects the voltage between the terminals of the battery cell 201 at the highest potential (cell #4) in the battery cell group corresponding to IC4 the output from the multiplexer 371 of IC4.

(Step 323) As shown in the upper part of FIG. 7B, the analog-to-digital converter 373 of IC3 detects the reference voltage (other's reference voltage) output from the reference voltage outputting circuit 374 of IC4.

(Step 324) As shown in the upper part of FIG. 7B, the analog-to-digital converter 373 of IC3 detects the voltage between the terminals of the battery cell 201 at the second high potential (cell #3) in the battery cell group corresponding to IC4 the output from the multiplexer 371 of IC4.

(Step 325) As shown in the upper part of FIG. 7B, the analog-to-digital converter 373 of IC4 detects the reference voltage (other's reference voltage) output from the reference voltage outputting circuit 374 of IC4.

(Step 326) As shown in the upper part of FIG. 7B, the analog-to-digital converter 373 of IC3 detects the voltage between the terminals of the battery cell 201 at the third high potential (cell #2) in the battery cell group corresponding to IC4 the output from the multiplexer 371 of IC4.

(Step 327) As shown in the upper part of FIG. 7B, the analog-to-digital converter 373 of IC3 detects the reference voltage (other's reference voltage) output from the reference voltage outputting circuit 374 of IC4.

(Step 328) As shown in the upper part of FIG. 7B, the analog-to-digital converter 373 of IC3 detects the voltage between the terminals of the battery cell 201 at the lowest potential (cell #1) in the battery cell group corresponding to IC4 output from the multiplexer 371 of IC4.

(Step 329) As shown in the upper part of FIG. 7B, the analog-to-digital converter 373 of IC3 detects the reference voltage (other's reference voltage) output from the reference voltage outputting circuit 374 of IC4.

(Own cells' voltage detection) Thereafter, IC3 detects the voltage between the terminals of each of the battery cells 201 (#8 through #5) corresponding to IC3.

(Operation of multiplexer) The multiplexer 371 of IC3 operates according to the following steps.

(Step 311) As shown in the lower part of FIG. 7C, in order for the criterion potential (voltage) and reference voltage (own reference voltage) output from the reference voltage outputting circuit 374 of IC3 to be alternately input into the differential amplifier 372 of IC3, the multiplexer 371 of IC3 turns off all the semiconductor switching elements.

At this moment, the semiconductor switching element of the reference voltage outputting circuit 374 of IC3 is turned on. In other steps for detecting the reference voltage, the semiconductor switching element of the reference voltage outputting circuit 374 of IC3 is turned on in the same manner as in this step.

(Step 312) As shown in the lower part of FIG. 7C, in order for the positive electrode-side voltage (potential) and negative electrode-side voltage (potential) of the battery cell 201 at the highest potential (cell #8) in the battery cell group corresponding to IC3 to be input into the differential amplifier 372 of IC3, the multiplexer 371 of IC3 turns on the semiconductor switching element corresponding to the battery cell 201 at the highest potential (cell #8) in the battery cell group corresponding to IC3 and turns off the other semiconductor switching elements.

In this case, the semiconductor switching element of the reference voltage outputting circuit 374 of IC3 is turned off. In other steps for detecting the voltage between terminals of each of the battery cells 201 in the battery cell group corresponding to IC3, the semiconductor switching element of the reference voltage outputting circuit 374 of IC3 is turned off in the same manner as in this step.

(Step 313) As shown in the lower part of FIG. 7C, in order for the criterion potential (voltage) and reference voltage (own reference voltage) output from the reference voltage outputting circuit 374 of IC3 to be alternately input into the differential amplifier 372 of IC3, the multiplexer 371 of IC3 turns off all the semiconductor switching elements.

(Step 314) As shown in the lower part of FIG. 7C, in order for the positive electrode-side voltage (potential) and negative electrode-side voltage (potential) of the battery cell 201 at the second high potential (cell #7) in the battery cell group corresponding to IC3 to be input into the differential amplifier 372 of IC3, the multiplexer 371 of IC3 turns on the semiconductor switching element corresponding to the battery cell 201 at the second high potential (cell #7) in the battery cell group corresponding to IC3 and turns off the other semiconductor switching elements.

(Step 315) As shown in the lower part of FIG. 7C, in order for the criterion potential (voltage) and reference voltage (own reference voltage) output from the reference voltage outputting circuit 374 of IC3 to be alternately input into the differential amplifier 372 of IC3, the multiplexer 371 of IC3 turns off all the semiconductor switching elements, (Step 316) As shown in the lower part of FIG. 7C, in order for the positive electrode-side voltage (potential) and negative electrode-side voltage (potential) of the battery cell 201 at the third high potential (cell #6) in the battery cell group corresponding to IC3 to be input into the differential amplifier 372 of IC3, the multiplexer 371 of IC3 turns on the semiconductor switching element corresponding to the battery cell 201 at the third high potential (cell #6) in the battery cell group corresponding to IC3 and turns off the other semiconductor switching elements.

(Step 317) As shown in the lower part of FIG. 7C, in order for the criterion potential (voltage) and reference voltage (own reference voltage) output from the reference voltage outputting circuit 374 of IC3 to be alternately input into the differential amplifier 372 of IC3, the multiplexer 371 of IC3 turns off all the semiconductor switching elements.

(Step 318) As shown in the lower part of FIG. 7C, in order for the positive electrode-side voltage (potential) and negative electrode-side voltage (potential) of the battery cell 201 at the lowest potential (cell #5) in the battery cell group corresponding to IC3 to be input into the differential amplifier 372 of IC3, the multiplexer 371 of IC3 turns on the semiconductor switching element corresponding to the battery cell 201 at the lowest potential (cell #5) in the battery cell group corresponding to IC3 and turns off the other semiconductor switching elements.

(Step 319) As shown in the lower part of FIG. 7C, in order for the criterion potential (voltage) and reference voltage (own reference voltage) output from the reference voltage outputting circuit 374 of IC3 to be alternately input into the differential amplifier 372 of IC3, the multiplexer 371 of IC3 turns off all the semiconductor switching elements.

(Operation of analog-to-digital converter) With the selection operation of the multiplexer 371 of IC3, the analog-to-digital converter 373 (ADC) of IC3 operates according to the following steps.

(Step 311) As shown in the lower part of FIG. 7C, the analog-to-digital converter 373 of IC3 detects the reference voltage (own reference voltage) output from the reference voltage outputting circuit 374 of IC3.

(Step 312) As shown in the lower part of FIG. 7C, the analog-to-digital converter 373 of IC3 detects the voltage between the terminals of the battery cell 201 at the highest potential (cell #8) in the battery cell group corresponding to IC3 output from the multiplexer 371 of IC3.

(Step 313) As shown in the lower part of FIG. 7C, the analog-to-digital converter 373 of IC3 detects the reference voltage (own reference voltage) output from the reference voltage outputting circuit 374 of IC3.

(Step 314) As shown in the lower part of FIG. 7C, the analog-to-digital converter 373 of IC3 detects the voltage between the terminals of the battery cell 201 at the second high potential (cell #7) in the battery cell group corresponding to IC3 output from the multiplexer 371 of IC3.

(Step 315) As shown in the lower part of FIG. 7C, the analog-to-digital converter 373 of IC3 detects the reference voltage (own reference voltage) output from the reference voltage outputting circuit 374 of IC3.

(Step 316) As shown in the lower part of FIG. 7C, the analog-to-digital converter 373 of IC3 detects the voltage between the terminals of the battery cell 201 at the third high potential (cell #6) in, the battery cell group corresponding to IC3 output from the multiplexer 371 of IC3.

(Step 317) As shown in the lower part of FIG. 7C, the analog-to-digital converter 373 of IC3 detects the reference voltage (own reference voltage) output from the reference voltage outputting circuit 374 of IC3.

(Step 318) As shown in the lower part of FIG. 7C, the analog-to-digital converter 373 of IC3 detects the voltage between the terminals of the battery cell 201 at the lowest potential (cell #5) in the battery cell group corresponding to IC3 output from the multiplexer 371 of IC3.

(Step 319) As shown in the lower part of FIG. 7C, the analog-to-digital converter 373 of IC3 detects the reference voltage (own reference voltage) output from the reference voltage outputting circuit 374 of IC3.

In this manner, IC3 repeats the operations in Steps 321 through 329 and those in Steps 311 through 319 alternately. IC repeats all the operations in Steps 321 through 329 and Steps 311 through 319 as one period (cycle).

The detected voltage between the terminals of each of the battery cells 201 (#4 through #1) in the battery cell group corresponding to IC4, the detected voltage between the terminals of each of the battery cells 201 (#8 through #5) in the battery cell group corresponding to IC3, the detected reference voltage of the reference voltage outputting circuit 374 corresponding to IC4, and the detected reference voltage of the reference voltage outputting circuit 374 corresponding to IC3 are output to the IC control circuit 350 in IC3 and written into the data holding circuit 351 in IC3. The data holding circuit 351 in IC3 have set therein data areas corresponding to the voltage between the terminals of each of the battery cells 201 (#4 through #1) in the battery cell group corresponding to IC4, the voltage between the terminals of each of the battery cells 201 (#8 through #5) in the battery cell group corresponding to IC3, the reference voltage of the reference voltage outputting circuit 374 corresponding to IC4, and the reference voltage of the reference voltage outputting circuit 374 corresponding to IC3, respectively. The voltages between the terminals and reference voltages output from the analog-to-digital converter 373 in IC3 are written into the corresponding areas in synchronization with the voltage detection operation period of IC3.

Voltage detection operation of IC2. Then, IC2, as shown in FIG. 7A, alternately repeats the operation of detecting the voltage between the terminals of each of the battery cells 201 corresponding to IC2 and the operation of detecting the voltage between the terminals of each of the battery cells 201 corresponding to IC3. FIG. 7D shows time-based changes of input signals of the analog-to-digital converter 373 and selection signals of the multiplexer 371 for IC2 and IC1 in the front half of the voltage detection period of IC2 and the rear half of the voltage detection period of IC1 in the time course shown in FIG. 7A.

Here, in case that IC2 detects the voltage between the terminals of each of the battery cells 201 corresponding to IC3, IC3 detects the voltage between the terminals of each of the battery cells 201 corresponding to IC3. That is, the voltage between the terminals of each of the battery cells 201 corresponding to IC3 is detected by both ICS and IC2, simultaneously.

(Own cells' voltage detection) First, IC2 detects the voltage between the terminals of each of the battery cells 201 corresponding to IC2 since IC3 detects the voltage between the terminals of each of the battery cells 201 corresponding to IC4, so that IC2 cannot detect the voltage between the terminals of each of the battery cells 201 corresponding to IC3.

(Operation of multiplexer) The multiplexer 371 of IC2 operates according to the following steps.

(Step 211) As shown in the lower part of FIG. 7D, in order for the criterion potential (voltage) and reference voltage (own reference voltage) output from the reference voltage outputting circuit 374 of IC2 to be input into the differential amplifier 372 of IC2, the multiplexer 371 of IC3 turns off all the semiconductor switching elements.

At this moment, the semiconductor switching element of the reference voltage outputting circuit 374 of IC2 is turned on. In other steps for detecting reference voltages, the semiconductor switching element of the reference voltage outputting circuit 374 of IC2 is turned on in the same manner as in this step.

(Step 212) As shown in the lower part of FIG. 7D, in order for the positive electrode-side voltage (potential) and negative electrode-side voltage (potential) of the battery cell 201 at the highest potential (cell #12) in the battery cell group corresponding to IC2 to be input into the differential amplifier 372 of IC2, the multiplexer 371 of IC2 turns on the semiconductor switching element corresponding to the battery cell 201 at the highest potential (cell #12) in the battery cell group corresponding to IC2 and turns off the other semiconductor switching elements.

In this case, the semiconductor switching element of the reference voltage outputting circuit 374 of IC2 is turned off. In other steps for detecting the voltage between terminals of each of the battery cells 201 in the battery cell group corresponding to IC2, the semiconductor switching element of the reference voltage outputting circuit 374 of IC2 is turned off in the same manner as in this step.

(Step 213) As shown in the lower part of FIG. 7D, in order for the criterion potential (voltage) and reference voltage (own reference voltage) output from the reference voltage outputting circuit 374 of IC2 to be input into the differential amplifier 372 of IC2, the multiplexer 371 of IC3 turns off all the semiconductor switching elements.

(Step 214) As shown in the lower part of FIG. 7D, in order for the positive electrode-side voltage (potential) and negative electrode-side voltage (potential) of the battery cell 201 at the second high potential (cell #11) in the battery cell group corresponding to IC2 to be input into the differential amplifier 372 of IC2, the multiplexer 371 of IC2 turns on the semiconductor switching element corresponding to the battery cell 201 at the second high potential (cell #11) in the battery cell group corresponding to IC3 and turns off the other semiconductor switching elements.

(Step 215) As shown in the lower part of FIG. 7D, in order for the criterion potential (voltage) and reference voltage (own reference voltage) output from the reference voltage outputting circuit 374 of IC2 to be input into the differential amplifier 372 of IC2, the multiplexer 371 of IC2 turns off all the semiconductor switching elements of the multiplexer 371 of IC2.

(Step 216) As shown in the lower part of FIG. 7D, in order for the positive electrode-side voltage (potential) and negative electrode-side voltage (potential) of the battery cell 201 at the third high potential (cell #10) in the battery cell group corresponding to IC2 to be input into the differential amplifier 372 of IC2, the multiplexer 371 of IC2 turns on the semiconductor switching element corresponding to the battery cell 201 at the third high potential (cell #10) in the battery cell group corresponding to IC2 and turns off the other semiconductor switching elements.

(Step 217) As shown in the lower part of FIG. 7D, in order for the criterion potential (voltage) and reference voltage (own reference voltage) output from the reference voltage outputting circuit 374 of IC2 to be alternately input into the differential amplifier 372 of IC2, the multiplexer 371 of IC2 turns off all the semiconductor switching elements.

(Step 218) As shown in the lower part of FIG. 7C, in order for the positive electrode-side voltage (potential) and negative electrode-side voltage (potential) of the battery cell 201 at the lowest potential (cell #9) in the battery cell group corresponding to IC2 to be input into the differential amplifier 372 of IC2, the multiplexer 371 of IC2 turns on the semiconductor switching element corresponding to the battery cell 201 at the lowest potential (cell #9) in the battery cell group corresponding to IC2 and turns off the other semiconductor switching elements.

(Step 219) As shown in the lower part of FIG. 7D, in order for the criterion potential (voltage) and reference voltage (own reference voltage) output from the reference voltage outputting circuit 374 of IC2 to be alternately input into the differential amplifier 372 of IC2, the multiplexer 371 of IC2 turns off all the semiconductor switching elements.

(Operation of analog-to-digital converter) With the selection operation of the multiplexer 371 of IC2, the analog-to-digital converter 373 (ADC) of IC2 operates according to the following steps.

(Step 211) As shown in the lower part of FIG. 7D, the analog-to-digital converter 373 of IC2 detects the reference voltage (own reference voltage) output from the reference voltage outputting circuit 374 of IC2.

(Step 212) As shown in the lower part of FIG. 7D, the analog-to-digital converter 373 of IC2 detects the voltage between the terminals of the battery cell 201 at the highest potential (cell #12) in the battery cell group corresponding to IC2 output from the multiplexer 371 of IC2.

(Step 213) As shown in the lower part of FIG. 7D, the analog-to-digital converter 373 of IC2 detects the reference voltage (own reference voltage) output from the reference voltage outputting circuit 374 of IC2.

(Step 214) As shown in the lower part of FIG. 7D, the analog-to-digital converter 373 of IC2 detects the voltage between the terminals of the battery cell 201 at the second high potential (cell #11) in the battery cell group corresponding to IC2 output from the multiplexer 371 of IC2.

(Step 215) As shown in the lower part of FIG. 7D, the analog-to-digital converter 373 of IC2 detects the reference voltage (own reference voltage) output from the reference voltage outputting circuit 374 of IC2.

(Step 216) As shown in the lower part of FIG. 7D, the analog-to-digital converter 373 of IC2 detects the voltage between the terminals of the battery cell 201 at the third high potential (cell #10) in the battery cell group corresponding to IC2 output from the multiplexer 371 of IC2.

(Step 217) As shown in the lower part of FIG. 7D, the analog-to-digital converter 373 of IC2 detects the reference voltage (own reference voltage) output from the reference voltage outputting circuit 374 of IC2.

(Step 218) As shown in the lower part of FIG. 7D, the analog-to-digital converter 373 of IC2 detects the voltage between the terminals of the battery cell 201 at the lowest potential (cell #9) in the battery cell group corresponding to IC2 output from the multiplexer 371 of IC2.

(Step 219) As shown in the lower part of FIG. 7D, the analog-to-digital converter 373 of IC2 detects the reference voltage (own reference voltage) output from the reference voltage outputting circuit 374 of IC2.

(Other's cells' voltage detection) Thereafter, IC2 detects the voltage between the terminals of each of the battery cells 201 (#8 through #5) corresponding to IC3 in synchronization with IC3, which detects the voltage between the terminals of each of the battery cells 201 (#8 through #5) corresponding to IC3.

(Operation of multiplexer) The multiplexer 371 of IC2 operates according to the following steps.

(Step 220) As shown in the upper part of FIG. 7C, in order for the positive electrode-side voltage (potential) and negative electrode-side voltage (potential) of each of the battery cells 201 (cell #8 through #5) in the battery cell group corresponding to IC3 selected by the multiplexer 371 of IC3 and the criterion potential (voltage) and reference voltage (other's reference voltage) output from the reference voltage outputting circuit 374 of IC3 to be alternately input into the differential amplifier 372 of IC2, the multiplexer 371 of IC2 turns off all the semiconductor switching elements.

In this case, the multiplexer 371 of IC3 turns on the semiconductor switching element of the voltage transmission switching part. As a result, the reference voltage outputting circuit 374 of IC3 is turned on. As a result, the multiplexer 371 of IC3 can output the selected voltage to the differential amplifier 372 of IC3 and the differential amplifier 372 of IC2.

(Operation of analog-to-digital converter) With the selection operation of the multiplexer 371 of IC3, the analog-to-digital converter 373 (ADC) of IC2 operates according to the following steps.

(Step 221) As shown in the upper part of FIG. 7C, the analog-to-digital converter 373 of IC2 detects the reference voltage (other's reference voltage) output from the reference voltage outputting circuit 374 of IC3.

(Step 222) As shown in the upper part of FIG. 7C, the analog-to-digital converter 373 of IC2 detects the voltage between the terminals of the battery cell 201 at the highest potential (cell #8) in the battery cell group corresponding to IC3 output from the multiplexer 371 of IC3.

(Step 223) As shown in the upper part of FIG. 7C, the analog-to-digital converter 373 of IC2 detects the reference voltage (other's reference voltage) output from the reference voltage outputting circuit 374 of IC3.

(Step 224) As shown in the upper part of FIG. 7C, the analog-to-digital converter 373 of IC2 detects the voltage between the terminals of the battery cell 201 at the second high potential (cell #7) in the battery cell group corresponding to IC3 output from the multiplexer 371 of IC3.

(Step 225) As shown in the upper part of FIG. 7C, the analog-to-digital converter 373 of IC2 detects the reference voltage (own reference voltage) output from the reference voltage outputting circuit 374 of IC3.

(Step 226) As shown in the upper part of FIG. 7C, the analog-to-digital converter 373 of IC2 detects the voltage between the terminals of the battery cell 201 at the third high potential (cell #6) in the battery cell group corresponding to IC3 output from the multiplexer 371 of IC3.

(Step 227) As shown in the upper part of FIG. 7C, the analog-to-digital converter 373 of IC2 detects the reference voltage (other's reference voltage) output from the reference voltage outputting circuit 374 of IC3.

(Step 228) As shown in the upper part of FIG. 7C, the analog-to-digital converter 373 of IC2 detects the voltage between the terminals of the battery cell 201 at the lowest potential (cell #5) in the battery cell group corresponding to IC3 output from the multiplexer 371 of IC3.

(Step 229) As shown in the upper part of FIG. 7C, the analog-to-digital converter 373 of IC2 detects the reference voltage (other's reference voltage) output from the reference voltage outputting circuit 374 of IC3.

In this manner, IC2 repeats the operations in Steps 211 through 219 and those in Steps 221 through 229 alternately. IC2 repeats all the operations in Steps 211 through 219 and Steps 221 through 229 as one period (cycle).

The detected voltage between the terminals of each of the battery cells 201 (#12 through #9) in the battery cell group corresponding to IC2, the detected voltage between the terminals of each of the battery cells 201 (#8 through #5) in the battery cell group corresponding to IC3, the detected reference voltage of the reference voltage outputting circuit 374 corresponding to IC2, and the detected reference voltage of the reference voltage outputting circuit 374 corresponding to IC3 are output to the IC control circuit 350 in IC2 and written into the data holding circuit 351 in IC2. The data holding circuit 351 in IC2 have set therein data areas corresponding to the voltage between the terminals of each of the battery cells 201 (#12 through #9) in the battery cell group corresponding to IC2, the voltage between the terminals of each of the battery cells 201 (#8 through #5) in the battery cell group corresponding to IC3, the detected reference voltage of the reference voltage outputting circuit 374 corresponding to IC2, and the detected reference voltage of the reference voltage outputting circuit 374 corresponding to IC3. The voltage between the terminals and reference voltage output from the analog-to-digital converter 373 in IC2 are written into the corresponding areas in synchronization with the voltage detection operation period of IC2.

Voltage detection operation of IC1. Since IC1 does not correspond to any battery cell group, IC1 repeats, as shown in the upper part of FIG. 7D, the operation of detecting the voltage between the terminals of each of the battery cells 201 in the battery cell corresponding to IC2 at a fixed period. FIG. 7E shows changes of input signals of the analog-to-digital converter 373 and selection signals of the multiplexer 371 for IC1 in the front half of the voltage detection period of IC1, i.e., in a period during which IC1 does not detect the voltage between the terminals of the battery cells 201 in the battery cell group corresponding to IC2 in the time course shown in FIG. 7A.

Here, in case that IC1 detects the voltage between the terminals of each of the battery cells 201 corresponding to IC2, IC2 detects the voltage between the terminals of each of the battery cells 201 corresponding to IC2. That is, the voltage between the terminals of each of the battery cells 201 corresponding to IC4 is detected by both IC2 and IC1, simultaneously.

(Other's cells' voltage detection) First, IC1 detects the voltage between the terminals of each of the battery cells 201 corresponding to IC2 in synchronization with IC2, which detects the voltage between the terminals of each of the battery cells 201 corresponding to IC2.

(Operation of multiplexer) The multiplexer 371 of IC1 operates according to the following steps.

(Step 121) As shown in the upper part of FIG. 7D, in order for the positive electrode-side voltage (potential) and negative electrode-side voltage (potential) of each of the battery cells 201 in the battery cell group corresponding to IC2 (cell #12 through #9) selected by the multiplexer 371 of IC2 and the criterion potential (voltage) and reference voltage (other's reference voltage) output from the reference voltage outputting circuit 374 of IC2 to be alternately input into the differential amplifier 372 of IC1, the multiplexer 371 of IC1 turns off all the semiconductor switching elements.

In this case, the multiplexer 371 of IC2 turns on the semiconductor switching element of the voltage transmission switching part. As a result, the multiplexer 371 of IC2 can output the selected voltage to the differential amplifier 372 of IC2 and the differential amplifier 372 of IC1.

(Operation of analog-to-digital) With the selection operation of the multiplexer 371 of IC2, the analog-to-digital converter 373 (ADC) of IC1 operates according to the following steps.

(Step 121) As shown in the upper part of FIG. 7D, the analog-to-digital converter 373 of IC1 detects the reference voltage (other's reference voltage) output from the reference voltage outputting circuit 374 of 102.

(Step 122) As shown in the upper part of FIG. 7D, the analog-to-digital converter 373 of IC1 detects the voltage between the terminals of the battery cell 201 at the highest potential (cell #12) in the battery cell group corresponding to IC2 output from the multiplexer 371 of IC2.

(Step 123) As shown in the upper part of FIG. 7D, the analog-to-digital converter 373 of IC1 detects the reference voltage (other's reference voltage) output from the reference voltage outputting circuit 374 of IC2.

(Step 124) As shown in the upper part of FIG. 7D, the analog-to-digital converter 373 of IC1 detects the voltage between the terminals of the battery cell 201 at the second high potential (cell #11) in the battery cell group corresponding to IC2 output from the multiplexer 371 of IC2.

(Step 125) As shown in the upper part of FIG. 7D, the analog-to-digital converter 373 of IC1 detects the reference voltage (own reference voltage) output from the reference voltage outputting circuit 374 of IC2.

(Step 126) As shown in the upper part of FIG. 7D, the analog-to-digital converter 373 of IC1 detects the voltage between the terminals of the battery cell 201 at the third high potential (cell #10) in the battery cell group corresponding to 102 output from the multiplexer 371 of IC2.

(Step 127) As shown in the upper part of FIG. 7D, the analog-to-digital converter 373 of IC1 detects the reference voltage (other's reference voltage) output from the reference voltage outputting circuit 374 of 102.

(Step 128) As shown in the upper part of FIG. 7D, the analog-to-digital converter 373 of IC1 detects the voltage between the terminals of the battery cell 201 at the lowest potential (cell #9) in the battery cell group corresponding to 102 output from the multiplexer 371 of 102.

(Step 129) As shown in the upper part of FIG. 7D, the analog-to-digital converter 373 of IC1 detects the reference voltage (other's reference voltage) output from the reference voltage outputting circuit 374 of IC2.

(Own cells voltage detection) Thereafter, IC1 is going to detect the voltage between the terminals of each of the battery cells in the battery cell group corresponding to IC1. For this purpose, the multiplexer 371 of IC1, in order for the criterion potential (voltage) and reference voltage (other's reference voltage) output from the reference voltage outputting circuit 374 of IC1 to be input into the differential amplifier 372 of IC1, the multiplexer 371 of IC1 turns off all the semiconductor switching elements (Step 111), and the reference voltage outputting circuit 374 of IC1 turns on the semiconductor switching element. As a result, as shown in FIG. 7E, the analog-to-digital converter 373 of IC1 detects the reference voltage (own reference voltage) output from the reference voltage outputting circuit 374 (Step 111).

However, IC1 is not electrically connected to any battery cell group. For this reason, IC1 switches its voltage detection operation mode into other's cells voltage detection operation mode as shown in FIG. 7. That is, as in Step 121, IC1 causes the multiplexer 371 to operate. Thereafter, IC1 stands by until voltage detection operation by IC2 starts to detect the voltage between the terminals of each of the battery cell 201 in the battery cell group corresponding to IC2. When IC2 has started detection of the voltage between the terminals of each of the battery cell 201 in the battery cell group corresponding to IC2, IC1, in synchronization with this, starts detection of the voltage between the terminals of each of the battery cell 201 in the battery cell group corresponding to IC2.

In this manner, IC1 repeats the operations in Steps 121 through 129 and 111 alternately, with all the operations in Steps 121 through 129 and 111 forming one period (cycle).

The detected voltage between the terminals of each of the battery cells 201 (#12 through #9) in the battery cell group corresponding to IC2, the detected reference voltage of the reference voltage outputting circuit 374 corresponding to IC2, and the detected reference voltage of the reference voltage outputting circuit 374 corresponding to IC1 are output to the IC control circuit 350 in IC1 and written into the data holding circuit 351 in IC1. The data holding circuit 351 in IC1 have set therein data areas corresponding to the voltage between the terminals of each of the battery cells 201 (#12 through #9) in the battery cell group corresponding to IC2, the reference voltage of the reference voltage outputting circuit 374 corresponding to IC2, and the reference voltage of the reference voltage outputting circuit 374 corresponding to IC1, respectively. The voltages between the terminals and reference voltages output from the analog-to-digital converter 373 in IC1 are written on the corresponding areas in synchronization with the voltage detection operation period of IC1.

Operations of other circuits on the basis of voltage detection operation. The voltages between the terminals and the reference voltages of the battery cells 201 stored in the respective data holding circuits 351 in IC1 through IC4 are read out by IC1 through IC4 on the basis of command signals transmitted from the microcontroller 410 and transmitted to the microcontroller 410 by IC1 through IC4, respectively.

The microcontroller 410, on the basis of the voltage read-out period of battery cells 201 (#1 through #12) (which is longer than the voltage detection period of IC1 through IC4), transmits command signals relating to read-out of the voltages between terminals of the battery cells 201 (#1 through #12) and the reference voltages of IC1 through IC4 to the respective signal transmission circuits 390 of IC1 through IC4 simultaneously and in parallel.

When each of the signal transmission circuits 390 of IC1 through IC4 receives the signal command from the microcontroller 410, each of the IC control circuits 350 of IC1 through IC4, on the basis of the command signal transmitted from the microcontroller 410, reads out, from the data holding circuits 351 corresponding to the each of the IC control circuits 350, the voltages between the terminals of the battery cells 201 and the reference voltages stored in the data holding circuit 351 that are most recent at the time when the command signal is received, and outputs the read-out data to the signal transmission circuit 390 corresponding to the each of the IC control circuits 350. Each of the signal transmission circuits 390 of IC1 through IC4 transmits a signal relating to data about the voltage between the terminals of the battery cells 201 corresponding to the each of the signal transmission circuits 390 and the reference voltages of IC1 through IC4 to the microcontroller 410 via the communication circuit 307.

The microcontroller 410, upon receipt of data signal relating to the voltage between the terminals of the battery cells 201 detected by IC1 through IC4, respectively, and the reference voltages of IC1 through IC4, obtains respective states of charges (SOC) of the battery cells 201 (#1 through #12) on the basis of the voltage between the terminals of the battery cells 201 (#1 through #12), for example, by referring to a table (map) indicating the relationship between voltages between terminals and charged states.

The microcontroller 410 obtains an internal resistance value on the basis of the states of charges (SOC) of the battery cells 201 (#1 through #12) and on the basis of the temperature of the battery pack 140. The microcontroller 410 obtains variation (or change rates) of the obtained internal resistances, and further obtains state of health (SOH) of each of the battery cells 201 (#1 through #12) on the basis of the obtained variations.

The microcontroller 410, on the basis of the state of charge (SOC) of each of the battery cell 201 (#1 through #12), judges whether adjustment of the state of charge is necessary for each of the battery cell 201 (#1 through #12). If there is a battery cell 201 that requires adjustment of the charged state, the microcontroller 410 obtains a charged state adjustment time (a discharge time due to a discharge resistance) for that battery cell 201. Using the obtained charged state adjustment time as a command value, the microcontroller 410 produces a signal relating to the command value and transmits the signal to the signal transmission circuit 390 of the IC corresponding to the battery cell 201 that requires the adjustment of its charged state via the communication circuit 307.

The microcontroller 410 diagnoses voltage detection systems whether or not there is any abnormality in the voltage detection system of each of IC1 to IC4 on the basis of comparison between voltages between the terminals of one and the same battery cell 201 that are detected by two integrated circuits (ICs), comparison between reference voltages of one and the same reference output voltage circuit 374 detected by two ICs, comparison between reference voltage of the reference output voltage circuit 374 of the detected-side IC detected by the detecting-side IC and a known voltage value. In case that there is any abnormality in any of the voltage detection systems, the microcontroller 410 transmits a notice to the integrated battery control unit 600.

The integrated battery control unit 600 electrically isolates from the system the battery unit that includes the battery pack 140 of which abnormality has been detected.

Each of the diagnosis circuits 360 of IC1 through IC4 diagnoses the battery cells 201 as to whether there is an abnormality of overcharge/over-discharge on the basis of comparison between each of the voltage between the terminals of each of the battery cells 201 stored in the data holding circuit 351 corresponding to the each of the diagnosis circuits 360 and a preset threshold value for overcharge or over-discharge. As a result of this diagnosis, if there is an abnormality of overcharge/over-discharge, each of the diagnosis circuits 360 of IC1 to IC4 outputs a diagnosis flag signal indicating the abnormality to the IC control circuit 350 corresponding to the each of the diagnosis circuits 360.

Each of the IC control circuits 350 of IC1 through IC4, in case that the diagnosis flag signal indicating the abnormality is output from the diagnosis circuit 360 corresponding to the each of the IC control circuits 350, holds the diagnosis flag indicating the abnormality.

When a command signal relating to read out of results of abnormality diagnosis is output from the microcontroller 410 to each of IC1 to IC4 via the communication circuit 307 and the command signal is received by each of the signal transmission circuit 390 of IC1 to IC4, each of the IC control circuit 350 of IC1 to IC4, on the basis of the command signal transmitted from the microcontroller 410, reads out the diagnosis flag indicating abnormality and outputs the read out diagnosis flag to the corresponding signal transmission circuit 390. Each of the signal transmission circuit 390 transmits the signal relating to the diagnosis flag corresponding to the each of the signal transmission circuit 390 to the microcontroller 410 via the communication circuit 307.

Each of the IC control circuit 350 of IC1 through IC4, in case that there is an abnormality of overcharge/over-discharge, transmits the signal relating to the diagnosis flag indicating the abnormality, for example, 1-pulse signal (showing High or Low only) made of 1-bit, to the microcontroller, without awaiting the command signal relating to the read-out of results of the abnormality diagnosis. With this construction, each of IC1 to IC4 can notify the integrated battery control unit 600 of the abnormality to the microcontroller 410 promptly. At the same time, the integrated battery control unit 600 that received the notice can promptly take necessary measures, for example, electrically isolating, from the system, the battery unit including the battery pack 140 of which abnormality has been detected.

It should be noted that the command signal relating to the read out of the voltage between the terminals of each of the battery cells 201 (#1 through #12) and the command signal relating to the results of abnormality diagnosis may be transmitted from the microcontroller 410 simultaneously as a single command signal or separately.

According to the present embodiment explained above, since the voltage between the terminals between the positive and negative electrodes of each of the battery cells 201 in each of the battery cell groups is detected by two cell-con ICs, the voltage detection system of the cell control unit 300 can be made redundant by duplexing thereof. In addition, such redundancy can be achieved by detecting the voltage between the terminals between the positive electrode and the negative electrode of each of the battery cells 201 in the same battery group in duplication by two first cell-con ICs 330a that are potentially adjacent to each other or by one first cell-con IC 330a and additional second cell-con IC 330b. Therefore, it is unnecessary to simply double the number of the cell-con ICs 330 (first and second cell-con ICs 330a and 330b) and the number of the voltage detection lines 250 so as to conform to the redundancy of the voltage detection system of the cell control unit by doubling and the increase in the number of components can be held down to a minimum necessary level. Furthermore, it is possible to prevent the arrangement of the voltage detection lines 250 from becoming complicated and to prevent an increase in cost for assembling that accompanies the complication.

Therefore, according to the present embodiment, a highly reliable cell control unit 300 can be provided at low cost in which the voltage detection system of the cell control unit 300 is made redundant by duplexing.

Abnormality diagnosis of voltage detection system. Then, referring to FIGS. 8 and 9, explanation is made on a specific example of abnormality detection of the voltage detection systems by the battery control unit 410 (microcontroller 410) on the basis of the voltage detection results.

To the microcontroller 410 are input respective values of the voltage between the terminals of one and the same battery cell 201 from two cell-con ICs and two reference voltages from the same reference output voltage circuit 374. Thus, the microcontroller 410 performs diagnosis as to whether or not there is abnormality in the voltage detection system on the basis of comparison between the two values of voltage between the terminals of one and the same battery cell 201, comparison between two reference voltage values from the one and the same reference output voltage circuit 374, comparison between the reference voltage value from the reference output voltage circuit 374 of the detected-side IC detected by the detecting-side IC and a known voltage value, and so on.

Here, the term "voltage detection system" includes a route from any one of the battery cells 201 to a cell-con IC (a filter circuit that includes the resistor 312 and the capacitor 311 and a voltage detection line 250), the voltage detection circuit 370, the IC control circuit 350, the signal transmission circuit 390, and the voltage transmission circuit 337.

For example, in case that if, as a result of comparison between the two values of the voltage between the terminals of one and the same battery cell 201, it reveals that a difference between the two values is outside a predetermined range of voltage difference that is preliminarily set taking into consideration a detection error and the like, it can be diagnosed that there is an abnormality in the voltage detection line. Also, in case that if, as a result of comparison between the two values of reference voltage from the one and the same reference output voltage circuit 374, it reveals that a difference between the two values is outside a predetermined range of voltage difference that is preliminarily set taking into consideration a detection error and the like, it can be diagnosed that there is an abnormality in the voltage detection line. Furthermore, in case that if, as a result of comparison between the reference voltage value from the reference output voltage circuit 374 of the detected-side IC detected by the detecting-side IC and a known voltage value range, it can be diagnosed that there is an abnormality in the voltage detection line.

Figure 8:
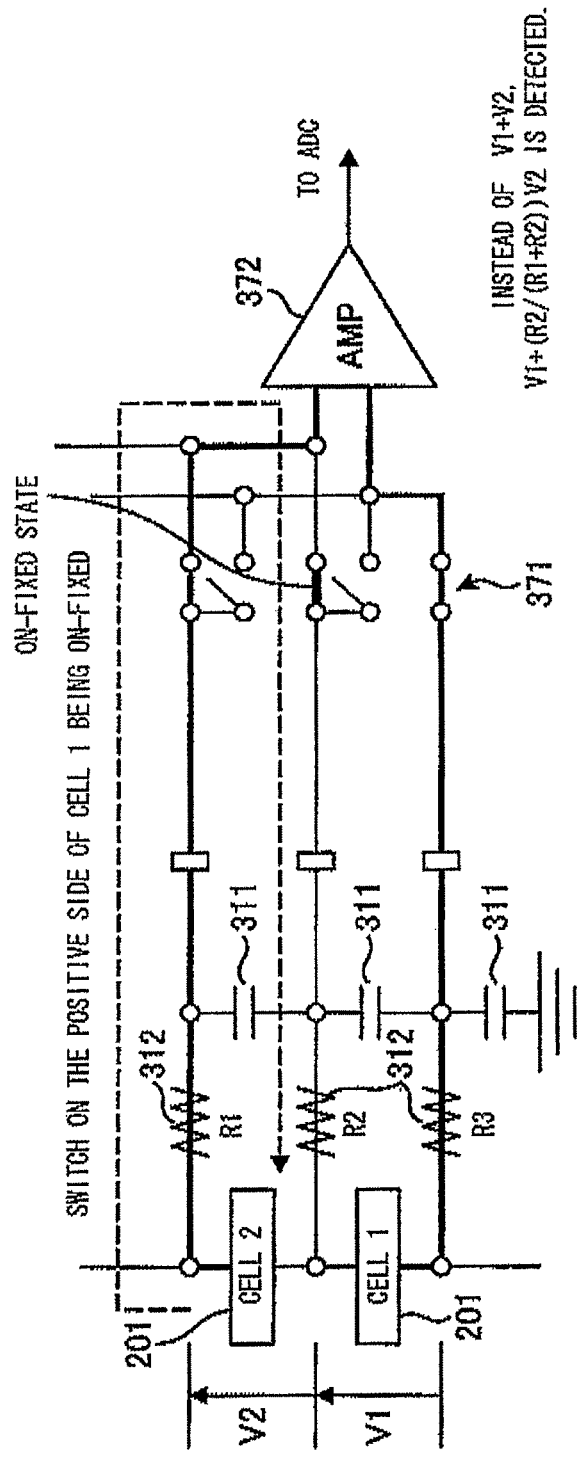
FIG. 8 presents a diagram illustrating the voltage detection state in case that one of the multiplexers in the cell controller integrated circuits shown in FIG. 4 through FIG. 6 is in an abnormal state, showing results of voltage detection from the analog-to-digital converter in an abnormal state where the switch that corresponds to the positive side of a battery cell 1 is fixed to an "on" state.
Figure 9:
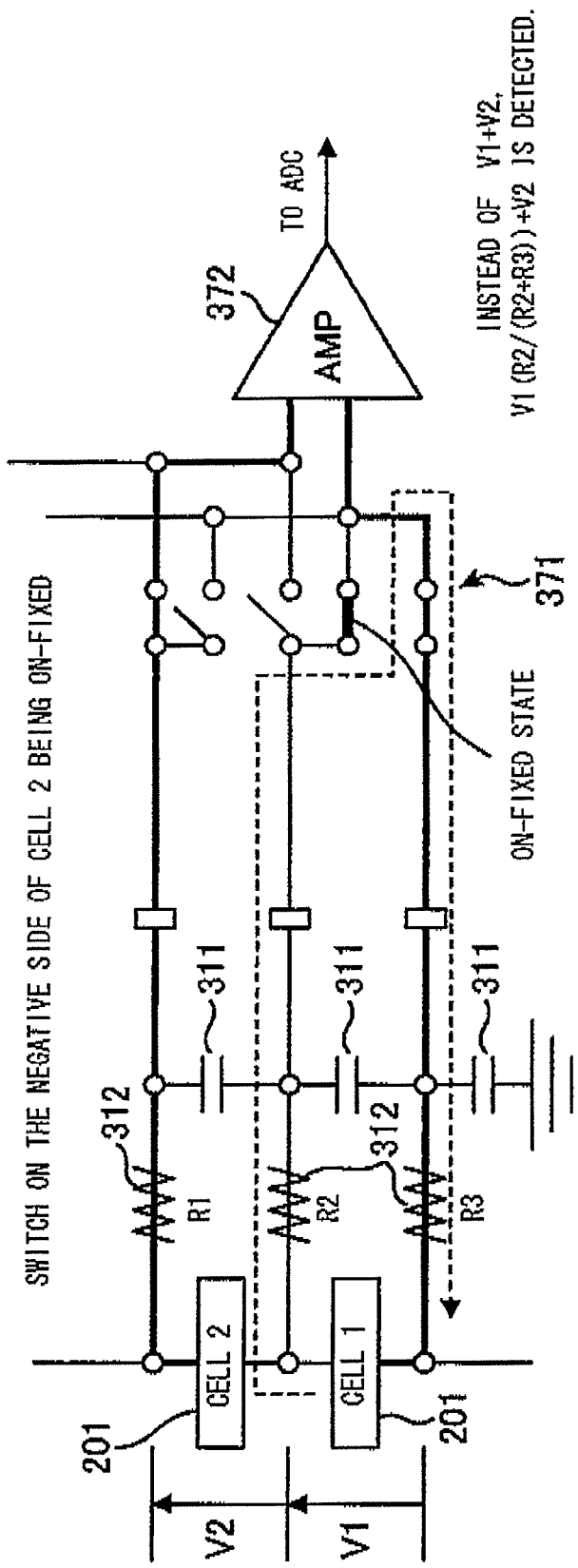
FIG. 9 presents a diagram illustrating the voltage detection state in case that one of the multiplexers in the cell controller integrated circuits shown in FIG. 4 through FIG. 6 is in an abnormal state, showing results of voltage detection from the analog-to-digital converter in an abnormal state where the switch that corresponds to the negative side of a battery cell 2 is fixed to an "on" state.

By performing the voltage detection operations shown in FIGS. 8 and 9, it can also be diagnosed whether or not there is any abnormality in a specified component of the voltage detection system.

FIGS. 8 and 9 show outputs of the differential amplifier 372 to the analog-to-digital converter 373 when the semiconductor switching element of the multiplexer 371 is fixed to an "on" state (hereafter, sometimes referred to "on-fixed").

FIG. 8 shows the output of the differential amplifier 372 to the analog-to-digital converter 373 when the semiconductor switching element of the multiplexer 371 corresponding to the positive electrode-side of the battery cell 201 that is at the lower potential out of the two potentially contiguous (adjacent) battery cells 201 is on-fixed. On the other hand, FIG. 9 shows the output of the differential amplifier 372 to the analog-to-digital converter 373 when the semiconductor switching element of the multiplexer 371 corresponding to the negative electrode-side of the battery cell 201 that is at the higher potential out of the two potentially contiguous (adjacent) battery cells 201 is on-fixed, It should be noted that the semiconductor switching element of the multiplexer 371 may be fixed to an "off" state (hereafter, sometimes referred to as "off-fixed"). In the case of "off-fixed", the detected voltage between the terminals is zero volts. Therefore, it may be sufficient to detect whether or not the voltage between the terminals detected as a result of ordinary voltage detection operation is zero volts.

In case that the "on-fixed state" of the semiconductor switching element of the multiplexer 371 is to be detected, a total voltage between the terminals of the two potentially contiguous (adjacent) battery cells 201 is detected. In this case, the semiconductor switching element of the multiplexer 371 corresponding to the positive electrode-side of the battery cell 201 at the higher potential side and the semiconductor switching element of the multiplexer 371 corresponding to the negative electrode-side of the battery cell 201 at the lower potential side are turned on. The multiplexers 371 cause the positive electrode-side voltage (potential) of the battery cell 201 at the higher potential side and the negative electrode-side voltage (potential) of the battery cell at the lower potential side are input into the differential amplifier 372. The differential amplifier 372 produces a difference between the input voltages (potentials) as a total voltage between terminals, amplifies the produced total voltage between terminals, and outputs it to the analog-to-digital converter 373. Then, the analog-to-digital converter 373 detects the total voltage between terminals.

In case that the multiplexer 371 operates normally, the output (Vn) to the analog-to-digital converter 373 is, as shown in expression (1) below, a sum voltage (V1+V2) of the voltage between the terminals of the battery cell 201 at the lower-potential side (V1) and the voltage between the terminals of the battery cell 201 at the higher-potential side (V2).

$$Vn = V1 + V2 \quad (1)$$

However, as shown in FIG. 8, in case that there is an abnormality in which the semiconductor switching element of the multiplexer 371 corresponding to the positive electrode-side of the battery cell 201 at the higher potential side is on-fixed, the total voltage between the terminals Va1 detected by the analog-to-digital converter 373 is, as shown in expression (2) below, varied as compared with that when the multiplexer 371 operates normally. More particularly, the voltage between the terminals of the battery cell 201 at the higher potential side becomes smaller than that (V2) when the multiplexer 371 operates normally due to a ratio of a resistance value R1 of the resistance 312 corresponding to the positive electrode-side of the battery cell 201 at the higher potential and a resistance value R2 of the resistance 312 corresponding to the negative electrode side of the battery cell 201 at the higher potential. That is, the total voltage between the terminals (Va1) detected by the analog-to-digital converter 373 becomes lower than that when the multiplexer 371 operates normally by a voltage drop due to the resistance value R2 of the resistance 312 corresponding to the negative electrode side of the battery cell 201 at the higher potential.

$$Va1 = V1 + V2(R2/(R1+R2)) \quad (2)$$

In case that as shown in FIG. 9, there is an abnormality in which the semiconductor switching element of the multiplexer 371 corresponding to the battery cell 201 at the higher potential is on-fixed, the total voltage between the terminals (Va2) detected by the analog-to-digital converter 373 is, as shown in expression (3) below, varied as compared with that when the multiplexer 371 operates normally. More particularly, the voltage between the terminals of the battery cell 201 at the lower potential side becomes lower than that (V1) when the multiplexer 371 operates normally due to a ratio of a resistance value R2 of the resistance 312 corresponding to the positive electrode-side of the battery cell 201 at the lower potential and a resistance value R3 of the resistance 312 corresponding to the negative electrode side of the battery cell 201 at the lower potential. That is, the total voltage between the terminals (Va2) detected by the analog-to-digital converter 373 becomes lower that that when the multiplexer 371 operates normally by a voltage drop due to the resistance value R2 of the resistance 312 corresponding to the positive electrode side of the battery cell 201 at the lower potential.

$$Va2=V1(R2/(R2+R3))+V2 \tag{3}$$

Therefore, the diagnosis circuit 360 for diagnosing the microcontroller 410 or the cell-con ICs 330 compares between two voltage values; one is a voltage value obtained by summing the results of detection of the respective voltages between the terminals of two potentially contiguous (adjacent) battery cells 201 and the other is a voltage value obtained as a result of detection of the total voltage between the terminals of two potentially contiguous (adjacent) battery cells 201. In case that the latter voltage value, i.e., the voltage value obtained as a result of detection of the total voltage between the terminals two potentially contiguous (adjacent) battery cells 201 (excluding the error of voltage detection) is smaller than the former voltage value, i.e., the voltage value obtained by summing the results of detection of the respective voltages between the terminals of two potentially contiguous (adjacent) battery cells 201 (excluding the error of voltage detection), it is judged that there is an "on-fixed" abnormality in the semiconductor switching element of the multiplexer 371.

It should be noted that according to the present embodiment, explanation has been made on an example in which the microcontroller 410 diagnoses abnormality in the voltage detection system. However, a portion of the diagnosis of abnormality in the voltage detection system may be performed by the diagnosis circuit 360 of the cell-con ICs 330.

According to the present embodiment explained above, since it can be diagnosed whether or not there is abnormality in the voltage detection systems of the first and second cell-con ICs 330a and 330b on the basis of the results of detection of two systems or lines, the reliability of the cell control unit 300 can be further increased.

The above described embodiments are examples and various modifications can be made without departing from the scope of the invention.

What is claimed is:

1. An electrical storage system comprising:
    a plurality of electrical storage units that are electrically connected to each other, grouped into a plurality of electrical storage unit groups that are electrically connected in series to each other and that includes a plurality of members out of the storage units; and
    a plurality of state detection circuits that introduces therein a physical quantity from each of the electrical storage units and detects a state quantity of each of the electrical storage units, wherein
    the state detection circuits includes a plurality of first state detection circuits and a second state detection circuits,
    the first state circuits correspond to the electrical storage unit groups, respectively, and each of the first state circuits is electrically connected to a positive electrode and a negative electrode of each of the electrical storage units in a corresponding electrical storage unit,
    any two of the first state detection circuits, forming an imaginary pair of first state detection circuits, which corresponds to any two of the electrical storage unit groups that are potentially adjacent to each other, are electrically connected to each other via a transmission circuit,
    one of the first state detection circuits that corresponds to one of the storage unit groups that is at a highest potential or at a lowest potential is electrically connected to the second state detection circuit via the transmission circuit,
    one of the imaginary pair of first state detection circuits that are electrically connected to each other via the transmission circuit introduces therein the respective physical quantities of the electrical storage unit groups in the corresponding electrical storage unit group and detects the respective state quantities of the electrical storage units in the corresponding electrical storage unit group, and transmits the respective physical quantities introduced therein to the other of the imaginary pair of first state detection circuit or the second state detection circuit, which is electrically connected thereto via the transmission circuit, and
    the other of the imaginary pair of first state detection circuit or the second state detection circuit, which is electrically detected to the one of the first state detection circuit via the transmission circuit introduces therein the physical quantities transmitted via the transmission circuit and detects the respective physical quantities of the electrical storage units in the electrical storage unit group corresponding to the one of the imaginary pair of first state detection circuits.

2. The electrical storage system according to claim 1, wherein
    each of the first state detection circuits operates at a criterion potential that corresponds to a potential at a side of the negative electrode of one of the electrical storage units in the corresponding storage unit group that is at the lowest potential,
    the second state detection circuit operates at a criterion potential that corresponds to a potential at the side of a negative electrode of one of the electrical storage units in one of storage unit groups that is at the highest or lowest potential, and
    the second state detection circuit is at a same potential as that of the first state detection circuit.

3. The electrical storage system according to claim 1, wherein
    each of the first state detection circuits and the second state detection circuits includes a reference circuit that outputs a reference quantity having a magnitude which is different from that of the physical quantity of the electrical storage unit, wherein
    the one of the first state detection circuits, while it is introducing therein the respective physical quantities of the electrical storage units in the electrical storage unit group corresponding thereto to identify a corresponding reference circuit and detecting the respective state quantities of the electrical storage units in the electrical storage unit group corresponding thereto, introduces therein, before and after the detection of the state quantities, an introduced reference quantity from the corresponding reference circuit and detects the introduced reference quantity, the other of the first state detection circuits and the second state detection circuit, while they are introducing therein the physical quantities transmitted via the transmission circuit and detecting the respective state quantities of the electrical storage units in the electrical storage unit group corresponding to the one of the first state detection circuits, introduce each therein, before and after the detection of the state quantities, an introduced reference quantity from the reference circuit corresponding to the one of the first state detection circuits and detects the introduced reference quantity.

4. The electrical storage system according to claim 1, wherein
while the one of the first state detection circuits is introducing therein the respective physical quantities of the electrical storage units in the electrical storage unit group corresponding thereto and detecting the respective state quantities of the electrical storage units in the electrical storage unit group corresponding thereto, the other of the imaginary pair of first state detection circuits introduces therein the respective physical quantities of the electrical storage units in the electrical storage unit group corresponding to the one of the imaginary pair of first state detection circuits and detects the respective state quantities of the electrical storage units in the electrical storage unit group corresponding to the one of the imaginary pair of first state detection circuits, and
while the first state detection circuit that corresponds to one of the electrical storage unit groups that is at the highest potential or at the lowest potential, is introducing therein the respective physical quantities of the electrical storage units in the electrical storage unit group corresponding to the first state detection circuit that corresponds to the electrical storage unit group at the highest potential or at the lowest potential and detecting the respective state quantities of the electrical storage units in the electrical storage unit group corresponding to the first state detection circuit at the highest or lowest potential, the second state detection circuit introduces therein the respective physical quantities of the electrical storage units in the electrical storage unit group corresponding to the first state detection circuit that corresponds to the electrical storage unit group at the highest potential or at the lowest potential and detects the respective state quantities of the electrical storage units in the electrical storage unit group corresponding to the first state detection circuit at the highest or lowest potential.

5. The electrical storage system according to claim 4, wherein
while the one of the imaginary pair of first state detection circuits is introducing therein the respective physical quantities of the electrical storage units in the electrical storage unit group corresponding to any other one of the first state detection circuits other than the one and the other of the imaginary pair of first state detection circuits and detecting the respective state quantities of the electrical storage units in the electrical storage unit group corresponding to the other one of the first state detection circuits other than the one and the other of the imaginary pair of first state detection circuits, the other of the imaginary pair of first state detection circuits introduces therein the respective physical quantities of the electrical storage units in the electrical storage unit group corresponding thereto and detects the respective state quantities of the electrical storage units in the electrical storage unit group corresponding to the one of the imaginary pair of first state detection circuits, and
while the first state detection circuit that corresponds to one of the electrical storage unit groups that is at the highest potential or at the lowest potential, is introducing therein the respective physical quantities of the electrical storage units in the electrical storage unit group corresponding to the other one of the first state detection circuits other than the one and the other of the imaginary pair of first state detection circuits and detecting the respective state quantities of the electrical storage units in the electrical storage unit group corresponding to the other one of the first state detection circuits other than the one and the other of the imaginary pair of first state detection circuits, the second state detection circuit stands by until the first state detection circuit that corresponds to one of the electrical storage unit groups that is at the highest potential or at the lowest potential finishes an introduction therein of the respective physical quantities of the electrical storage units in the electrical storage unit group corresponding to the other one of the first state detection circuits other than the one and the other of the imaginary pair of first state detection circuits and the detection of the respective state quantities of the electrical storage units in the electrical storage unit group corresponding to the other one of the first state detection circuits other than the one and the other of the imaginary pair of first state detection circuits.

6. The electrical storage system according to claim 1, further comprising:
an arithmetic processing circuit, wherein the arithmetic processing circuit:
receives first state quantities of the electrical storage units from each of the first state detection circuits and second state quantities from the second state detection circuit,
compares the first state quantities and the second state quantities of the imaginary pair to obtain a first result,
compares the first state quantities to other state quantities of the electrical storage unit group having a highest or lowest potential and the second state quantities to obtain a second result, and
diagnoses, based on the first result and the second result whether there is any abnormality in any of the first state detection circuits and the second detection circuit.

7. The electrical storage system according to claim 6, wherein
each of the first state detection circuits includes a selection circuit that selects a physical quantity of each of the electrical storage units in the corresponding storage unit group and outputs the selected physical quantity, wherein
the arithmetic processing circuit further:
compares a sum state quantity with a total state quantity, the sum state quantity being a sum of respective state quantities of the potentially adjacent storage units, obtained based on physical quantities introduced via the selection circuit from each of the potentially adjacent storage units detected in each of the first state detection circuit and the total state quantity being a total of the potentially adjacent storage units obtained based on a sum of physical quantities of the electrical storage unit at a higher potential and of the electrical storage unit at a lower potential introduced via the selection circuit from the potentially adjacent storage units, and diagnoses whether or not there is abnormality in the selection circuit.

8. An electrical storage system comprising:
a plurality of electrical storage unit groups that are electrically connected in series to each other, each having a plurality of storage units electrically connected in series to each other;
a plurality of first integrated circuits, which corresponds to the electrical storage unit groups, respectively, and each of which is electrically connected to each of the electrical storage units and introduces therein respective voltages between a terminal of a positive electrode and a terminal of a negative electrode of the electrical storage units in the corresponding storage unit group;
a second integrated circuit, which corresponds to one of a first state detection circuit that corresponds to one of the electrical storage unit groups that is at a highest or lowest potential and which introduces therein the respective voltages between terminals of the positive and negative electrodes of the electrical storage units in the electrical storage unit group at the highest or lowest potential and detects the respective voltages between the terminals of the positive electrode and the negative electrode of the electrical storage units in the electrical storage unit group corresponding to the first integrated circuit;
a first voltage transmission circuit that electrically connects to each other, any two of the first integrated circuits corresponding to two storage unit groups that are potentially adjacent, forming an imaginary pair of first integrated circuits, and transmits, from one of the first integrated circuits to the other of the first integrated circuits, the respective voltages between the terminals of the positive and negative electrodes of each of the electrical storage units in the electrical storage unit group corresponding to the first integrated circuit;
a second voltage transmission circuit that electrically connects, to each other, any two of the first integrated circuits that correspond to the electrical storage unit groups that are potentially adjacent to each other and transmits, from one of the first integrated circuits to the other of the first integrated circuits, the respective voltages between the terminals of the positive and negative electrodes of each of the electrical storage units in the electrical storage unit group corresponding to the first integrated circuit that corresponds to the electrical storage unit group at the highest or lowest potential;
an arithmetic processing circuit; and
a communication circuit that is provided between one of the first integrated circuits and the second integrated circuit and the arithmetic processing circuit and transmits a signal therebetween, wherein
one of the first integrated circuits introduces therein an introduced respective voltages between the terminals of the positive and negative electrodes of the electrical storage units in the corresponding storage unit group to detect the respective voltages between the terminals of the positive and negative electrodes of the electrical storage units in the corresponding storage unit group, and transmits via the first or second voltage transmission circuit, to the other of the first integrated circuit or the second integrated circuit, the introduced respective voltages between the terminals of the positive and negative electrodes of the electrical storage units,
the other of the first integrated circuit and the second integrated circuit each introduce therein the respective voltages between the terminals of the positive and negative electrodes of the electrical storage units transmitted via the first or second voltage transmission circuit to detect the respective voltages between the terminals of the positive and negative electrodes of the electrical storage units in the corresponding storage unit group corresponding to the one of the first integrated circuits,
signals relating to the respective voltages between the terminals of the positive and negative electrodes of the electrical storage units detected by the first integrated circuits and the second integrated circuit are transmitted via the communication circuit from the first integrated circuits and the second integrated circuit to the arithmetic processing circuit.

9. The electrical storage system according to claim 8, wherein
each of the first integrated circuits operates at a criterion potential that corresponds to a potential at a side of the negative electrode of one of the electrical storage units in the corresponding storage unit group that is at the lowest potential,
the second integrated circuit operates at a criterion potential that corresponds to the potential at the side of the negative electrode of one of the electrical storage units in one of the electrical storage unit groups that is at the highest or lowest potential, and
the second integrated circuit is at a same potential as that of the first integrated circuit.

10. The electrical storage system according to claim 8, wherein
the arithmetic processing circuit:
receives the first voltage between the terminals of the electrical storage units from the first integrated circuits and the second voltage between the terminal of the electrical storage unit from the second integrated circuit via the communication circuit,
compares the first voltage and the second voltage of the imaginary pair to obtain a first result,
compares the first voltage to other voltages of the electrical storage unit group having a highest or lowest potential and the second voltage to obtain a second result, and
diagnoses, based on the first result and the second result, whether there is any abnormality in any of the first integrated circuits and the second integrated circuit.

11. The electrical storage system according to claim 8, wherein
each of the first integrated circuits includes a selection circuit that selects and outputs the voltages of the positive and negative electrodes of each of the electrical storage units in the corresponding storage unit group, wherein
each of the first integrated circuit or the arithmetic processing circuit compares a sum voltage between terminals with a total voltage between terminals, the sum voltage between terminals being a sum of respective voltages between terminals of the potentially adjacent storage units, obtained based on the voltages of the positive and negative electrodes introduced via the selection circuit from each of the potentially adjacent storage units, detected in each of the first integrated circuit, and the total voltage between terminals being a total of the potentially adjacent storage units obtained based on a sum of the voltage between terminals of the electrical storage unit at a higher potential and the voltage between terminals of the electrical storage unit at a lower potential introduced via the selection circuit from the potentially adjacent storage units to obtain a third result, and each of the first integrated circuit or the arithmetic processing circuit diagnoses whether or not there is abnormality in the selection circuit based on the third results.

12. The electrical storage system according to claim 8, wherein
each one of the first integrated circuits and the second integrated circuit includes a reference voltage generation circuit that outputs a reference voltage having a magnitude which is different from that of the voltage between terminals of the electrical storage unit, wherein
the one of the imaginary pair of first integrated circuits, while it is introducing an introduced reference voltage therein the respective voltages between terminals of the positive and negative electrodes of the electrical storage units in the electrical storage unit group corresponding thereto and detecting the respective voltages between terminals of the positive and negative electrodes of the electrical storage units in the electrical storage unit group corresponding thereto, introduces therein, before and after the detection of the respective voltages between terminals of the positive and negative electrodes of the electrical storage units in the electrical storage unit group corresponding thereto, the reference voltage from a corresponding reference voltage generation circuit and detects the introduced reference voltage,
the other of the imaginary pair of first integrated circuits and the second integrated circuit, while they are introducing therein the voltages transmitted via the first or second transmission circuit and detecting the respective voltages between the terminals of the electrical storage units in the electric storage unit group corresponding to the one of the imaginary pair of first integrated circuits, introduce each therein, before and after the detection of the respective voltages, the reference voltage from the reference voltage generation circuit corresponding to the one of the imaginary pair of first integrated circuits via the first or second transmission circuit and detects the introduced reference voltage.

13. The electrical storage system according to claim 8, wherein
while the one of the imaginary pair of first integrated circuits is introducing therein the respective voltages between the terminals of the positive and negative electrodes of the electrical storage units in the corresponding storage unit group and detecting the respective voltages between the terminals of the positive and negative electrodes of the electrical storage units in the corresponding storage unit group, the other of the integrated circuits introduces therein the respective voltages between the terminals of the positive and negative electrodes of the electrical storage units in the electrical storage unit group corresponding to the one of the first integrated circuits and detects the respective voltages between the terminals of the positive and negative electrodes of the electrical storage units in the electrical storage unit group corresponding to the one of the first integrated circuits,
while the first integrated circuit, which corresponds to one of the first integrated circuits corresponding to the electrical storage unit group at the highest or lowest potential is introducing therein the respective voltages between the terminals of the positive and negative electrodes of the electrical storage units in the electrical storage unit group corresponding to the one of the first integrated circuits at the highest or lowest potential and detecting the respective voltages between the terminals of the positive and negative electrodes of the electrical storage units in the electrical storage unit group corresponding to the one of the first integrated circuits at the highest or lowest potential,
the second integrated circuit introduces therein detects the respective voltages between the terminals of the positive and negative electrodes of the electrical storage units in the electrical storage unit group corresponding to the one of the first integrated circuits at the highest or lowest potential.

14. The electrical storage system according to claim 13, wherein
while the one of the imaginary pair of first integrated circuits is introducing therein the respective voltages between the terminals of the positive and negative electrodes of the electrical storage units in the electrical storage unit group corresponding to any other one of the first integrated circuits other than the one and the other of the imaginary pair of first integrated circuits and detecting the respective voltages between the terminals of the positive and negative electrodes of the electrical storage units in the electrical storage unit group corresponding to the other one of the first integrated circuits other than the one and the other of the imaginary pair of first integrated circuits, the other of the imaginary pair of integrated circuits introduces therein the respective voltages between the terminals of the positive and negative electrodes of the electrical storage units in the corresponding storage unit group and detects the respective voltages between the terminals of the positive and negative electrodes of the electrical storage units in the corresponding storage unit group, and
while the one of the first integrated circuits that corresponds to the one of the electrical storage unit groups that is at the highest or lowest group is introducing therein the respective voltages between the terminals of the positive and negative electrodes of the electrical storage units in the electrical storage unit group corresponding to the other one of the first integrated circuits other than the one and the other of first integrated circuits and detecting the respective voltages between the terminals of the positive and negative electrodes of the electrical storage units in the electrical storage unit group corresponding to the other one of the first integrated circuits other than the one and the other of the imaginary pair of first integrated circuits, the second integrated circuit stands by until the first integrated circuit that corresponds to the one of the first integrated circuit corresponding to the one of the electrical storage unit group that is at the highest or lowest potential finishes the introducing therein of the respective voltages between the terminals of the positive and negative electrodes of the electrical storage units in the electrical storage unit group corresponding the other one of the first integrated circuits other than the one and the other of the imaginary pair of first integrated circuits and the detection of the respective voltages between the terminals of the positive and negative electrodes of the electrical storage units in the electrical storage unit group corresponding to the other one of the first integrated circuits other than the one and the other of the imaginary pair of first integrated circuits.

15. An electrical storage control unit for an electrical storage system, comprising:
a first storage controller, wherein
the first storage controller includes:
a plurality of first voltage detection terminals that is connected to a plurality of voltage detection lines respectively connected to a plurality of first storage units, via a plurality of switches;

a first voltage detection circuit that is connected to each of the plurality of first voltage detection terminals and that detects a first voltage of each of the plurality of first storage units via each of a plurality of first voltage detection lines;

a first voltage input terminal that a second voltage of each of a plurality of second storage units that are different from the plurality of first storage units is input to; and a first voltage output terminal that is connected to the plurality of first voltage detection terminals via a plurality of switches, wherein the first voltage detection circuit is further connected to the first voltage input terminal and detects the second voltage via the first voltage input terminal.

16. The electrical storage control unit for an electrical storage system according to claim 15, further comprising:

a second storage controller, wherein the second storage controller includes a second voltage input terminal that is connected to the first voltage input terminal and the first voltage is input to; and a second voltage detection circuit that is connected to the second voltage input terminal and detects the first voltage that is input to the second voltage input terminal.

17. The electrical storage control unit for an electrical storage system according to claim 16, further comprising:

a third storage controller, wherein the third storage controller includes a plurality of second voltage detection terminals that is connected to a plurality of second voltage detection lines respectively connected to the plurality of second storage units, via a plurality of switches;

the second voltage detection circuit that is connected to each of the plurality of second voltage detection terminals and that detects the second voltage via each of the plurality of second voltage detection lines; and a second voltage output terminal that is connected to the plurality of second voltage detection terminals via a plurality of switches, wherein the first voltage input terminal in the first storage controller is connected to the plurality of second voltage detection terminals in the third storage controller.

\* \* \* \* \*